(12) United States Patent
Tabata et al.

(10) Patent No.: US 11,302,882 B2
(45) Date of Patent: Apr. 12, 2022

(54) LUMINESCENT FILM, ORGANIC ELECTROLUMINESCENT ELEMENT, ORGANIC MATERIAL COMPOSITION AND METHOD FOR PRODUCING ORGANIC ELECTROLUMINESCENT ELEMENT

(71) Applicant: Konica Minolta, Inc., Tokyo (JP)

(72) Inventors: Kenichi Tabata, Inagi (JP); Yuta Nakamura, Hino (JP); Taketo Namikawa, Hachioji (JP); Satoru Inoue, Kunitachi (JP); Yasuo Miyata, Yokohama (JP); Hiromoto Ii, Machida (JP)

(73) Assignee: Merck Patent GmbH, Darmstadt (DE)

( * ) Notice: Subject to any disclaimer, the term of this patent is extended or adjusted under 35 U.S.C. 154(b) by 356 days.

(21) Appl. No.: 16/347,476

(22) PCT Filed: Nov. 22, 2017

(86) PCT No.: PCT/JP2017/041918
§ 371 (c)(1),
(2) Date: May 3, 2019

(87) PCT Pub. No.: WO2018/097153
PCT Pub. Date: May 31, 2018

(65) Prior Publication Data
US 2019/0280236 A1    Sep. 12, 2019

(30) Foreign Application Priority Data

Nov. 25, 2016  (JP) .............................. JP2016-228472
Apr. 7, 2017   (JP) .............................. JP2017-076419
Aug. 21, 2017  (JP) .............................. JP2017-158484

(51) Int. Cl.
*H01L 51/50* (2006.01)
*H01L 51/00* (2006.01)
(Continued)

(52) U.S. Cl.
CPC .......... *H01L 51/5016* (2013.01); *C09K 11/06* (2013.01); *H01L 51/0008* (2013.01);
(Continued)

(58) Field of Classification Search
None
See application file for complete search history.

(56) References Cited

U.S. PATENT DOCUMENTS

2016/0315274 A1 * 10/2016 Lennartz ............. H01L 51/0085

FOREIGN PATENT DOCUMENTS

| JP | 2005119148 A | 5/2005 |
|----|--------------|--------|
| JP | 200994124 A  | 4/2009 |

(Continued)

OTHER PUBLICATIONS

JPO, Office Action for the corresponding Japanese Patent Application No. 2018-552603, dated Feb. 2, 2021, with English translation.
(Continued)

*Primary Examiner* — Gregory D Clark
(74) *Attorney, Agent, or Firm* — Lucas & Mercanti, LLP

(57) ABSTRACT

A luminescent film includes a host compound, a blue phosphorescent compound, and a blue fluorescent compound, in which an emission spectrum of the blue phosphorescent compound and an absorption spectrum of the blue fluorescent compound have portions overlapping with each other; shortest wavelength-side maximum emission wavelengths of the blue phosphorescent compound (abbreviated as "BPM" in the expression) and the blue fluorescent compound (abbreviated as "BFM" in the expression) satisfy the following expression (1): $\lambda_{BFM} \geq \lambda_{BPM}$: expression (1) in which $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound;

(Continued)

and light emission derived from the blue fluorescent compound is detected.

15 Claims, 6 Drawing Sheets

(51) Int. Cl.
 H01L 51/52 (2006.01)
 H01L 51/56 (2006.01)
 H05B 33/10 (2006.01)
 C09K 11/06 (2006.01)

(52) U.S. Cl.
 CPC ...... *H01L 51/0085* (2013.01); *H01L 51/0087* (2013.01); *H01L 51/50* (2013.01); *H01L 51/5004* (2013.01); *H01L 51/5253* (2013.01); *H01L 51/56* (2013.01); *H05B 33/10* (2013.01)

(56) References Cited

FOREIGN PATENT DOCUMENTS

| | | |
|---|---|---|
| JP | 201171194 A | 4/2011 |
| JP | 4904821 B2 | 3/2012 |
| JP | 5905916 B2 | 4/2016 |
| JP | 4571359 B2 | 10/2017 |
| WO | 2007123006 A1 | 11/2007 |
| WO | 2015091716 A1 | 6/2015 |
| WO | 2016/029137 A1 | 2/2016 |

OTHER PUBLICATIONS

International Preliminary Report on Patentability and Written Opinion dated Feb. 27, 2018 for PCT/JP2017/041918 and English translation.
International Search Report dated Feb. 27, 2018 for PCT/JP2017/041918.

\* cited by examiner

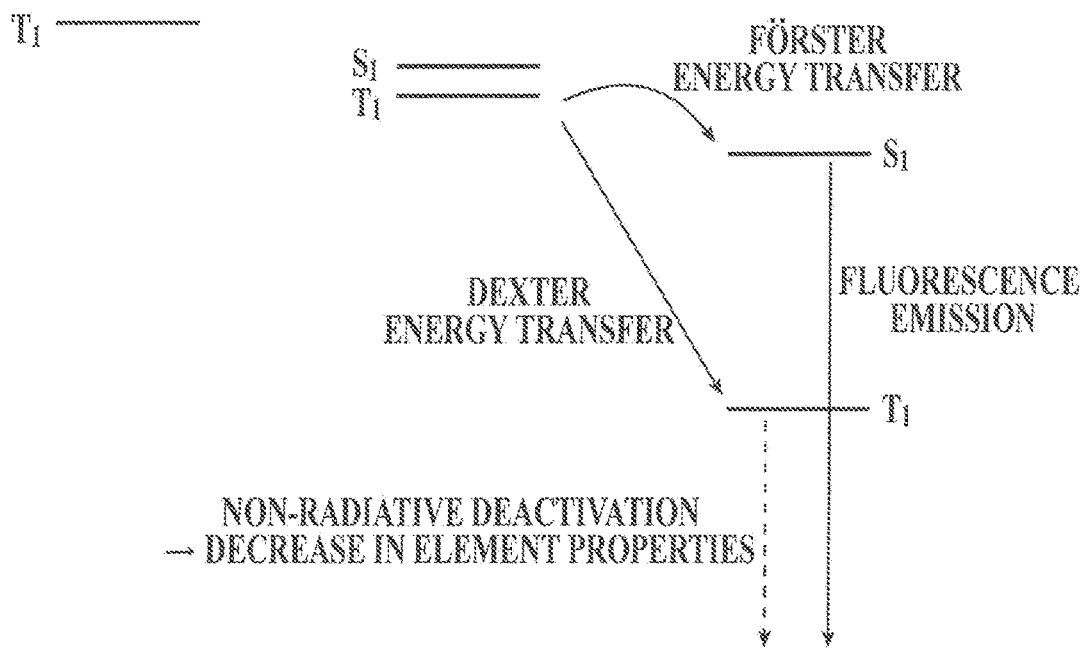

LUMINESCENT FILM, ORGANIC ELECTROLUMINESCENT ELEMENT, ORGANIC MATERIAL COMPOSITION AND METHOD FOR PRODUCING ORGANIC ELECTROLUMINESCENT ELEMENT

The present U.S. Patent Application is U.S. National Phase Application under 35 U.S.C. 371 of International Application No. PCT/JP2017/041918 filed on Nov. 22, 2017. This application claims a priority under the Paris Convention of Japanese Patent Application No. 2016-228472 filed on Nov. 25, 2016, Japanese Patent Application No. 2017-076419 filed on Apr. 7, 2017, and Japanese Patent Application No. 2017-158484 filed on Aug. 21, 2017, the entire disclosure of which is incorporated herein by reference in its entirety.

TECHNICAL FIELD

The present invention relates to a luminescent film, an organic electroluminescent element, an organic material composition, and a method for producing the organic electroluminescent element. The present invention relates more particularly to a luminescent film, etc., which has excellent luminous efficiency, chromaticity, and element lifetime.

BACKGROUND ART

Examples of luminescent electronic display devices include organic electroluminescent (hereinafter, sometimes referred to as "EL") elements.

An organic EL element is an element in which a light-emitting compound (hereinafter, sometimes referred to as a "luminescent material")-containing emitter layer is sandwiched between a cathode and an anode; electrons and holes are injected into the emitter layer and recombined to generate excitons; and the excitons are then deactivated to release light (fluorescence or phosphorescence), which is used for emitting light therefrom. Accordingly, the element allows for light emission when a low voltage of about several V to several dozen V is applied and further allows for self-light emission, which makes the viewing angle wider and the visibility higher. Besides, because of a thin-film complete solid element, the element has drawn attention from the viewpoints of space-saving and portability, etc.

To develop a future organic EL element, it is desirable to provide an organic EL element allowing for light emission having good luminous efficiency, luminance, and chromaticity.

From the viewpoint of high luminance, blue phosphorescent metal complexes containing a heavy atom such as Ir, Ru, or Pt are more frequently used as luminescent materials than blue fluorescent compounds. This is because these metal complexes can exert a heavy-atom effect to cause basically not-permitted spin flips from a singlet excited state to a triplet excited state, thereby achieving theoretically maximum 100% internal quantum efficiency.

Although blue phosphorescent compounds with high luminous efficiency have been found, those that can reach a satisfactory level from the viewpoints of element lifetime and chromaticity have not been discovered actually. This is because blue phosphorescent compounds have a higher energy level (hereinafter, sometimes simply referred to as a "level") than that of red or green counterparts, so that the energy is likely to be transferred to a low-level quencher that has been generated while the electric field is applied.

Blue phosphorescent compounds have an emission decay time r of about several μs to several dozen μs, which is 2 to 4 orders longer than the fluorescence lifetime of a fluorescent material. Also, in a blue phosphorescent compound, a triplet excited state level is high, so that the emission spectrum of the blue phosphorescent compound and the absorption spectrum of the quencher are likely to overlap and the energy transfer rate is thus increased.

In addition, the length of the emission decay time means how long excitons stay on the compound. Operation of the element under high current density, that is, the presence of many molecules in an excited state, is likely to cause TTA (Triplet-Triplet Annihilation) and/or TPA (Triplet-Polaron Annihilation), which are known factors of causing a decrease in luminosity and are not problems under low current density. Besides, a marked decrease in element lifetime may be induced. These matters can be evaluated in terms of a roll-off and/or an acceleration factor for the element lifetime (hereinafter, sometimes simply referred to as an "acceleration factor"). When the element operated under high exciton density has a similar emission lifetime thereof to that operated under low exciton density, the acceleration factor is 1, which means that radiative deactivation is enabled regardless of the operation conditions.

Note that the acceleration factor is denoted by n in the following equation (E).

$$t_1/t_2=(L_1/L_2)^{-n} \tag{E}$$

[$L_1$: initial luminance when a current density of 2.5 mA/cm² is applied;
$L_2$: initial luminance when a current density of 16.25 mA/cm² is applied;
$t_1$: element lifetime (luminance half-life) at a luminance $L_1$ (a low luminance and a low current of 2.5 mA/cm²); and
$t_2$: element lifetime (luminance half-life) at a luminance $L_2$ (a high luminance and a high current of 16.25 mA/cm²)]

Here, a quenching phenomenon in a luminescent material when a quencher has been generated can be explained by using the below-described STERN-VOLMER equation (expression (A)).

[Expression 1]

$$\frac{PL(\text{with Quencher})}{PL_0(\text{without Quencher})} = \frac{1}{1+K_q \times [Q] \times \tau_0} = \frac{1}{1+K_q \times (K_d \times t) \times \tau_0} \tag{Expression (A)}$$

In the expression (A), PL (with Quencher) is an emission intensity in the presence of the quencher; $PL_0$ (without Quencher) is an emission intensity in the absence of the quencher; $K_q$ is a rate of energy transfer from a luminescent material to the quencher; $[Q](=K_d \times t)$ is a concentration of the quencher; $K_d$ is a rate of quencher production due to aggregation and degradation; t is an integrated time of excitation due to light or current; and $\tau_0$ is a phosphorescent emission half-life of a phosphorescent compound when no quencher is present.

According to the expression (A), fluorescent compounds, which are a luminescent material having a short emission decay time $\tau_0$, should have a longer element emission lifetime (hereinafter, sometimes referred to as "element lifetime"). As mentioned above, organic EL elements using conventional fluorescent compounds do not have more than 25% internal quantum efficiency.

Here, the fluorescent compounds may be made highly efficient by using the Triplet-Triplet Annihilation (hereinafter, sometimes simply referred to as "TTA") mechanism as a device for making fluorescence emission efficiency highly efficient. The triplet excited state of general fluorescent compound is subject to heat deactivation. However, if the exciton density is made higher, it has been known that triplet excitons collide to one another so as to generate a singlet excited state. The TTA mechanism is represented by expression (B) below in which one singlet exciton occurs from five triplet excitons. However, even if the TTA mechanism is used, the theoretical limit of external quantum efficiency (EQE) is 8%, which is far from that of phosphorescent compounds.

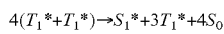

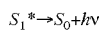 Expression (B)

In the expression (B), $S_0$ denotes a ground state; $S_1$ denotes a singlet excitation level; $T_1$ denotes a triplet excitation level; and * denotes an excited state.

In addition, Patent Literature 2, for instance, describes a technology for producing a highly efficient organic EL element by using, as an assist dopant for a fluorescent compound, a TADF (thermally activated delayed fluorescence) light-emitting compound. The emission decay time ($\tau$) of a luminescent film containing the fluorescent compound is still in the order of t sec and is thus long. Unfortunately, this causes a roll-off, an increased acceleration factor, a decreased luminosity, and a shortened element lifetime under high luminance and high current density.

To make the above expression (B) effective in the organic EL element, it is necessary to provide high-density excitons as described previously. To achieve the above, the light emission position inside an emitter layer has to be set close to either a hole transport layer (HTL) side or an electron transport layer (ETL) side. Meanwhile, because the position cannot be set close to the ETL side on which the exciton stability is weak, light has to be actually emitted at the interface between the HTL and the emitter layer (EML). Accordingly, when materials constituting these layers are mixed at the interface between the HTL and the EML (hereinafter, sometimes referred to as "the interface is mixed"), the energy transfer to the HTL appears, which leads to a decrease in exciton density and thus a decrease in luminous efficiency.

The interface mixture appears markedly when a film is formed by a coating process. When a multi-layer film is formed by the coating process, several nm of the interface between the HTL and the EML is known to be mixed. This causes an increase in the probability of energy transfer to the HTL, so that a marked decrease in luminous efficiency is found to be induced. It is thus only possible in such a limited layer constitution to put into practice elements in which high-density excitons are utilized for the TTA mechanism.

Regarding fluorescence sensitization, which is an alternative for the TTA, Patent Literature 1, for instance, discloses, as shown in FIG. 1, that a blue fluorescent compound and a blue phosphorescent compound, the triplet excited state level of which is higher than the singlet excited state level of the blue fluorescent compound, are combined to promote Förster energy transfer from the blue phosphorescent compound to the singlet excited state of the blue fluorescent compound, thereby making light emission from the blue fluorescent compound highly efficient. However, a blue phosphorescent compound that can emit UV light has to be used for the sensitization of the blue fluorescent compound by using this mechanism.

Further, Patent Literature 3 discloses, as shown in FIG. 2, that a blue fluorescent compound and a blue phosphorescent compound are combined to enhance chromaticity. However, a deactivation pathway to the triplet excited state of the blue fluorescent compound is not suppressed, so that the luminous efficiency cannot be said to be sufficient and there is a room for improvement.

In the present invention, for the $S_1$ sensitization of a blue fluorescent compound is used a combination of a blue fluorescent compound and a phosphorescent compound, between which the efficiency of Förster energy transfer is exerted more preferentially than the efficiency of Dexter energy transfer. This not only increases the luminous efficiency but also allows for longer element lifetime and higher chromaticity regardless of the layer constitution.

As described above, the following two points are considered:

a blue phosphorescent compound has an emission decay time r of about several μs to several dozen μs, which is long; and the triplet excited state level is high, so that the emission spectrum of the blue phosphorescent compound and the absorption spectrum of a quencher are likely to overlap and the rate of energy transfer therebetween is thus increased.

As clear from the above expression (A), the combination of the two points makes it difficult to prolong the element lifetime by using the blue phosphorescent compound.

In the technologies disclosed in Patent Literatures 1 to 3, the element lifetime cannot be said to be enough and there is still a large room for improvement.

CITATION LIST

Patent Literature

Patent Literature 1: Japanese Patent No. 4571359
Patent Literature 2: Japanese Patent No. 5905916
Patent Literature 3: Japanese Patent No. 4904821

SUMMARY OF INVENTION

Technical Problem

The present invention has been made in light of the above problems and situations and addresses the problem of providing a luminescent film with excellent luminous efficiency, chromaticity, and element lifetime, an organic electroluminescent element, an organic material composition, and a method for producing the organic electroluminescent element.

Solution to Problem

The present inventors have conducted research on the causes of the above problems so as to provide a solution to the problems and found, in the course, that the emission spectrum of a blue phosphorescent compound and the absorption spectrum of the above blue fluorescent compound have portions overlapping with each other and the shortest wavelength-side maximum emission wavelengths of these luminescent compounds are specified by a specific relationship, thereby capable of increasing the luminous efficiency and chromaticity of a luminescent film and the element lifetime. The present inventors have thus arrived at the invention.

Specifically, to achieve at least one of the abovementioned objects, an aspect of the present invention is as follows.

A luminescent film comprising a host compound, a blue phosphorescent compound, and a blue fluorescent compound, wherein an emission spectrum of the blue phosphorescent compound and an absorption spectrum of the blue fluorescent compound have portions overlapping with each other;

shortest wavelength-side maximum emission wavelengths of the blue phosphorescent compound (abbreviated as "BPM" in the expression) and the blue fluorescent compound (abbreviated as "BFM" in the expression) satisfy the following expression (1):

$$\lambda_{BFM} \geq \lambda_{BPM} \qquad \text{expression (1):}$$

wherein $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound; and light emission derived from the blue fluorescent compound is detected.

An organic electroluminescent element comprising an emitter layer and a layer adjacent to the emitter layer between an anode and a cathode, wherein the emitter layer comprises a host compound and a blue phosphorescent compound;

the layer adjacent to the emitter layer comprises a blue fluorescent compound;

an emission spectrum of the blue phosphorescent compound and an absorption spectrum of the blue fluorescent compound have portions overlapping with each other;

the shortest wavelength-side maximum emission wavelengths of the blue phosphorescent compound (abbreviated as "BPM" in the expression) and the blue fluorescent compound (abbreviated as "BFM" in the expression) satisfy the following expression (1):

$$\lambda_{BFM} \geq \lambda_{BPM} \qquad \text{expression (1):}$$

wherein $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound; and light emission derived from the blue fluorescent compound is detected.

An organic material composition comprising a host compound, a blue phosphorescent compound, and a blue fluorescent compound, wherein an emission spectrum of the blue phosphorescent compound and an absorption spectrum of the blue fluorescent compound have portions overlapping with each other;

the shortest wavelength-side maximum emission wavelengths of the blue phosphorescent compound (abbreviated as "BPM" in the expression) and the blue fluorescent compound (abbreviated as "BFM" in the expression) satisfy the following expression (1):

$$\lambda_{BFM} \geq \lambda_{BPM} \qquad \text{expression (1):}$$

wherein $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound; and light emission derived from the blue fluorescent compound is detected.

BRIEF DESCRIPTION OF DRAWINGS

The advantages and features provided by one or more embodiments of the invention will become more fully understood from the detailed description given hereinbelow and the appended drawings which are given by way of illustration only, and thus are not intended as a definition of the limits of the present invention.

FIG. 1 is a schematic diagram illustrating energy transfer in the technology disclosed in Patent Literature 1.

FIG. 2 is a schematic diagram illustrating energy transfer in the technology disclosed in Patent Literature 2.

DESCRIPTION OF EMBODIMENTS

Figure 3A:
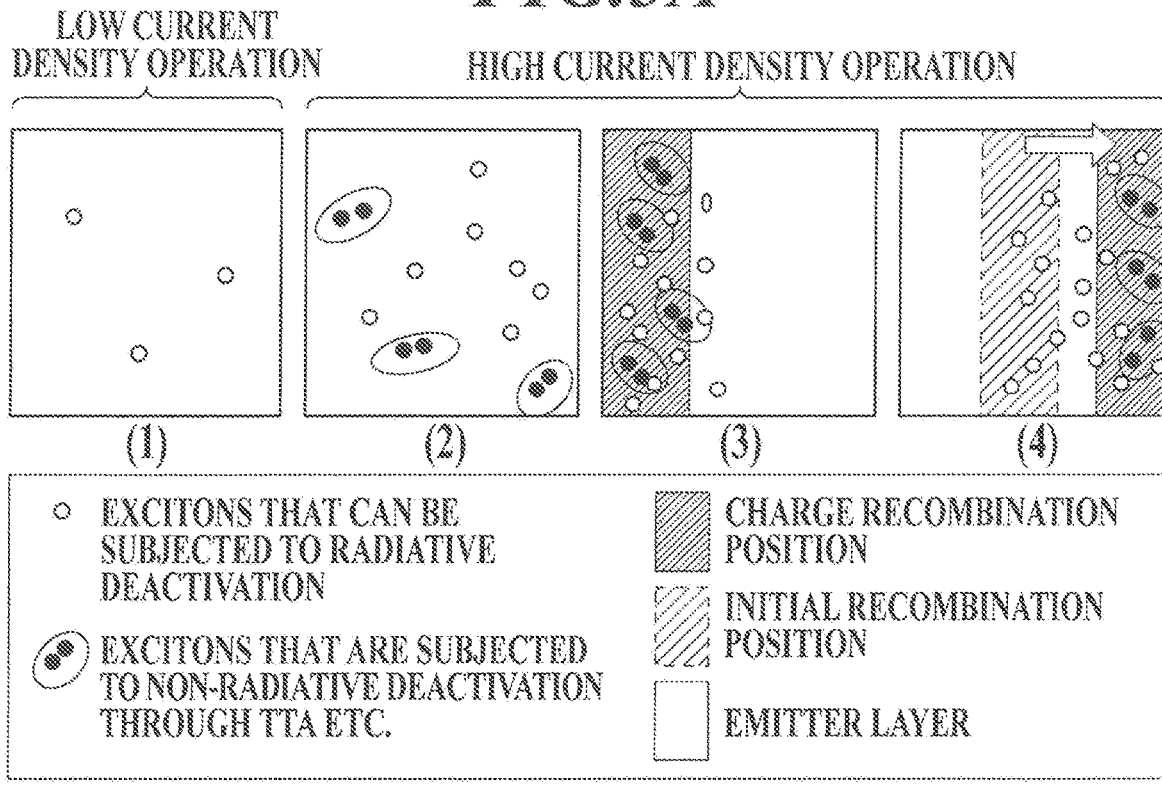
FIG. 3A is a schematic diagram illustrating how light is emitted in an emitter layer of a conventional organic EL element.

Hereinafter, one or more embodiments of the present invention will be described with reference to the drawings. However, the scope of the invention is not limited to the disclosed embodiments.

DESCRIPTION OF EMBODIMENTS

A luminescent film according to the present invention includes a host compound, a blue phosphorescent compound and a blue fluorescent compound, and is characterized in that:

the emission spectrum of the blue phosphorescent compound and the absorption spectrum of the blue fluorescent compound have portions overlapping with each other;

the shortest wavelength-side maximum emission wavelengths of the blue phosphorescent compound (abbreviated as "BPM" in the expression) and the blue fluorescent compound (abbreviated as "BFM" in the expression) satisfy the above expression (1); and light emission derived from the blue fluorescent compound is detected. The characteristics are technical features shared with or corresponding to the inventions of the above respective items. They can exert effects such as excellent luminous efficiency, chromaticity, and element lifetime.

In an embodiment of the present invention, the chromaticity of luminescent color of the blue phosphorescent compound and that of the blue fluorescent compound preferably satisfy the above expression (2). This can highly efficiently elicit high-purity blue, which has not been realized by blue phosphorescent compounds.

In an embodiment of the present invention, it is preferable that the ratio involving energy transfer from the blue phosphorescent compound to the blue fluorescent compound satisfies the above expression (3). This makes it possible to sensitize the blue fluorescent compound while a decrease in the element lifetime of the luminescent film is suppressed.

In an embodiment of the present invention, the blue phosphorescent compound is preferably represented by the above general formula (1). This makes it possible to not only produce a blue phosphorescent compound having more stable excitons but also increase the integral value of overlap between the emission spectrum of the blue phosphorescent compound and the absorption spectrum of the blue fluorescent compound. As a result, excitons can be effectively used for light emission and a luminescent film can be obtained while the element lifetime can be prolonged.

An embodiment of the present invention may provide an organic electroluminescent element including an emitter layer between an anode and a cathode, wherein the element has a luminescent film according to the present invention. This makes it possible to provide an organic electroluminescent element having much higher luminous efficiency and chromaticity that have not been realized by blue phosphorescent compounds.

An embodiment of the present invention may provide an organic electroluminescent element, wherein a luminescent film of the present invention contains a material of a layer adjacent to the luminescent film. In conventional fluorescence-using elements, exciton density is increased by making the light emission position closer to an adjacent layer side so as to cause TTA. Because the material of the adjacent layer is mixed, this causes a decrease in the exciton density and the material of the adjacent layer serves as a quencher, resulting in a marked decrease in the element lifetime. In the luminescent film of the present invention, it is completely unnecessary to make the exciton density biased or higher. Also, excitons, the level of which is changed by Förster energy transfer from the blue phosphorescent compound to the blue fluorescent compound, are immediately subject to radiative deactivation to emit light and are thus less susceptible to external influences. That is, it is possible to stably provide an organic electroluminescent element while less affected by the external environment.

An embodiment of the present invention may provide an organic electroluminescent element further including a gas barrier layer having a water vapor transmittance, as measured by the protocol according to JIS K 7129-1992, in a range from 0.001 to 1 g/(m²·day) and an oxygen transmittance, as measured by the protocol according to JIS K 7126-1987, in a range from 0.001 to 1 mL/(m²·day·atm).

According to the present invention, even if such a gas barrier layer with not-high gas barrier properties is included, it can be put into practical use. Thus, the cost can be saved.

An embodiment of the present invention may provide an organic electroluminescent element including an emitter layer and a layer adjacent to the emitter layer, which layers are provided between an anode and a cathode, wherein the emitter layer contains a host compound and a blue phosphorescent compound; the layer adjacent to the emitter layer contains a blue fluorescent compound; the emission spectrum of the blue phosphorescent compound and the absorption spectrum of the blue fluorescent compound have portions overlapping with each other; the shortest wavelength-side maximum emission wavelengths of the blue phosphorescent compound and the blue fluorescent compound satisfy the above expression (1); and light emission derived from the blue fluorescent compound is detected. This can make longer the distance between the blue fluorescent compound and the blue phosphorescent compound, resulting in suppression of Dexter energy transfer. This can also suppress a decrease in the element lifetime.

An embodiment of the present invention may provide an organic electroluminescent element, wherein the phosphorescent compound and the blue fluorescent compound satisfy the above expression (5) and expression (6). This makes it possible to provide an organic electroluminescent element in which charges are not directly recombined on the blue fluorescent compound, thereby suppressing a decrease in EQE.

An embodiment of the present invention may provide an organic material composition including a host compound, a blue phosphorescent compound, and a blue fluorescent compound, wherein the emission spectrum of the blue phosphorescent compound and the absorption spectrum of the blue fluorescent compound have portions overlapping with each other;

the shortest wavelength-side maximum emission wavelengths of the blue phosphorescent compound (abbreviated as "BPM" in the expression) and the blue fluorescent compound (abbreviated as "BFM" in the expression) satisfy the above expression (1); and light emission derived from the blue fluorescent compound is detected. This makes it possible to correspond to various production processes such as a wet process.

An embodiment of the present invention may provide a method for producing an organic electroluminescent element for producing an organic electroluminescent element having a luminescent film of the present invention, wherein the luminescent film is formed by using a wet process or dry process. When the film is formed by using a wet process, in particular, restrictions regarding the shape and size of the element may be decreased. In addition, the organic electroluminescent element can be produced by using a more inexpensive production process.

Further, in the above method for producing an organic electroluminescent element, may be provided a gas barrier layer having a water vapor transmittance, as measured by the protocol according to JIS K 7129-1992, in a range from 0.001 to 1 g/(m² day) and an oxygen transmittance, as measured by the protocol according to JIS K 7126-1987, in a range from 0.001 to 1 mL/(m²·day·atm).

The details of the present invention and its constituting elements and its forms and modes to put the present invention into practice will be as follows. Note that as used herein, the term "to" is meant and used to include the lower limit and the upper limit of numerical values following and followed by the term.

Note that as used herein, blue refers to the case where the y value obtained with respect to the below-described solution spectrum is 0.45 or less.

(Solution Spectrum Measurement)

A solution spectrum may be determined by measuring a sample, which has been dissolved in 2-methyltetrahydrofuran (2m-THF), by using a spectrophotometer.

Specifically, 2m-THF may be used to adjust a sample at a concentration of $1\times10^{-5}$ mol/L and the sample may be measured with a spectrophotometer U-3000 (manufactured by Hitachi High-Technologies Corporation).

<<Overview of Luminescent Film>>

A luminescent film of the present invention includes a host compound, a blue phosphorescent compound, and a blue fluorescent compound, wherein the emission spectrum of the blue phosphorescent compound and the absorption spectrum of the blue fluorescent compound have portions overlapping with each other;

the shortest wavelength-side maximum emission wavelengths of the blue phosphorescent compound (abbreviated as "BPM" in the expression) and the blue fluorescent compound (abbreviated as "BFM" in the expression) satisfy the following expression (1):

$$\lambda_{BFM} \geq \lambda_{BPM} \qquad \text{expression (1):}$$

wherein $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound; and light emission derived from the blue fluorescent compound is detected.

<<Luminescent Film>>

A luminescent film of the present invention contains a host compound, a blue phosphorescent compound, and a blue fluorescent compound.

Contents of the blue phosphorescent compound, the host compound, and the blue fluorescent compound in the luminescent film of the present invention may be optionally determined based on conditions required for applicable products. The content may be provided at a uniform concentration in the film thickness direction or may have an arbitrary concentration distribution.

Provided that to suitably elicit a light emission phenomenon, the content of the blue phosphorescent compound in the luminescent film according to the present invention is preferably from 1 to 50 mass % and more preferably from 1 to 30 mass % when the mass of the luminescent film is defined as 100 mass %. In addition, the content of the host compound in the luminescent film according to the present invention is preferably from 50 to 99 mass % and more preferably from 70 to 99 mass % when the mass of the luminescent film is defined as 100 mass %. Further, the content of the blue fluorescent compound in the luminescent film according to the present invention is preferably equal to or less than that of the blue phosphorescent compound and more preferably from 0.1 to 5.0 mass % from the viewpoints of preferably eliciting a blue phosphorescent compound-derived sensitization phenomenon and suppressing direct recombination on the fluorescent compound during electric field operation.

As a mode of the present invention, attention is focused on sensitization where the blue fluorescent compound becomes a singlet excited state by Förster energy transfer from the triplet excited state of the blue phosphorescent compound to the singlet excited state of the blue fluorescent compound. Here, we describe a technology where the blue phosphorescent compound mediates conversion of all excitons from the host compound to the triplet excited state thereof and the triplet excited state is then shifted to the corresponding state of the blue fluorescent compound. The expressions below illustrate how an exciton is transferred when a host compound is mainly subject to photo-excitation in the luminescent film containing the host compound, the blue phosphorescent compound, and the blue fluorescent compound.

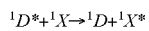

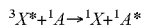

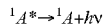             Expressions (C)

In the expressions (C), D denotes a host compound; X denotes an intersystem crossing agent (blue phosphorescent compound); and A denotes an energy acceptor (blue fluorescent compound). The superscript 1 denotes singlet spin multiplicity; and the superscript 3 denotes triplet spin multiplicity; and * denotes an excited state.

To understand the above mechanism in the expressions, a theory for a basic energy transfer mechanism is discussed.

<<Dexter Energy Transfer and Förster Energy Transfer>>

<Dexter Energy Transfer>

The Dexter energy transfer is a short-term process that depends on the overlap between molecular orbitals of adjacent molecules. In addition, pair symmetry between an energy donor and an energy acceptor is preserved. Thus, the energy transfer in the expressions (C) is impossible by using a Dexter mechanism.

<Förster Energy Transfer>

In the Förster energy transfer mechanism, the energy transfer in the expressions (C) is possible. The Förster energy transfer occurs through a transition permitted in both an energy donor and an energy acceptor like a transmitter and an antenna. This phenomenon of Förster energy transfer is typically limited to transfer between singlet states.

However, as used herein, a phosphorescent compound is considered in which an energy donor-mediated transfer. $^3X^* \to {}^1A$ is permitted. Unfortunately, due to a difference in symmetry between the triplet excited state and the singlet ground state, the probability of this transfer is low.

Nevertheless, the spin orbital interaction through introduction of a heavy metal atom may cause some state perturbation. As long as the perturbation allows for phosphorescent light emission by a phosphorescent body, this body can play a role as the energy donor during the Förster energy transfer.

In addition, the main factor for efficiently achieving the Förster energy transfer involves the presence of overlap between the emission spectrum of the energy donor (phosphorescent compound) and the absorption spectrum of the energy acceptor (fluorescent compound).

Because of this, it is essential in the present invention that the emission spectrum of the blue phosphorescent compound and the absorption spectrum of the blue fluorescent compound have portions overlapping with each other.

Examples describe, in detail, how important the overlap integral is.

Hereinbelow, as used herein, the Förster energy transfer efficiency refers to the efficiency of energy transfer from the triplet excited state of a blue phosphorescent compound to the singlet excited state of a blue fluorescent compound; and the Dexter energy transfer efficiency refers to the efficiency of energy transfer from the triplet excited state of a blue phosphorescent compound to the triplet excited state of a blue fluorescent compound. In addition, as used herein, the ratio of the Förster energy transfer efficiency to the Dexter energy transfer efficiency (hereinbelow, sometimes simply referred to as "$P_F/P_D$") is used to discuss the luminosity characteristics.

Further, each energy transfer efficiency consists of luminescent film absolute quantum efficiency (hereinafter, sometimes simply referred to as "PLQE") and emission decay time τ (hereinafter, sometimes simply referred to as "τ") before and after addition of the fluorescent compound. For example, the PLQE can be measured with an absolute quantum efficiency-measuring device C9920-02 (manufactured by Hamamatsu Photonics K. K.) and the emission decay time T can be measured with a fluorescence lifetime-measuring device (e.g., a streak camera C4334 and a small fluorescence lifetime-measuring device C11367-03 (both manufactured by Hamamatsu Photonics K. K.)).

Each energy transfer efficiency calculation method is provided as the following expressions (D).

[Expression 2]

$$P_F = \frac{Kf}{Kr + Knr + Kf + Kd}$$

$$P_D = \frac{Kd}{Kr + Knr + Kf + Kd}$$

$$Kf = \frac{PLQE}{\tau} - Kr$$

$$Kd = \frac{1}{\tau} - (Kr + Knr + Kf)$$

$$PLQE = \frac{Kr + Kf}{Kr + Knr + Kf + Kd}$$

$$\tau = \frac{1}{Kr + Knr + Kf + Kd}$$

$$PLQE_0 = \frac{Kr}{Kr + Knr}$$

$$\tau_0 = \frac{1}{Kr + Knr}$$

Expression (D)

In the expressions (D), $\tau_0$ denotes the emission decay time of a blue fluorescent compound-free luminescent film (hereinafter, sometimes referred to as a "luminescent film before the blue fluorescent compound is added"); and the emission decay time τ denotes the emission decay time after the blue fluorescent compound is added. $PLQE_0$ is the absolute quantum efficiency of the luminescent film before the blue fluorescent compound is added; and PLQE is the absolute quantum efficiency of the blue fluorescent compound-containing luminescent film (hereinafter, sometimes referred to as the "luminescent film after the blue fluorescent compound is added"). In addition, Kr is the radiation rate of the blue phosphorescent compound; Knr is the non-radiation rate of a phosphorescent compound; Kf is the rate of Förster energy transfer from the triplet excited state of the blue phosphorescent compound to the $S_1$ excited state of the fluorescent compound; Kd is the rate of Dexter energy transfer from the triplet excited state of the blue phosphorescent compound to the $T_1$ excited state of the blue fluorescent compound. Then, $P_D$ represents the efficiency of Dexter energy transfer from the triplet excited state of the blue phosphorescent compound to the triplet excited state of the blue fluorescent compound. $P_F$ represents the efficiency of Förster energy transfer from the triplet excited state of the blue phosphorescent compound to the singlet excited state of the blue fluorescent compound.

Generally speaking, when a blue fluorescent compound is used for luminescent material, the proportions of singlet excitons and triplet excitons generated during charge recombination are 25% and 75%, respectively. Specifically, the ratio of the Förster energy transfer efficiency to the Dexter energy transfer efficiency ($P_F/P_D$) in the present invention preferably satisfies the below-described expression (3) from the viewpoint of sensitizing the singlet excited state of the blue fluorescent compound.

$$P_F/P_D \geq 0.34. \quad \text{expression (3):}$$

Note that it is more preferable that the upper limit is not particularly restricted. From the viewpoint pf prolonging the element lifetime, it is preferable to satisfy the expression (3A):

$$P_F/P_D \geq 0.5. \quad \text{expression (3A):}$$

<<Overlap Integral>>

As described above, the main factor for efficiently achieving the Förster energy transfer involves the overlap between the emission spectrum of the blue phosphorescent compound and the absorption spectrum of the blue fluorescent compound. The amount of overlap between the spectra is called an overlap integral value, which is known to be calculated using the following expression (OI)

[Expression 3]

$$J = \int f_D(\lambda)\varepsilon_A(\lambda)\lambda^4 d\lambda \quad \text{Expression (OI)}$$

In the above expression (OI), $f_D$ denotes the emission spectrum of a normalized donor (energy donor, blue phosphorescent compound) and $\varepsilon_A$ denotes the molar absorption coefficient of an acceptor (energy acceptor, blue fluorescent compound). λ represents a wavelength. Note that J represents an overlap integral value.

<<Relationship Regarding Maximum Emission Wavelength (Expression (1))>>

The shortest wavelength-side maximum emission wavelengths of the blue phosphorescent compound (abbreviated as "BPM" in the expression) and the blue fluorescent compound (abbreviated as "BFM" in the expression) satisfy the below-described expression (1).

$$\lambda_{BFM} \geq \lambda_{BPM} \quad \text{expression (1):}$$

wherein $\lambda_{BFM}$ represents the shortest wavelength-side maximum emission wavelength of the blue fluorescent compound, and $\lambda_{BPM}$ represents the shortest wavelength-side maximum emission wavelength of the blue phosphorescent compound.

Note that the shortest wavelength-side maximum emission wavelength according to the present invention refers to the shortest wavelength-side wavelength among wavelengths where the emission intensity (emission peak intensity) is maximum.

(Emission Spectrum Measurement)

An emission spectrum can be measured by known methods. For instance, a fluorometer (HITACHI F-7000 model spectrofluorometer) may be used for the measurement.

(Absorption Spectrum Measurement)

An absorption spectrum may be measured by known methods. For instance, a fluorometer (HITACHI U-3300 spectrophotometer) may be used for the measurement.

<<Chromaticity Relationship>>

The CIE chromaticity coordinate y values of luminescent colors of the blue phosphorescent compound and the blue fluorescent compound preferably satisfy the following expression (2):

$$y_{BPM} \geq y_{BFM} \quad \text{expression (2):}$$

wherein $y_{BPM}$ represents the CIE chromaticity coordinate y value of the luminescent color of the blue phosphorescent compound; and $y_{BFM}$ represents the CIE chromaticity coordinate y value of the luminescent color of the blue fluorescent compound.

(Chromaticity Measurement Procedure)

Figure 4:
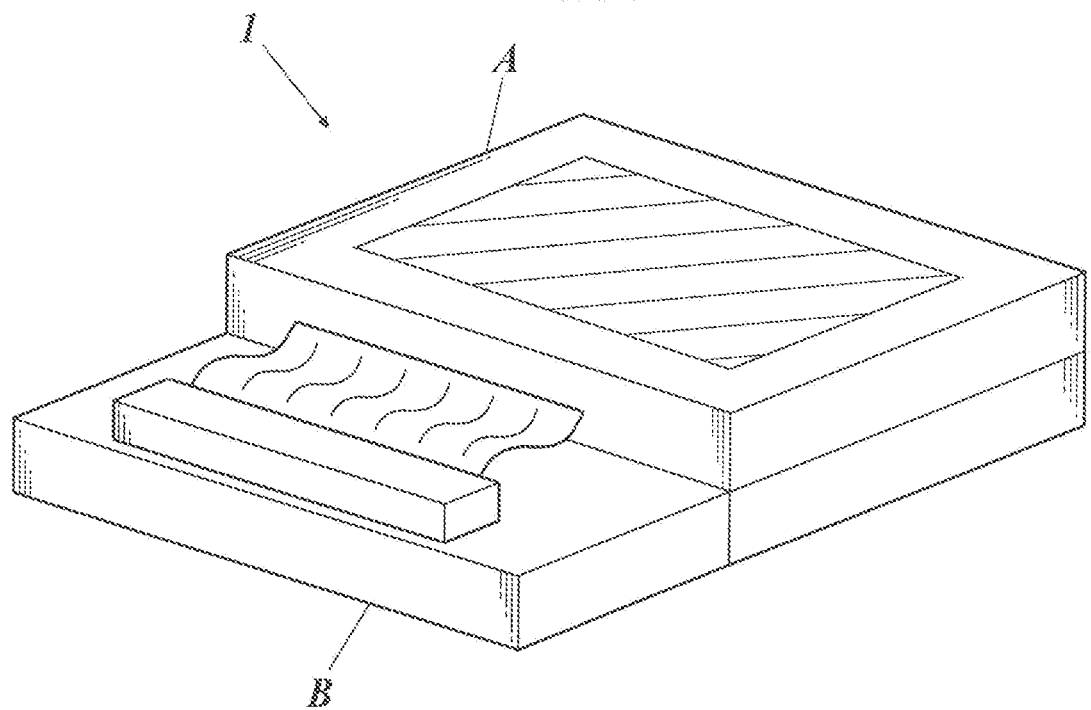
FIG. 4 is a perspective view schematically illustrating the constitution of a display device according to an embodiment of the present invention.

The color that is emitted by an organic EL element of the present invention or a luminescent film of the present invention may be determined as a color obtained by fitting, to the CIE chromaticity coordinate, the results of measurement using a spectral emission luminance meter CS-1000 (manufactured by Konica Minolta, Inc.) in accordance with FIG. 4.16 in page 108 of "New Handbook of Color Science" (edited by The Color Science Association of Japan, The University of Tokyo Press, 1985). The y value is a CIE chromaticity coordinate y value.

Note that a method for detecting the chromaticity of luminescent color of each compound is not particularly limited and the compound may be separated and purified by, for instance, HPLC (High Performance Liquid Chromatography) and the luminescent color may be measured with the above spectral emission luminance meter, etc.

<<Relationship between Content of Blue Phosphorescent Compound and Content of Blue Fluorescent Compound (Expression (4))>>

In an embodiment, the content (mass %) of the blue phosphorescent compound and the content (mass %) of the blue fluorescent compound may satisfy the below-described expression (4). This makes it possible to efficiently sensitize the blue fluorescent compound through the blue phosphorescent compound.

Content (mass %) of the blue phosphorescent compound≥Content (mass %) of the blue fluorescent compound. expression (4):

<<Blue Fluorescent Compounds>>

Blue fluorescent compounds according to the present invention are explained.

The blue fluorescent compound according to the present invention is a compound that can emit singlet excitation-derived light and is not particularly limited as long as singlet excitation-derived light emission is observed.

Examples of the blue fluorescent compound according to the present invention include anthracene derivatives, pyrene derivatives, chrysene derivatives, fluoranthene derivatives, fluorene derivatives, arylacetylene derivatives, styrylarylene derivatives, styrylamine derivatives, arylamine derivatives, boron complexes, coumarin derivatives, pyran derivatives, cyanine derivatives, croconium derivatives, squalium derivatives, oxobenzanthracene derivatives, fluorescein derivatives, rhodamine derivatives, pyrylium derivatives, perylene derivatives, polythiopheone derivatives, and rare earth metal complex-based compounds. They are not particularly limited as long as blue light can be emitted.

Among them, it is more preferable to use a blue fluorescent compound with a small stokes shift from the viewpoint of more increasing the integral value of overlap between the emission spectrum of the blue phosphorescent compound and the absorption spectrum of the blue fluorescent compound.

Further preferred are compounds with a stokes shift of 0.1 eV or less. As such, the integral of overlap between the emission spectrum of the phosphorescent compound and the absorption spectrum of the fluorescent compound can be increased. In addition, it is also possible to lower relaxation of the structure of the fluorescent molecule when the fluorescent compound emits light by Förster energy transfer. The above can suppress variations of film characteristics, which has been a fundamental problem. Because of this, the element lifetime should be prolonged further.

In addition, luminescent dopants using delayed fluorescence have recently been developed and may be used.

Specific examples of the delayed fluorescence-using blue fluorescent compound include, but not limited to, the compounds disclosed in WO2011/156793, JP2011-213643A, and JP2010-93181A.

In addition, the compounds exemplified below may be suitably used.

[Formula 2]

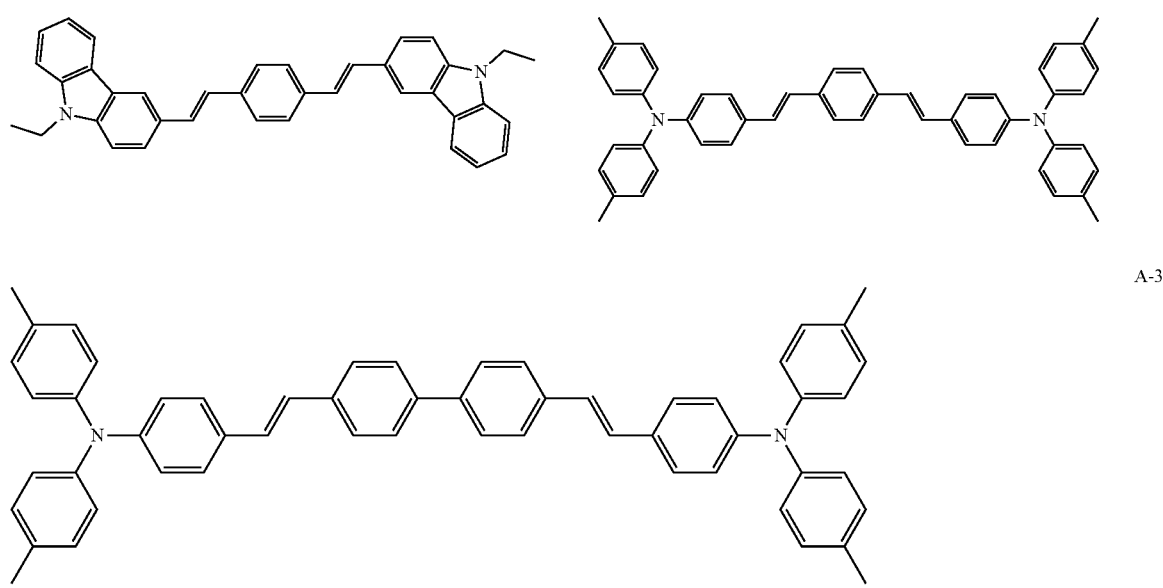

A-4
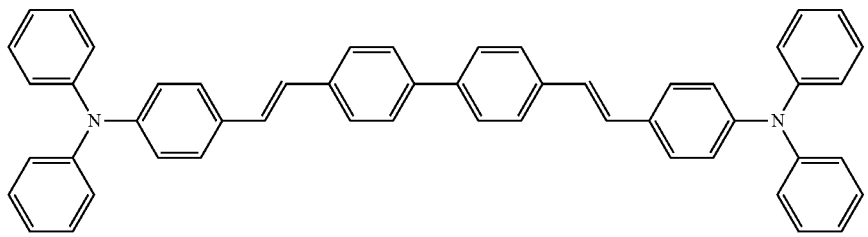
A-5
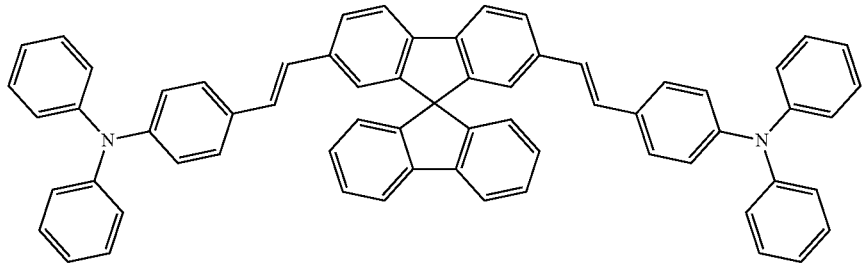
A-6
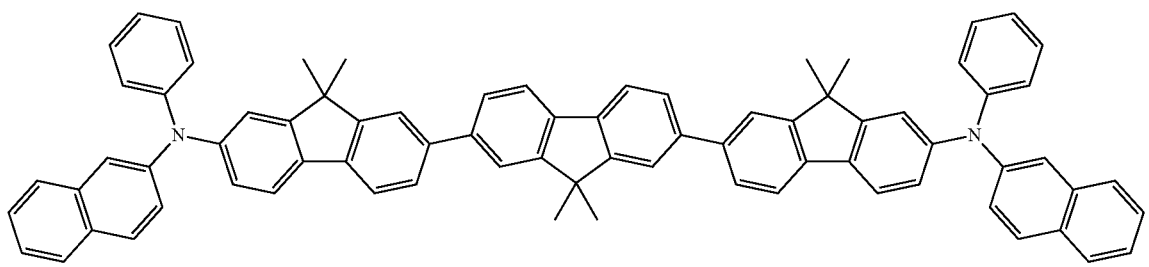
[Formula 3]
A-7
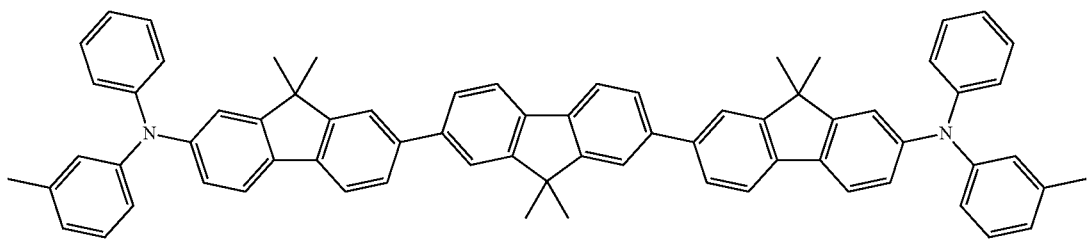
A-8
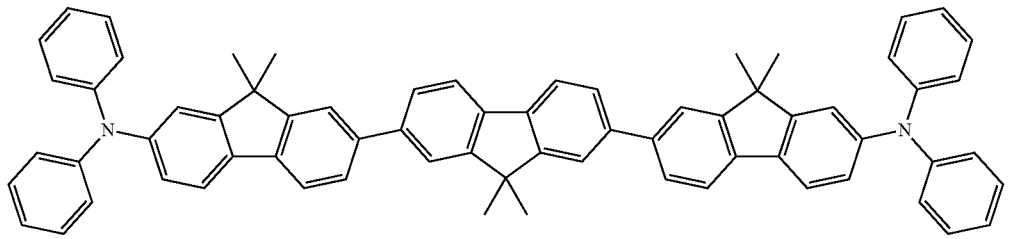
A-9
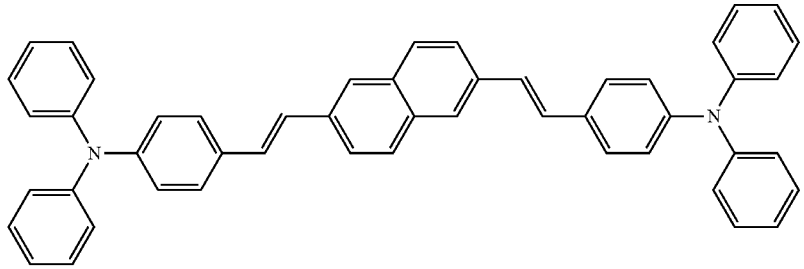

-continued
A-10
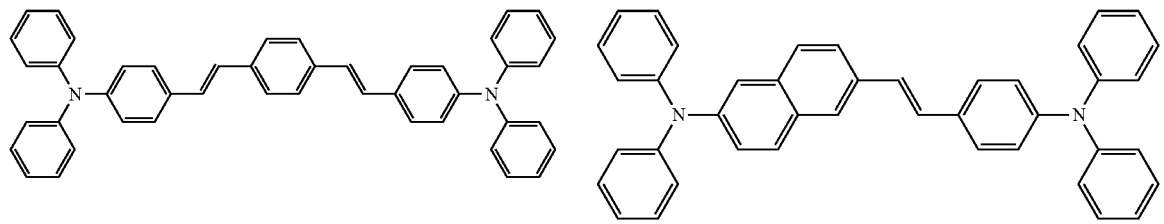
A-11
A-12
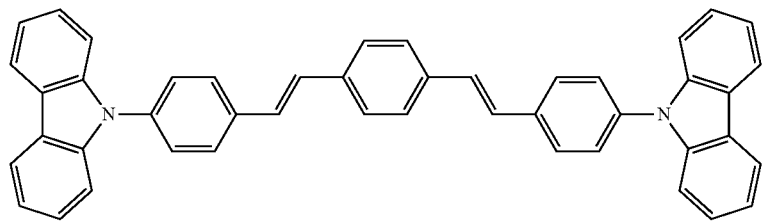
A-13
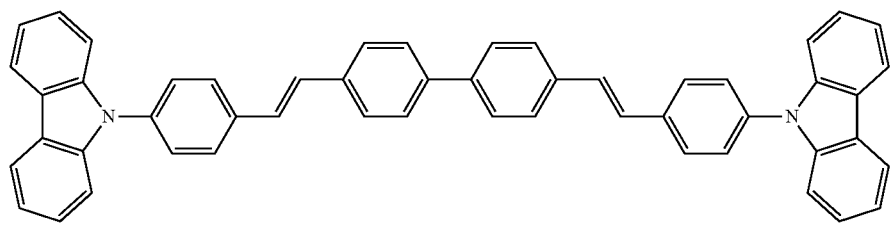
[Formula 4]
A-14
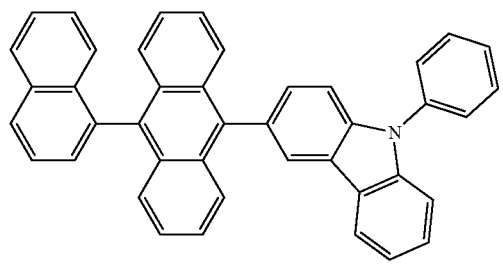
A-15
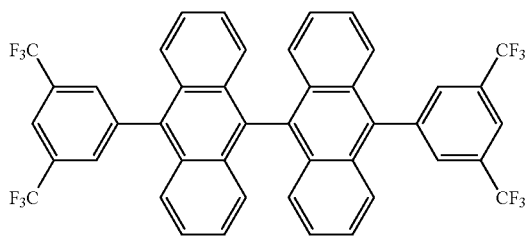
A-16
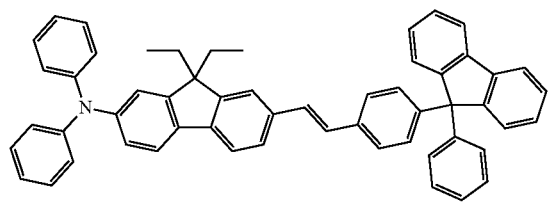
A-17
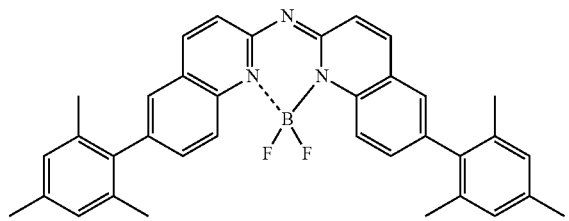
A-18
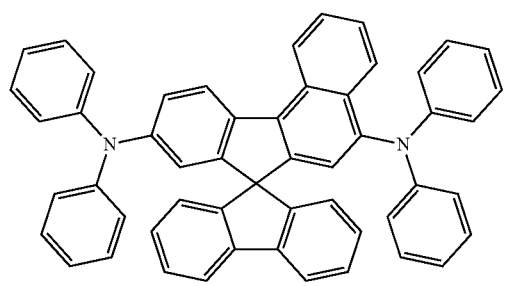
A-19
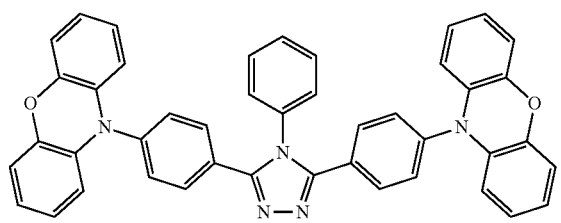

A-20
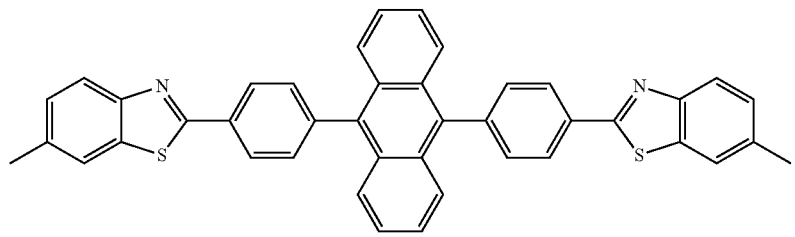
[Formula 5]
A-21
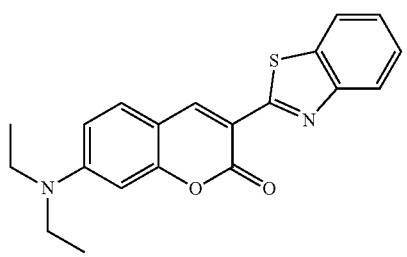
A-22
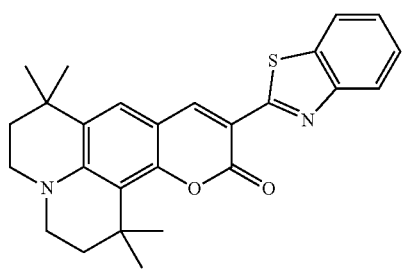
A-23
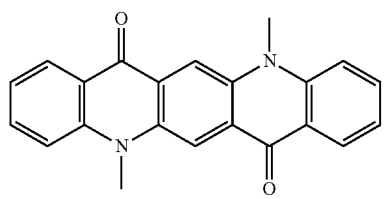
A-24
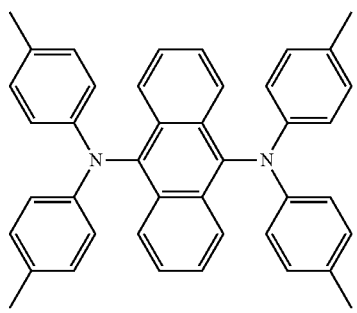
A-25
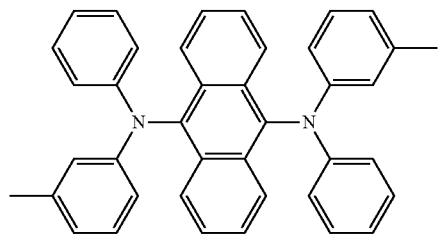
A-26
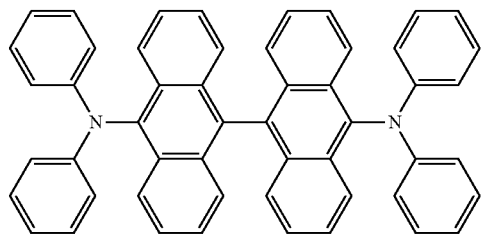
A-27
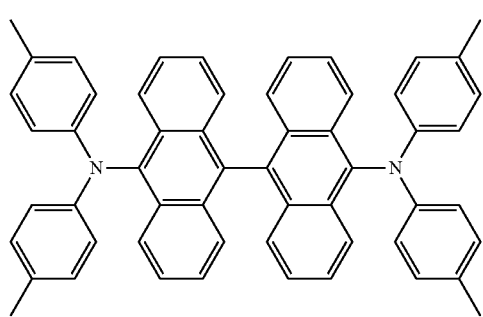
A-28
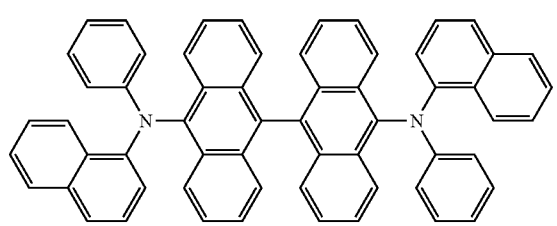

[Formula 6]

Exemplified compound 1

Exemplified compound 2

Exemplified compound 3

Exemplified compound 4

Exemplified compound 5

Exemplified compound 6

(F-3)

-continued
[Formula 7]
Exemplified compound 7
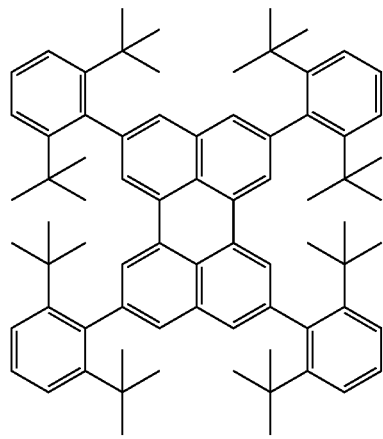
Exemplified compound 8
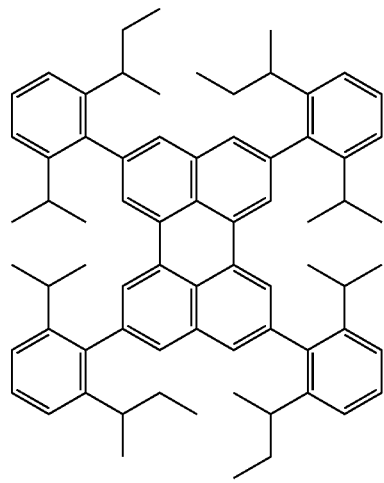
Exemplified compound 9
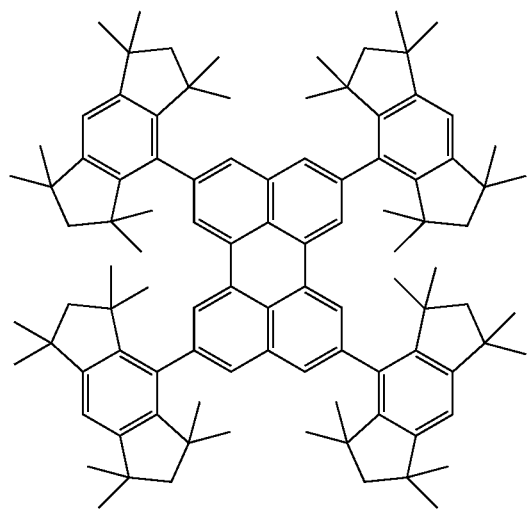
Exemplified compound 10
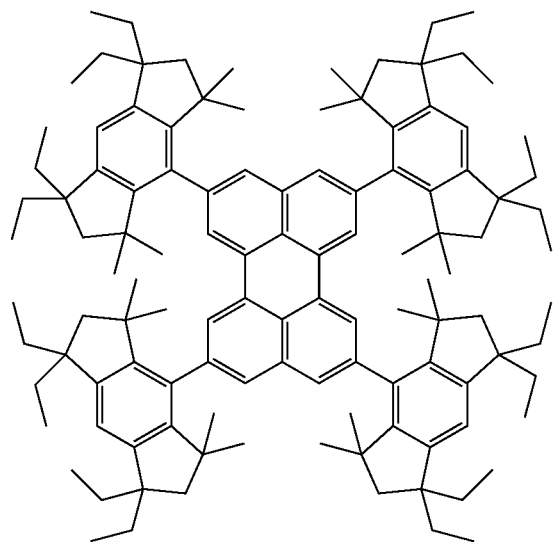
(F-4)

Exemplified compound 11
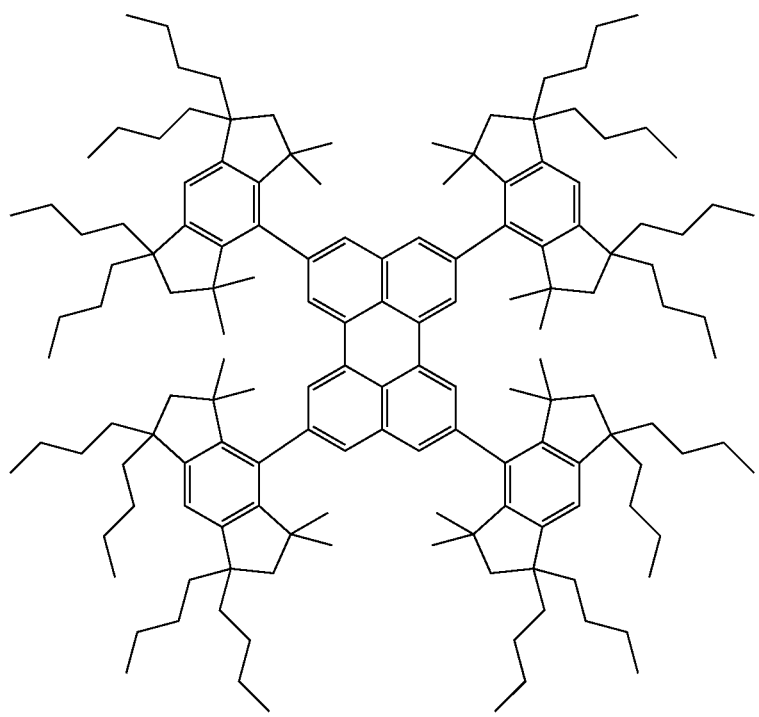
[Formula 8]
Exemplified compound 12
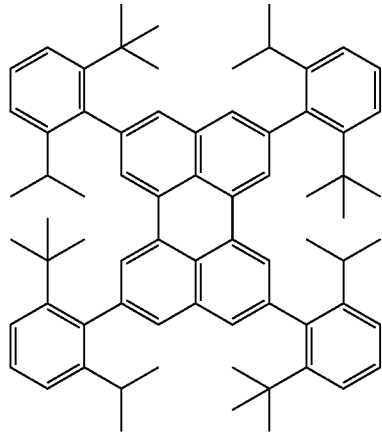
Exemplified compound 13
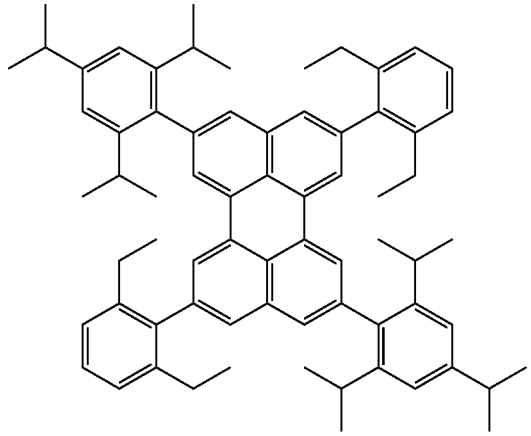

-continued
Exemplified compound 14
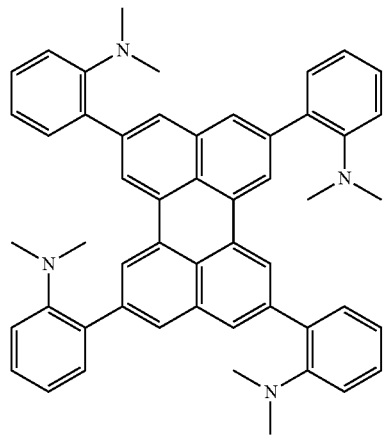
Exemplified compound 15
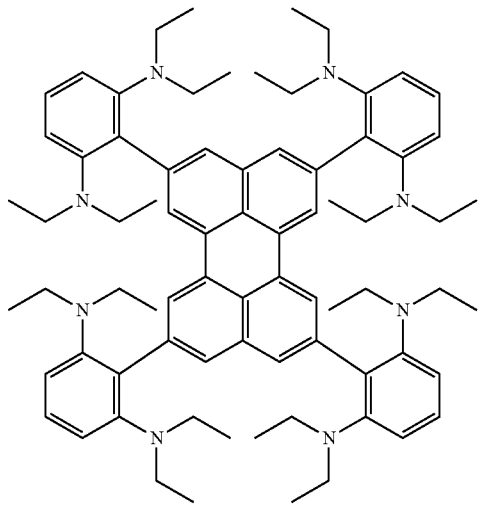
Exemplified compound 16
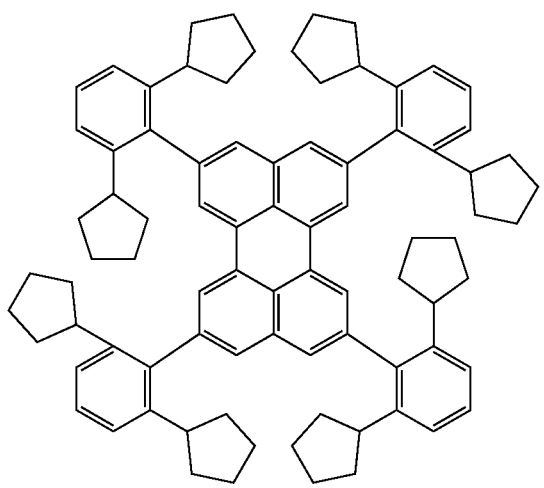
Exemplified compound 17
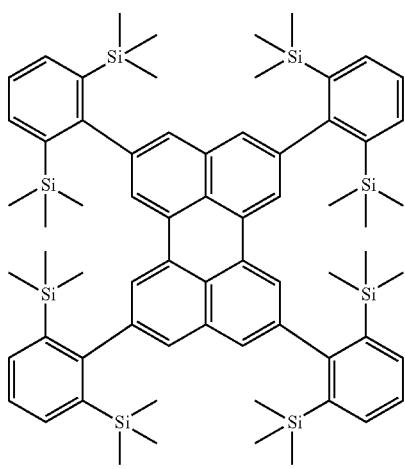

[Formula 9]
-continued
Exemplified compound 18
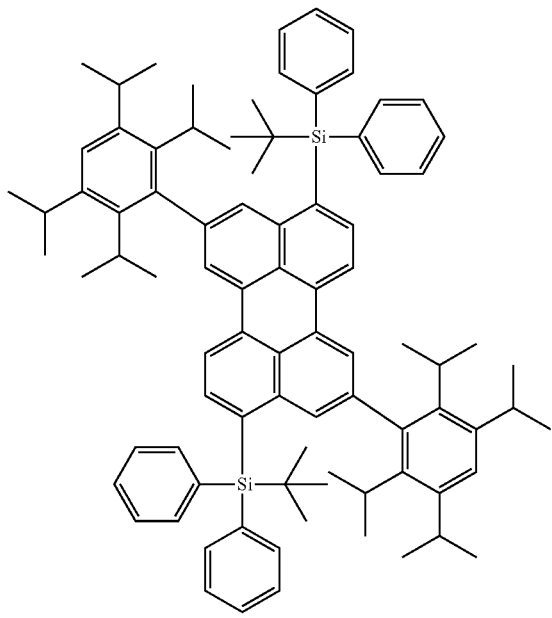
Exemplified compound 19
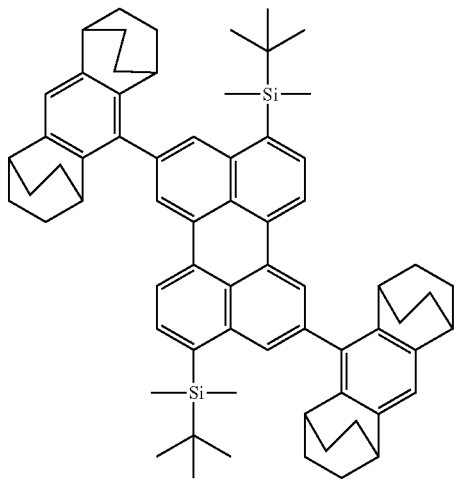
Exemplified compound 20
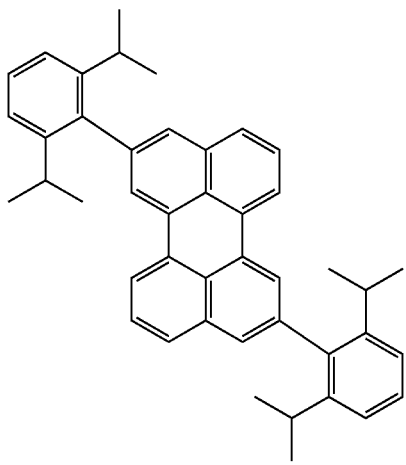
Exemplified compound 21
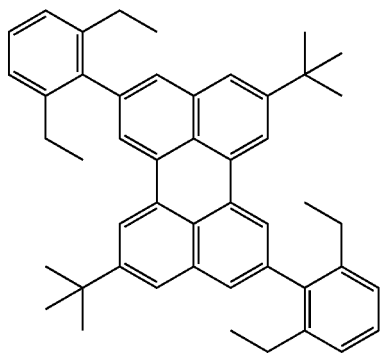
Exemplified compound 22
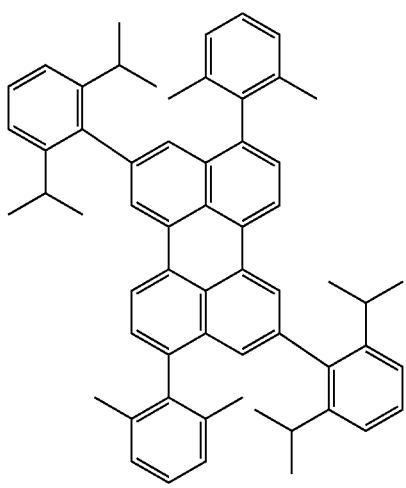
Exemplified compound 23
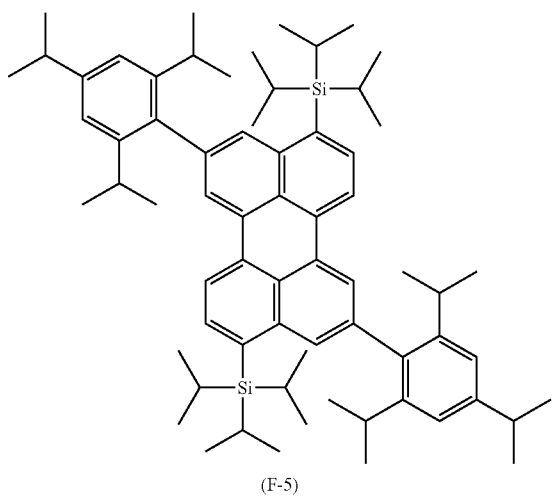
(F-5)

-continued
[Formula 10]
Exemplified compound 24
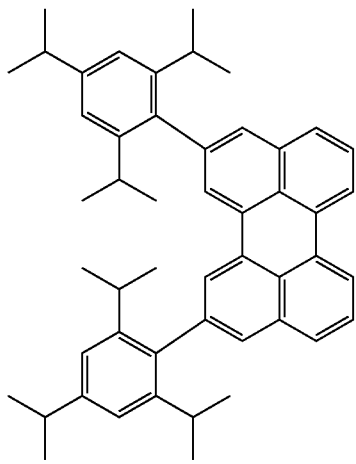
Exemplified compound 25
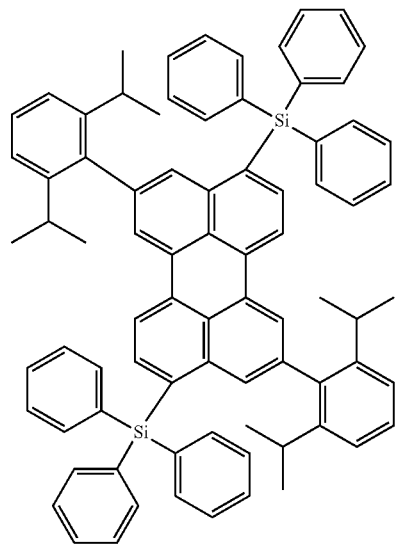
Exemplified compound 26
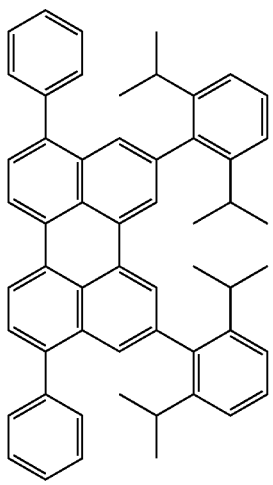
Exemplified compound 27
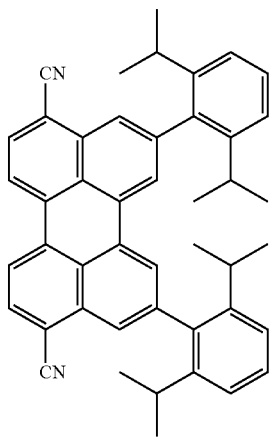
Exemplified compound 28
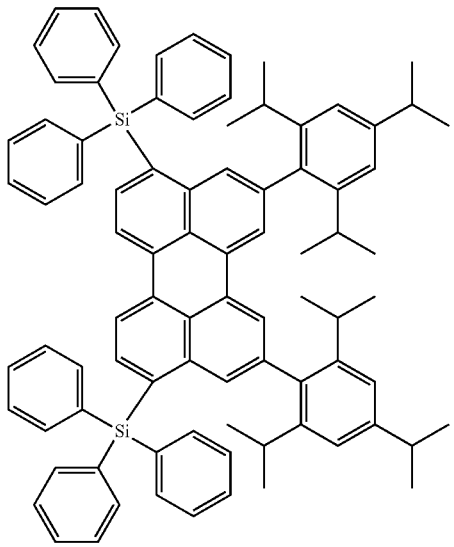
Exemplified compound 29
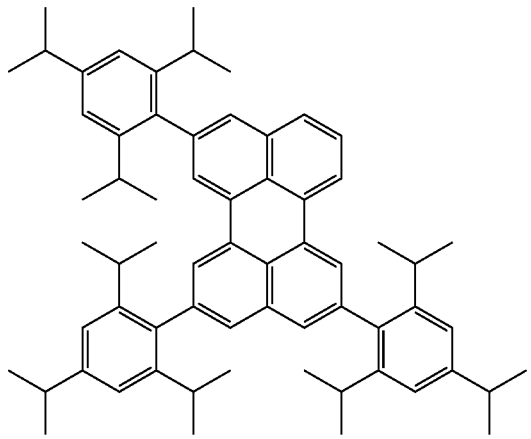

-continued
Exemplified compound 30
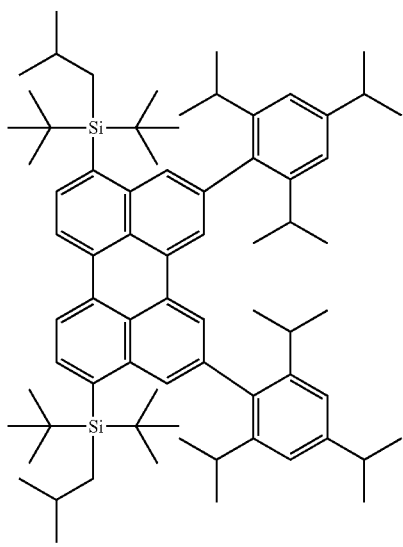
[Formula 11]
Exemplified compound 31
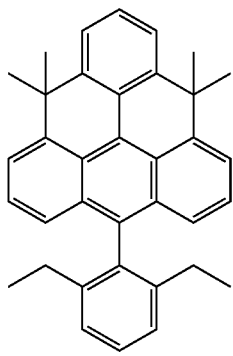
Exemplified compound 32
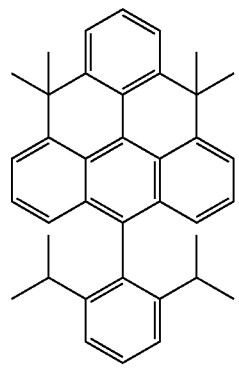
Exemplified compound 33
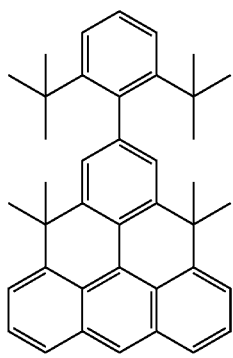
Exemplified compound 34
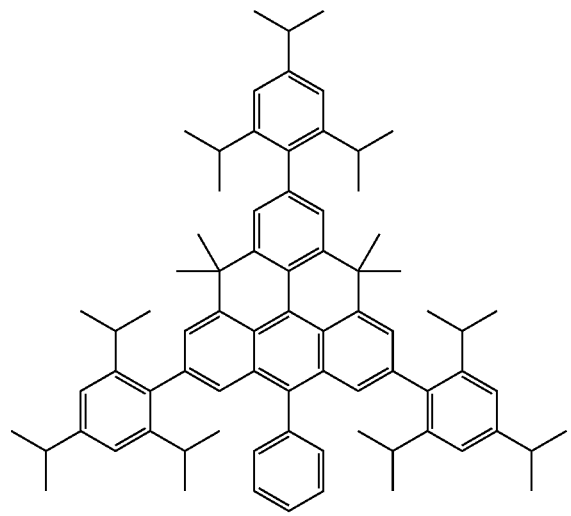
(F-6)

Exemplified compound 35
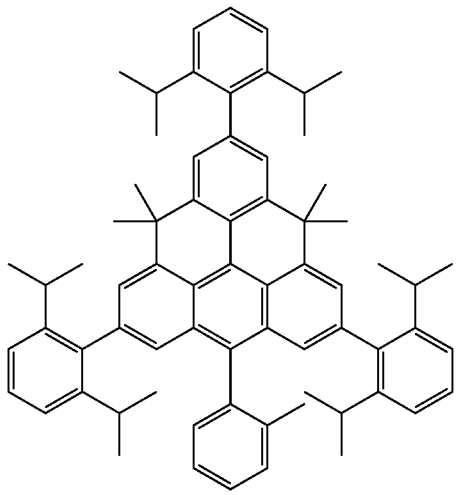
Exemplified compound 36
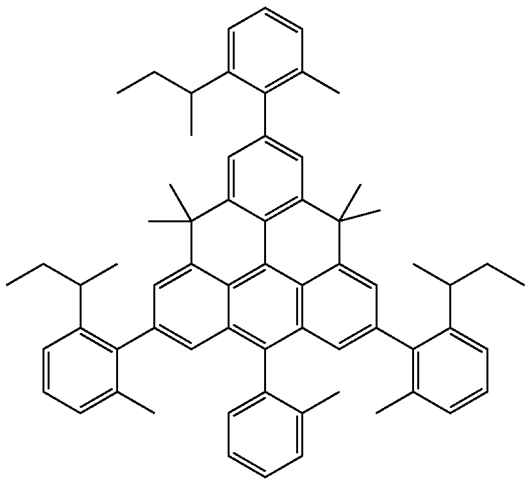
Exemplified compound 37
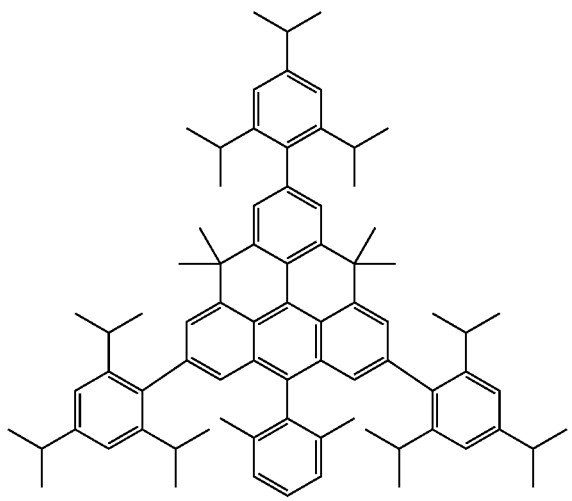
[Formula 12]
Exemplified compound 38
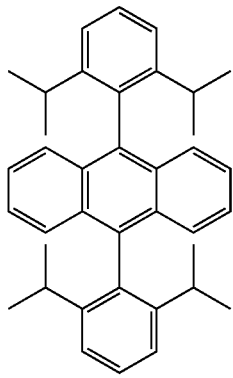
Exemplified compound 39
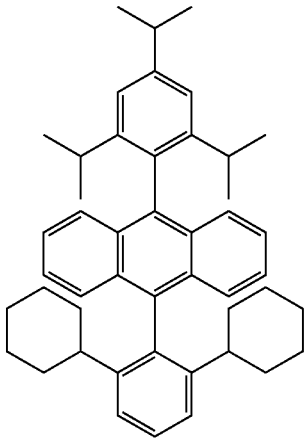

-continued
Exemplified compound 40
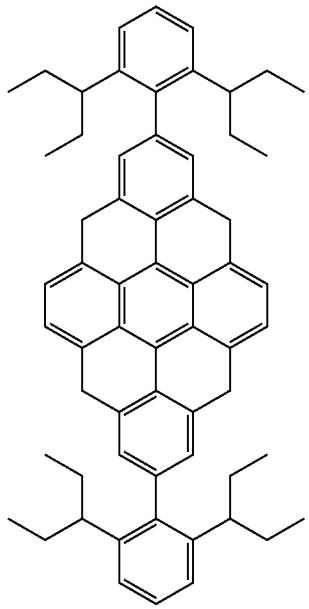
Exemplified compound 41
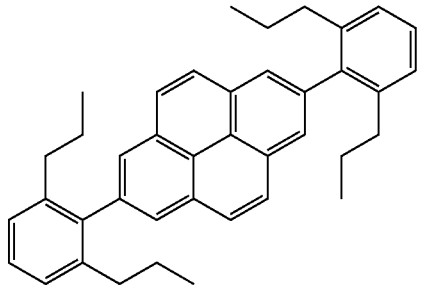
Exemplified compound 42
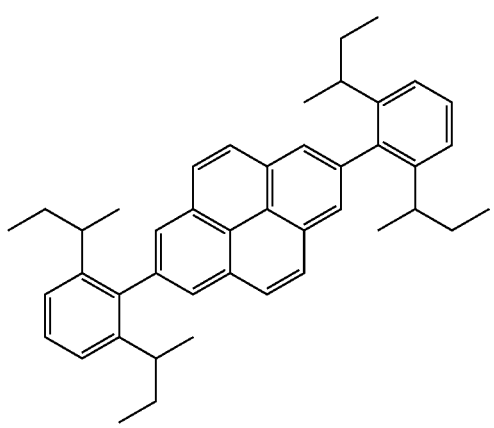
Exemplified compound 43
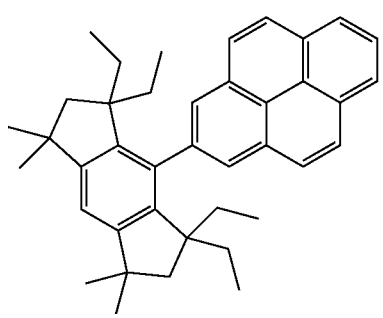
Exemplified compound 44
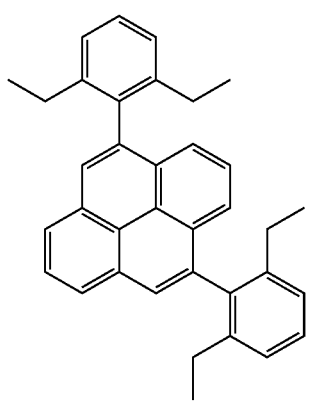

[Formula 13]
Exemplified compound 45
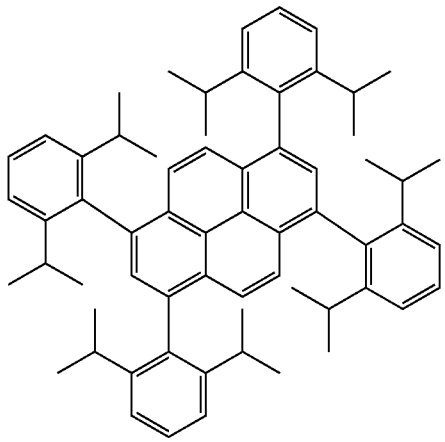
Exemplified compound 46
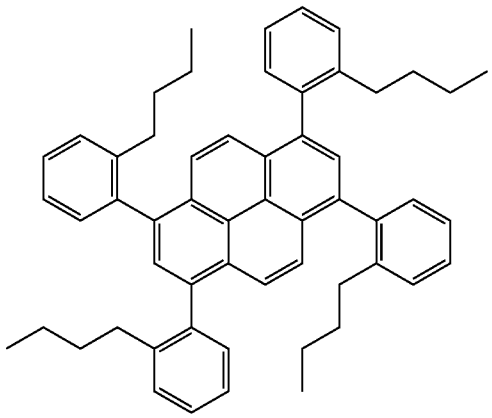
Exemplified compound 47
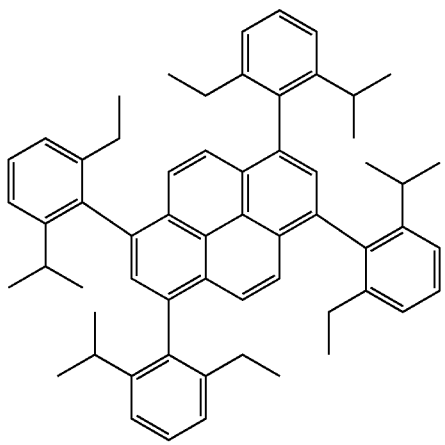
Exemplified compound 48
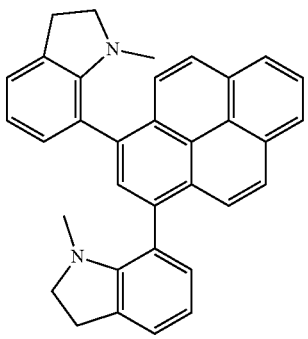
Exemplified compound 49
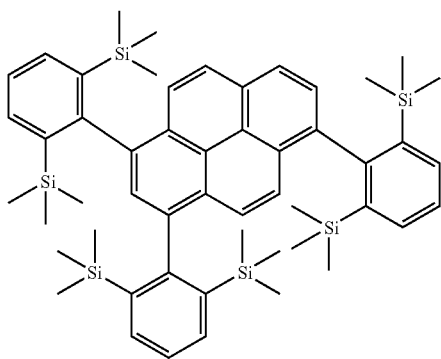
Exemplified compound 50
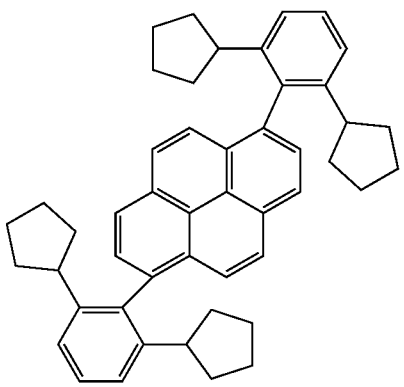

Exemplified compound 51
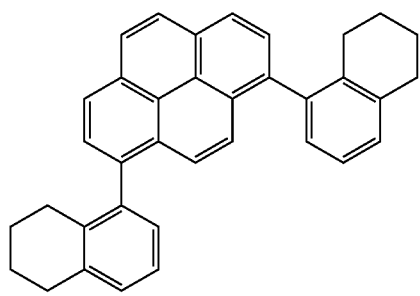
Exemplified compound 52
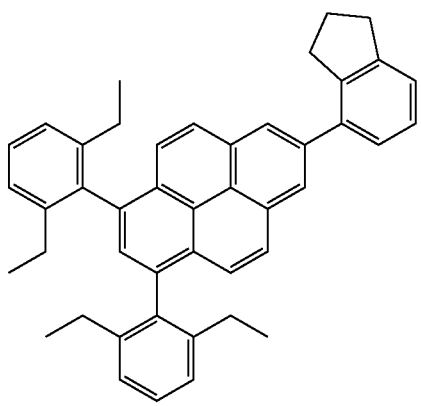
[Formula 14]
Exemplified compound 53
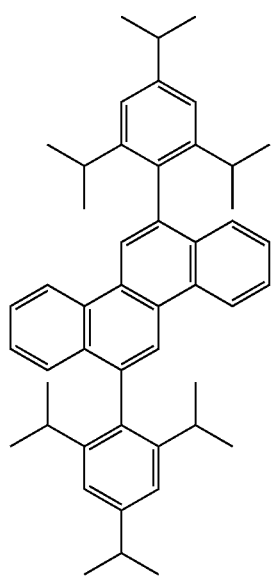
Exemplified compound 54
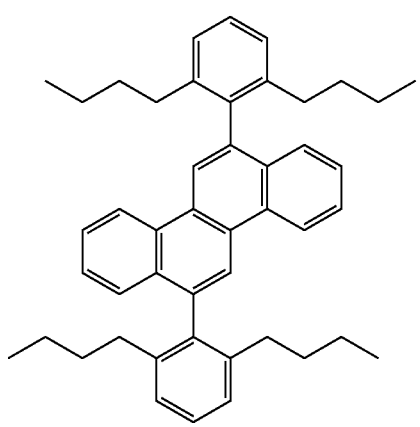
Exemplified compound 55
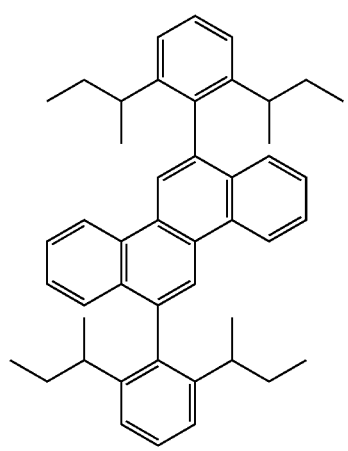
Exemplified compound 56
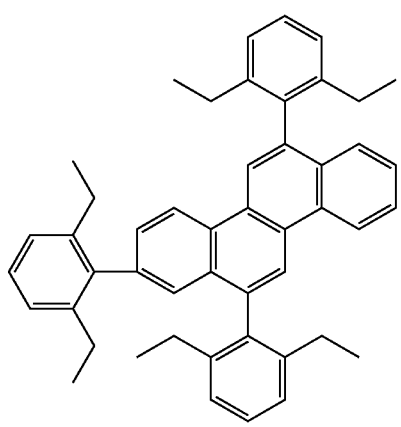

-continued
Exemplified compound 57
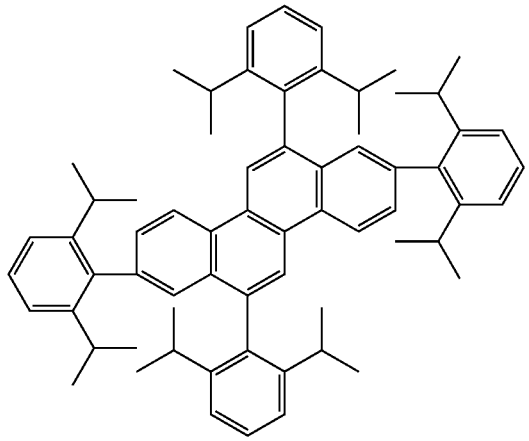
Exemplified compound 58
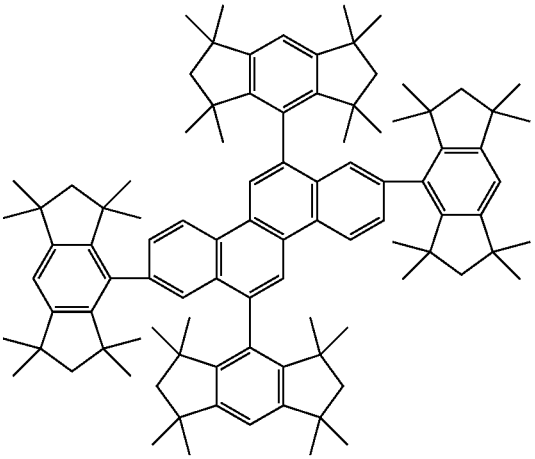
Exemplified compound 59
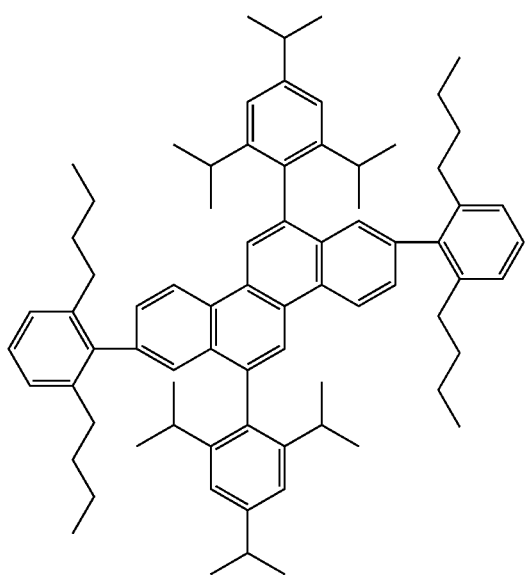
[Formula 15]
Exemplified compound 60
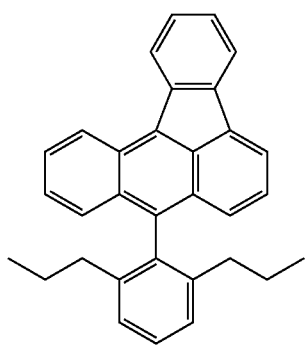
Exemplified compound 61
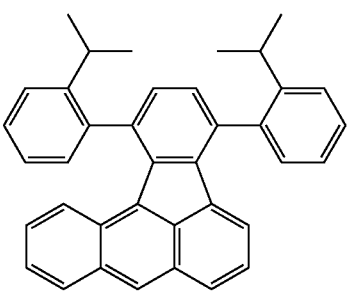

-continued
Exemplified compound 62
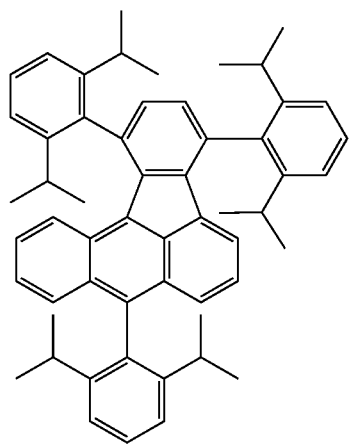
Exemplified compound 63
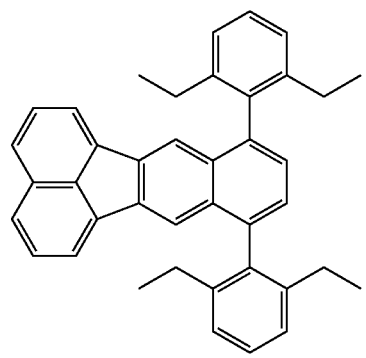
Exemplified compound 64
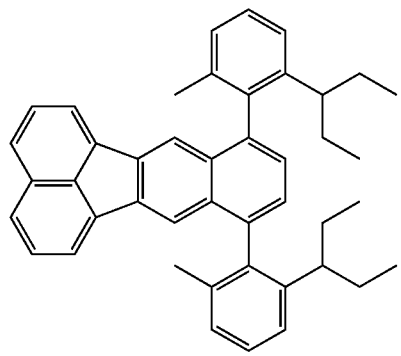
Exemplified compound 65
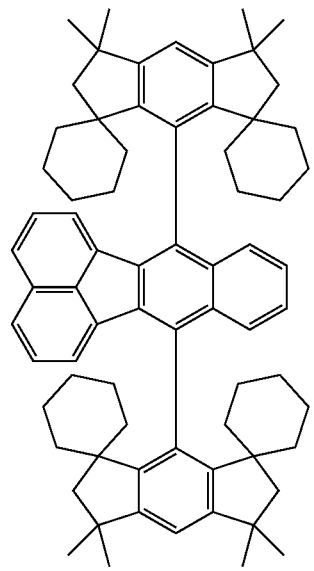
Exemplified compound 66
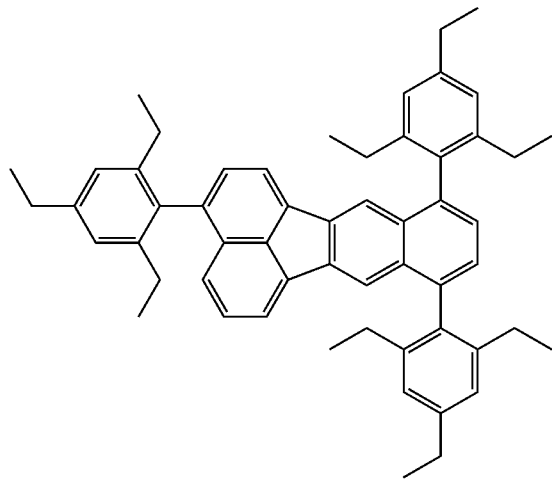
Exemplified compound 67
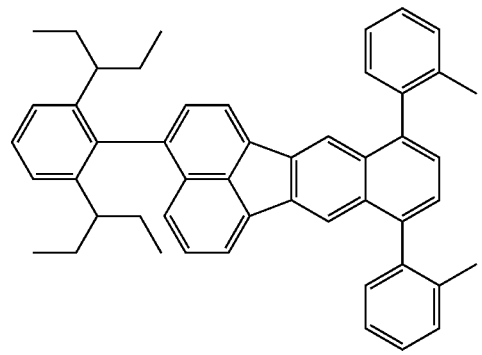

Exemplified compound 68
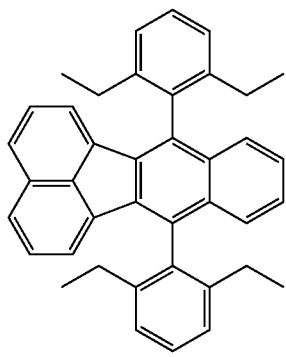
[Formula 16]
Exemplified compound 69
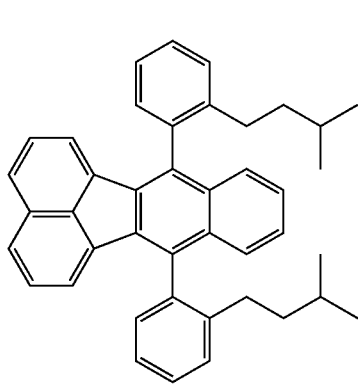
Exemplified compound 70
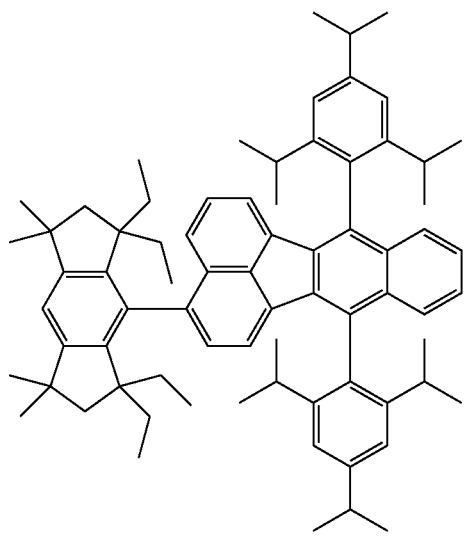
Exemplified compound 71
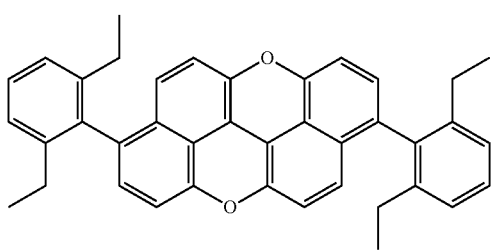
Exemplified compound 72
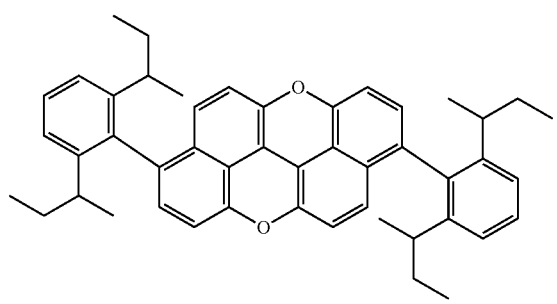
Exemplified compound 73
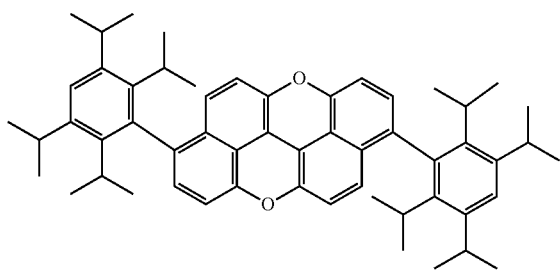
Exemplified compound 74
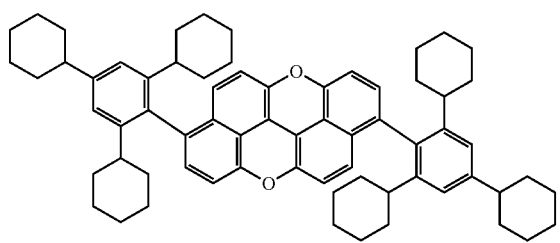

[Formula 17]
Exemplified compound 75
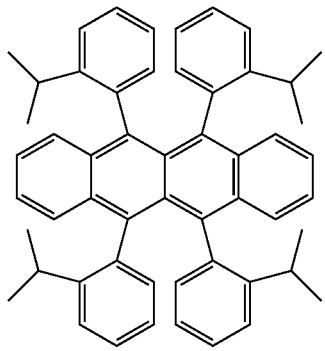
Exemplified compound 76
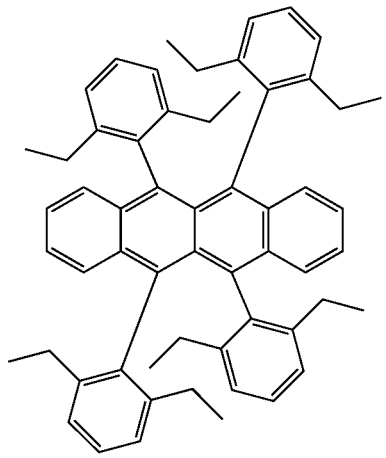
Exemplified compound 77
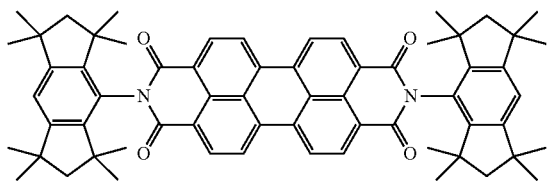
Exemplified compound 78
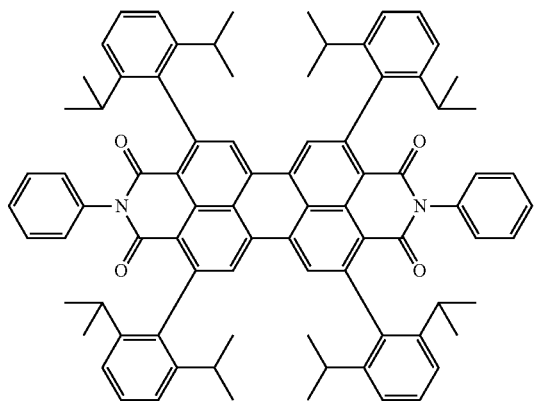
Exemplified compound 79
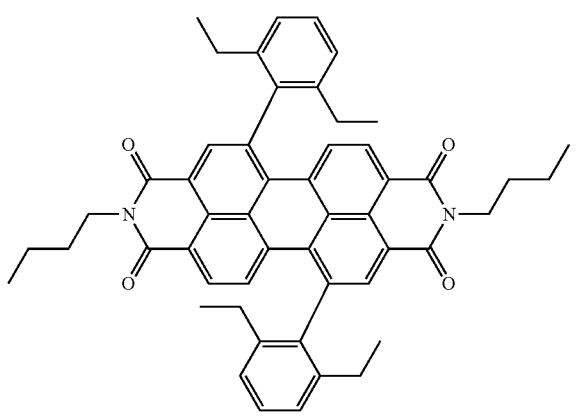

[Formula 18]
Exemplified compound 80
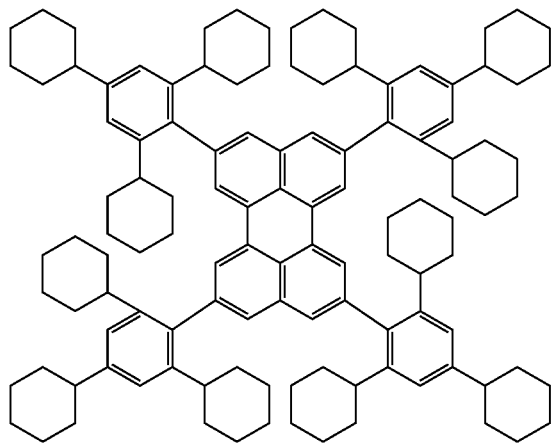
Exemplified compound 81
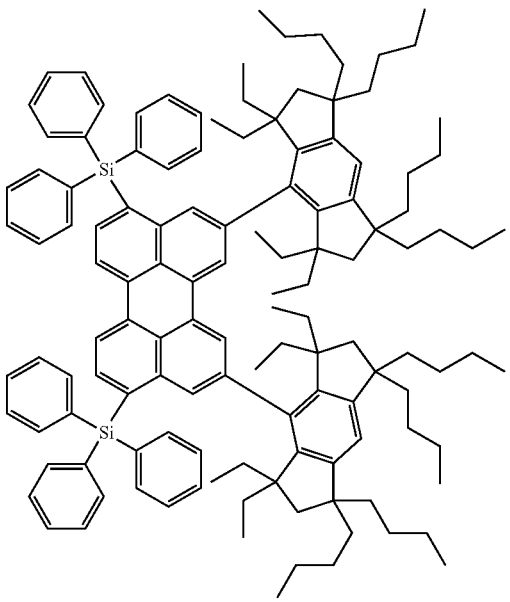
Exemplified compound 82
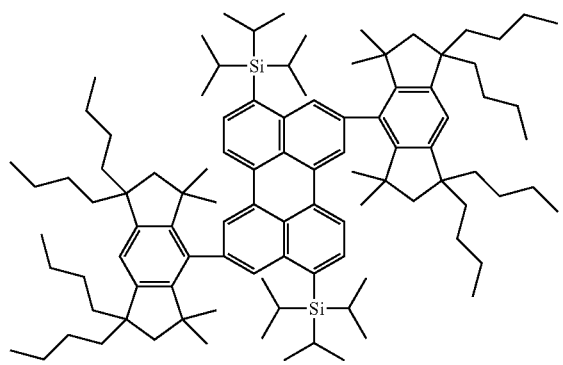
[Formula 19]
Exemplified compound 83
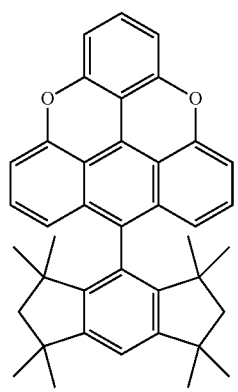
Exemplified compound 84
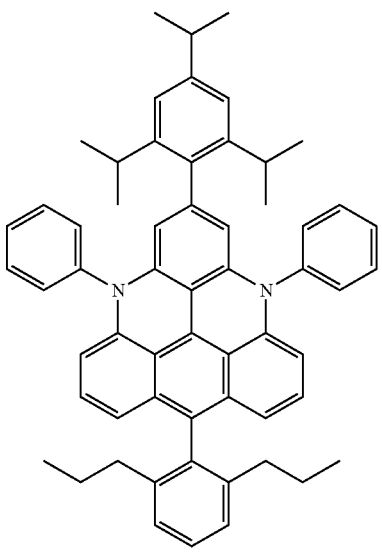

-continued
Exemplified compound 85
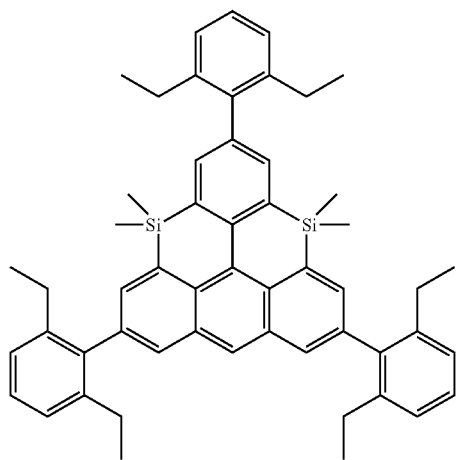
Exemplified compound 86
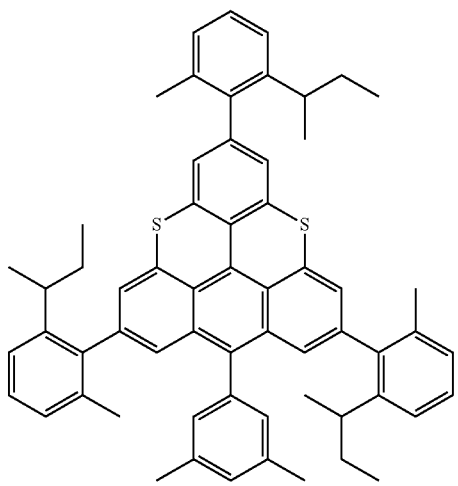
Exemplified compound 87
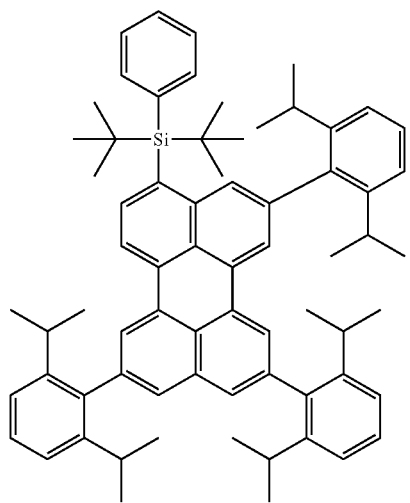

Exemplified compound 88
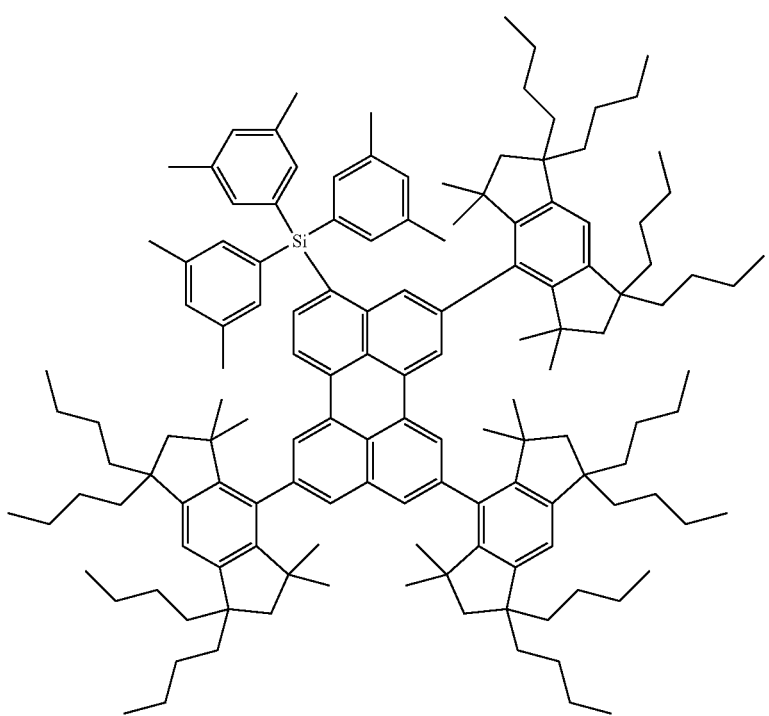
[Formula 20]
Exemplified compound 89
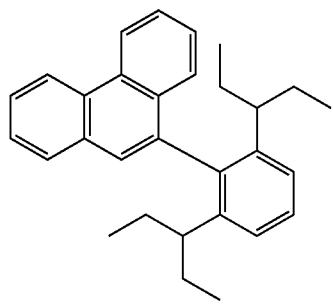
Exemplified compound 90
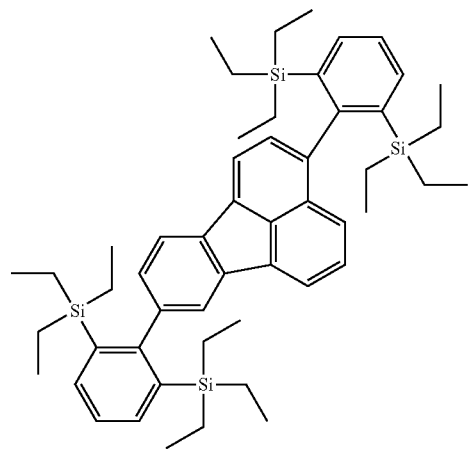
Exemplified compound 91
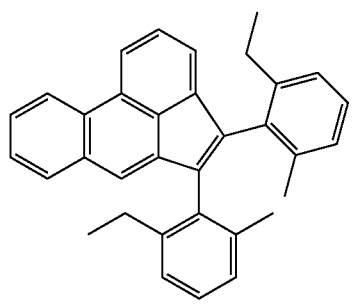
Exemplified compound 92
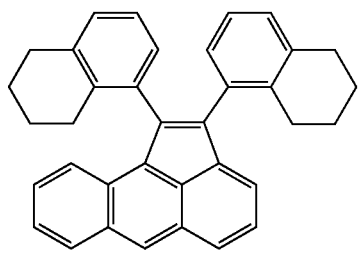

Exemplified compound 93

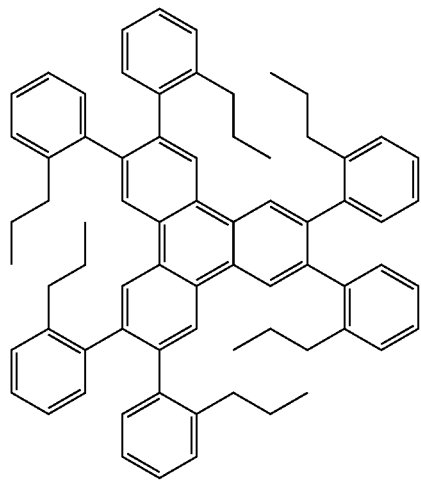

Exemplified compound 94

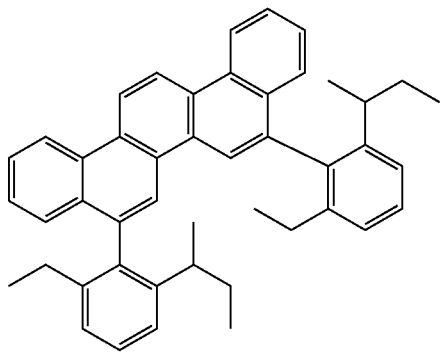

Exemplified compound 95

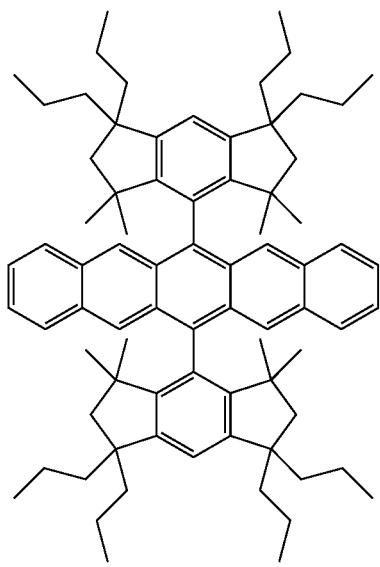

<<Blue Phosphorescent Compounds>>

The blue phosphorescent compound according to the present invention contains a heavy atom and can emit triplet excitation-derived light and is not particularly limited as long as the triplet excitation-derived light emission is observed. Preferred are blue phosphorescent compounds represented by the following general formula (1). This makes it possible not only to produce a blue phosphorescent compound having more stable excitons but also to increase the integral value of overlap between the emission spectrum of the blue phosphorescent compound and the absorption spectrum of the blue fluorescent compound. As a result, excitons can be effectively used for light emission and a luminescent film can be produced while the element lifetime can be prolonged further.

[Formula 21]

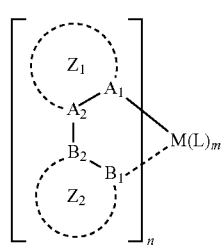

General formula (1)

In the general formula (1), M represents Ir or Pt; $A_1$, $A_2$, $B_1$, and $B_2$ each independently represent a carbon atom or a nitrogen atom; ring $Z_1$ represents a 6-membered aromatic hydroxycarbon ring, a 5-membered or 6-membered aromatic heterocyclic ring, or an aromatic condensed ring containing at least one of the rings, formed together with $\lambda_1$ and $\lambda_2$; ring $Z_2$ represents a 5-membered or 6-membered aromatic heterocyclic ring or an aromatic condensed ring containing at least one of the rings, formed together with $B_1$ and $B_2$, a carbon atom included in the ring $Z_1$ or the ring $Z_2$ may be a carbene carbon atom; one of the bond between $A_1$ and M and the bond between $B_1$ and M represents a coordinate bond and the other represents a covalent bond: the ring $Z_1$ and the ring $Z_2$, each independently, may have a substituent; the substituents of the ring $Z_1$ and the ring $Z_2$ may be bonded to form a condensed ring structure or a ligand represented by the ring $Z_1$ and a ligand represented by the ring $Z_2$ may be linked; L represents a monoanionic bidentate ligand coordinated to M and may have a substituent; m represents an integer of 0 to 2; n represents an integer of 1 to 3; if M is Ir, m+n is 3 and M is Pt, m+n is 2; and if m or n is 2 or more, ligands represented by each ring $Z_1$ and each ring $Z_2$ or each L may be the same or different and the ligands represented by each ring $Z_1$ and each ring $Z_2$ may be linked to each L.

Note that the ring $Z_2$ is preferably a 5-membered aromatic heterocyclic ring and at least one of $B_1$ and $B_2$ is preferably a nitrogen atom. The general formula (1) is preferably represented by the following general formula (DP-1).

[Formula 22]

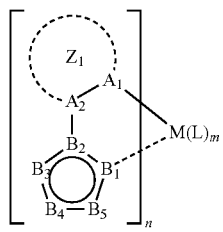

General formula (DP-1)

M, $A_1$, $A_2$, $B_1$, $B_2$, ring $Z_1$, L, in, and n of the above general formula (DP-1) are the same meaning as M, $A_1$, $A_2$, $B_1$, $B_2$, ring $Z_1$, L, m, and n of the general formula (1).

$B_3$ to $B_5$ are an aromatic heterocyclic ring-forming atom group and, each independently, represent a carbon atom, a nitrogen atom, an oxygen atom, or a sulfur atom optionally having a substituent. Examples of the substituent for $B_3$ to $B_5$ include the groups the same as those substituents for the rings $Z_1$ and $Z_2$ in the above-described general formula (1).

In the general formula (DP-1), the aromatic heterocyclic ring formed by $B_1$ to $B_5$ is preferably represented by any of the following general formulae (DP-1a), (DP-1b), and (DP-1c).

[Formula 23]

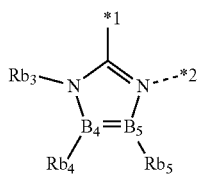

General formula (DP-1a)

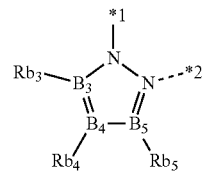

General formula (DP-1b)

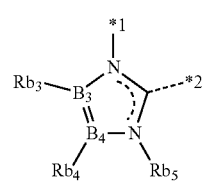

General formula (DP-1c)

In the general formulae (DP-1a), (DP-1b), and (DP-1c), *1 denotes a bonding site with $A_2$ in the general formula (DP-1) and *2 denotes a bonding site with M.

$Rb_3$ to $Rb_5$ each represent a hydrogen atom or a substituent; and examples of the substituents represented by $Rb_3$ to $Rb_5$ include the groups the same as those substituents attached to the rings $Z_1$ and $Z_2$ in the above-described general formula (1).

In the general formula (DP-1a), $B_4$ and $B_5$ are each a carbon atom or a nitrogen atom and at least one of them is more preferably a carbon atom.

In the general formula (DP-1b), $B_3$ to $B_5$ are each a carbon atom or a nitrogen atom and at least one of them is more preferably a carbon atom.

In the general formula (DP-1c), B, and $B_4$ are each a carbon atom or a nitrogen atom and at least one of them is more preferably a carbon atom; it is more preferable that substituents represented by $Rb_3$ and $Rb_4$ are further bonded together to form a condensed ring structure; it is preferable that the resulting newly formed condensed ring structure is an aromatic ring; and preferred is any of a benzoimidazole ring, imidazopyridine ring, imidazopyrazin ring, or a purine ring. $Rb_5$ is preferably an alkyl group or an aryl group. More preferred is a phenyl group.

The following shows specific compound examples of the general formula (1), but those available in the present application are not limited to them.

[Formula 24]

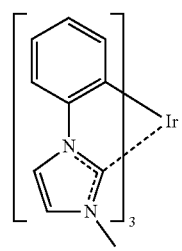

C-1

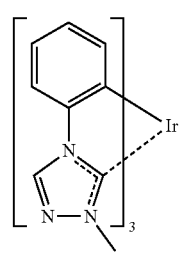

C-2

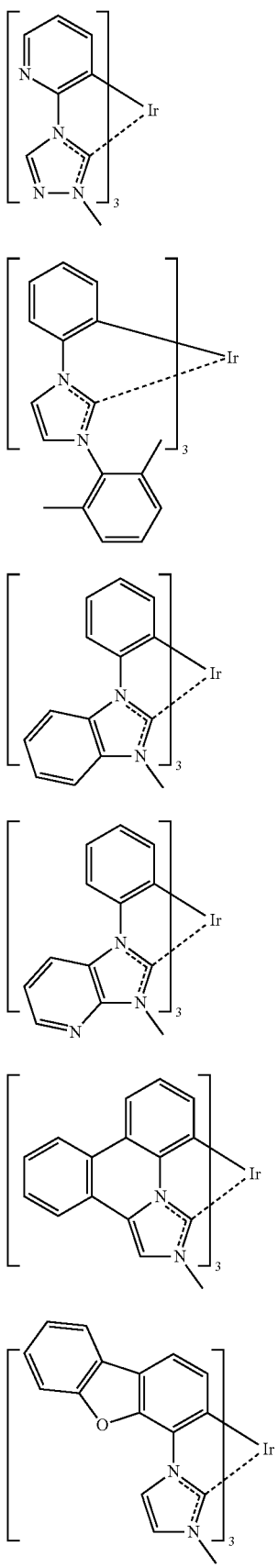
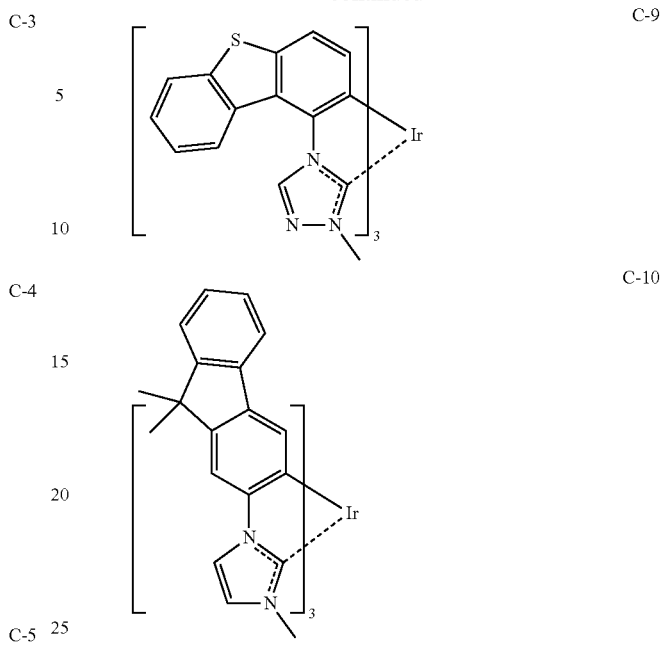

Meanwhile, other blue phosphorescent compounds usable in the present invention may be appropriately selected from known compounds used for an emitter layer of the organic EL element for use.

Specific examples of the known blue phosphorescent compounds usable in the present invention include, but are not limited to, the compounds listed in the following literatures:

Nature 395, 151 (1998), Appl. Phys. Lett. 78, 1622 (2001), Adv. Mater. 19, 739 (2007), Chem. Mater. 17, 3532 (2005), Adv. Mater. 17, 1059 (2005), WO 2009/100991, WO 2008/101842, WO 2003/040257, US Patent Application Publication No. 2006/835469, US Patent Application Publication No. 2006/0202194, US Patent Application Publication No. 2007/0087321, US Patent Application Publication No. 2005/0244673, Inorg. Chem. 40, 1704 (2001), Chem. Mater. 16, 2480 (2004), Adv. Mater. 16, 2003 (2004), Angew. Chem. Int. Ed. 2006, 45, 7800, Appl. Phys. Lett. 86, 153505 (2005), Chem. Lett. 34, 592 (2005), Chem. Commun. 2906 (2005), Inorg. Chem. 42, 1248 (2003), WO 2009/050290, WO 2002/015645, WO 2009/000673, US Patent Application Publication No. 2002/0034656, U.S. Pat. No. 7,332,232, US Patent Application Publication No. 2009/0108737, US Patent Application Publication No. 2009/0039776, U.S. Pat. Nos. 6,921,915, 6,687,266, US Patent Application Publication No. 2007/0190359, US Patent Application Publication No. 2006/0008670, US Patent Application Publication No. 2009/0165846, US Patent Application Publication No. 2008/0015355, U.S. Pat. Nos. 7,250,226, 7,396,598, US Patent Application Publication No. 2006/0263635, US Patent Application Publication No. 2003/0138657, US Patent Application Publication No. 2003/0152802, U.S. Pat. No. 7,090,928, Angew. Chem. Int. Ed. 47, 1 (2008), Chem. Mater. 18, 5119 (2006), Inorg. Chem. 46, 4308 (2007), Organometallics 23, 3745 (2004), Appl. Phys. Lett. 74, 1361 (1999), WO 2002/002714, WO 2006/009024, WO 2006/056418, WO 2005/019373, WO 2005/123873, WO 2005/123873, WO 2007/004380, WO 2006/082742, US Patent Application Publication No. 2006/0251923, US Patent Application Publication No. 2005/

0260441, U.S. Pat. Nos. 7,393,599, 7,534,505, 7,445,855, US Patent Application Publication No. 2007/0190359, US Patent Application Publication No. 2008/0297033, U.S. Pat. No. 7,338,722, US Patent Application Publication No. 2002/0134984, U.S. Pat. No. 7,279,704, US Patent Application Publication No. 2006/098120, US Patent Application Publication No. 2006/103874, WO 2005/076380, WO 2010/032663, WO 2008/140115, WO 2007/052431, WO 2011/134013, WO 2011/157339, WO 2010/086089, WO 2009/113646, WO 2012/020327, WO 2011/051404, WO 2011/004639, WO 2011/073149, US Patent Application Publication No. 2012/228583, US Patent Application Publication No. 2012/212126, Japanese Patent Laid-Open No. 2012-069737, Japanese Patent Laid-Open No. 2012-195554, Japanese Patent Laid-Open No. 2009-114086, Japanese Patent Laid-Open No. 2003-81988, Japanese Patent Laid-Open No. 2002-302671, and Japanese Patent Laid-Open No. 2002-363552.

In addition, when a carbon atom included in the ring $Z_1$ and the ring $Z_2$ is a carbene carbon atom (specifically the case of a carbene complex), preferably usable are the carbene complexes listed in, for example, WO 2005/019373, WO 2006/056418, WO 2005/113704, WO 2007/115970, WO 2007/115981, and WO 2008/000727.

Specifically, the following compounds are usable, but examples are not limited to them.

[Formula 25]

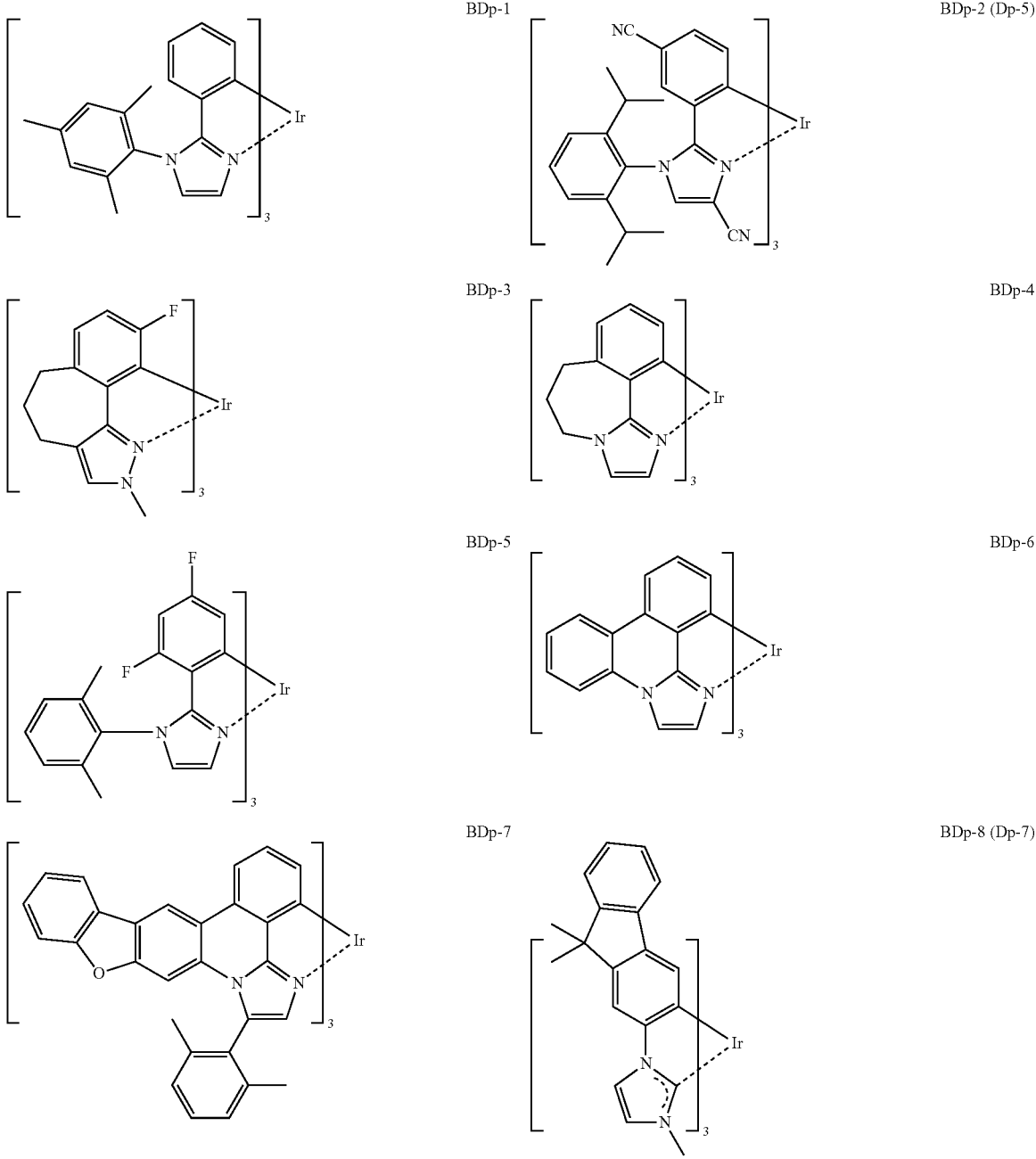

-continued
BDp-9 (Dp-6)
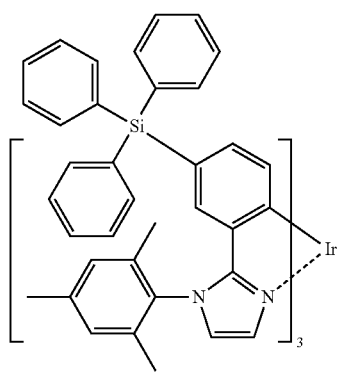
BDp-10
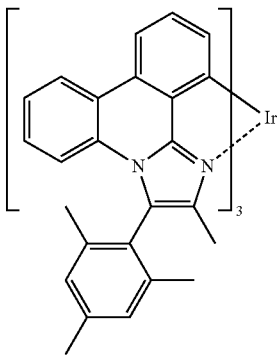
[Formula 26]
BDp-11
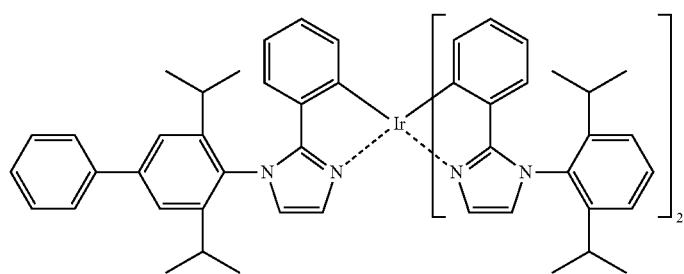
BDp-12
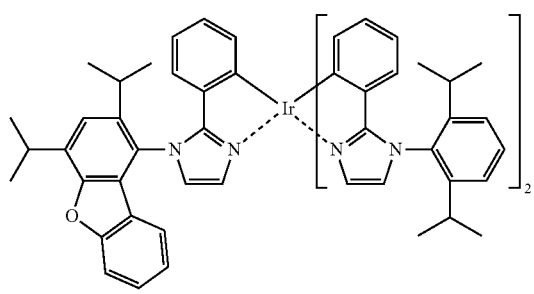
BDp-13
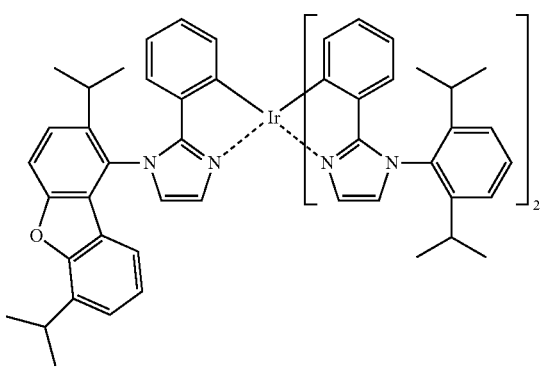
BDp-14
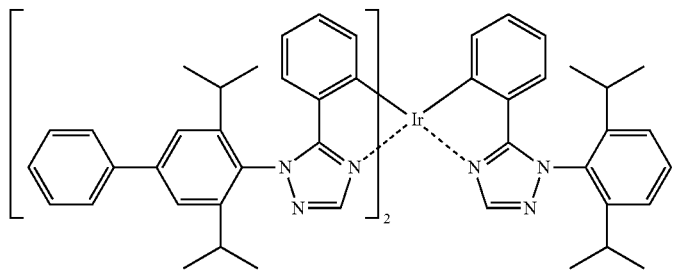
BDp-15
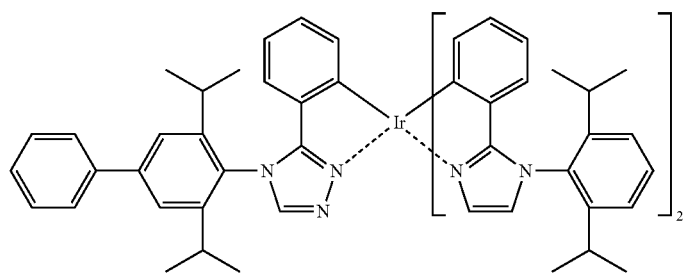

-continued
[Formula 27]
BDp-16
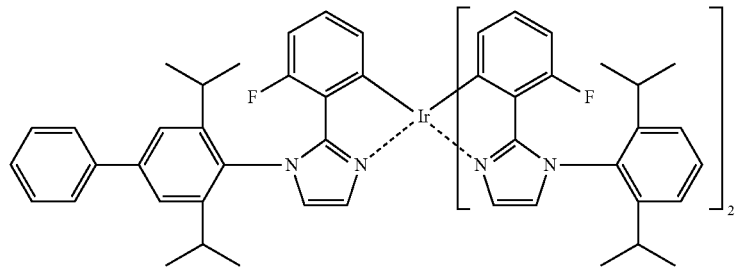
BDp-17
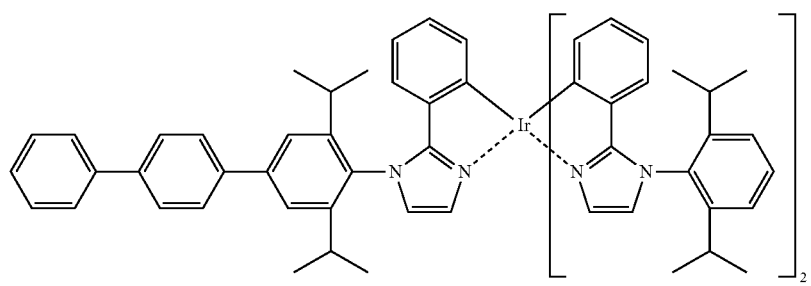
BDp-18 BDp-19
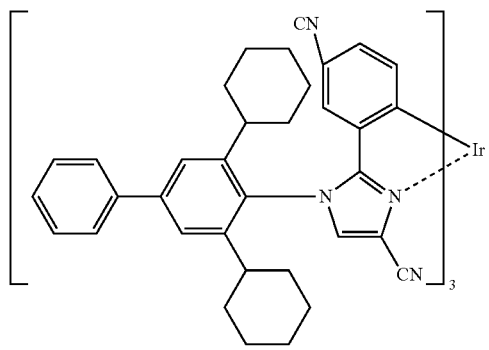
BDp-20 BDp-21
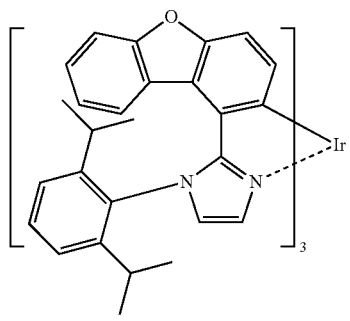

-continued
BDp-22
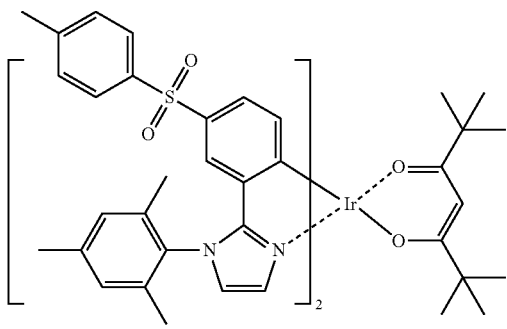
BDp-23(Dp-4)
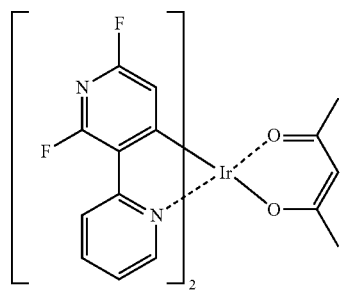
[Formula 28]
BDp-24
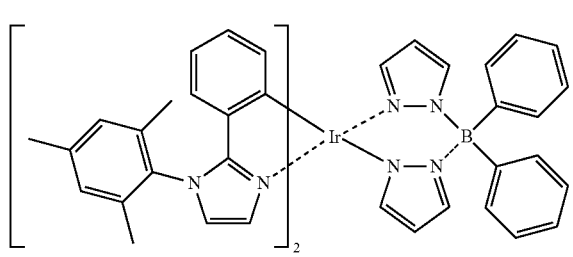
BDp-25
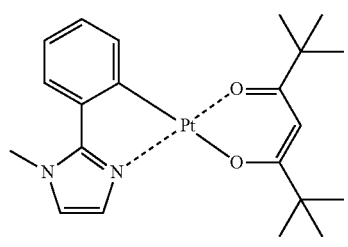
BDp-26
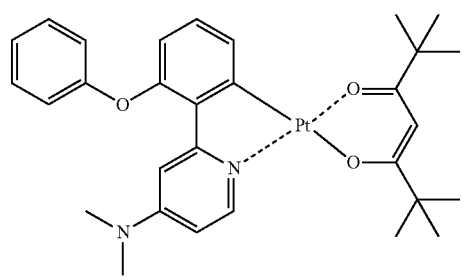
BDp-27
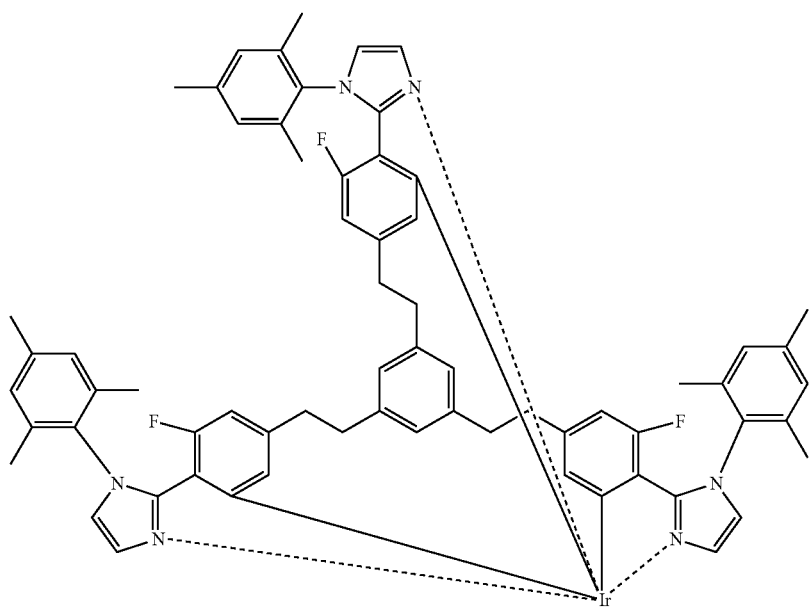

-continued

BDp-28 (Dp-2)

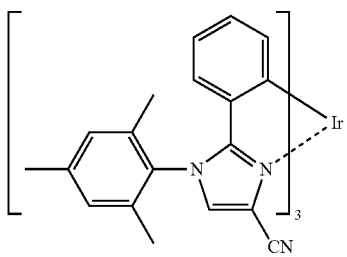

BDp-29 (Dp-3)

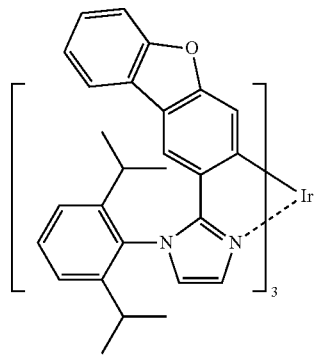

<<Host Compounds According to the Present Invention>>

A luminescent film of the present invention contains, in addition to a blue fluorescent compound and a blue phosphorescent compound, a host compound. The following describes host compounds according to the present invention.

The host compound according to the present invention is a compound that primarily participates in charge injection and transport in an emitter layer, and the light emission of the compound itself in the organic EL element is substantially unobserved.

The host compound is a compound preferably having a phosphorescence quantum efficiency of phosphorescent emission at room temperature (25° C.) of less than 0.1 and a compound more preferably having a phosphorescence quantum efficiency of less than 0.01. In addition, the excited state energy of the host compound is preferably higher than the excited state energy of the phosphorescent compound included in the same layer.

As the host compound, any known host compounds may be used singly or in combination of two or more. Use of the plurality of the kinds of host compounds enables charge transfer to be adjusted, thereby making the organic EL element highly efficient.

Examples of the host compounds according to the present invention include, but are not limited to, conventional compounds used for organic EL elements. Either low-molecular-weight compounds or polymer compounds having repeating units may be allowed. Also, compounds having a reactive group such as a vinyl group or an epoxy group are acceptable.

As the known host compounds, those having a high glass-transition temperature (Tg) are preferable from the viewpoints of possessing hole transport capability or electron transport capability and preventing the wavelength of emitted light from becoming longer and further stabilizing the organic EL element when heat is generated during high-temperature operation and/or during element operation. The Tg is preferably 90° C. or higher and more preferably 120° C. or higher.

Here, the glass-transition temperature (Tg) refers to a value calculated, using DSC (Differential Scanning Calorimetry), in accordance with the protocol of JIS-K-7121.

The host compound according to the present invention is preferably a compound having a structure represented by the following general formulae (HA) or (HB).

[Formula 29]

General formula (HA)

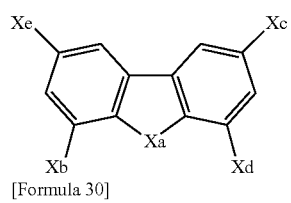

[Formula 30]

General formula (HB)

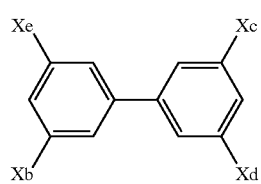

In the general formulae (HA) and (HB), Xa represents O or S. Xb, Xc, Xd, and Xe each independently represent a hydrogen atom, a substituent, or a group having a structure represented by the following general formula (HC); at least one of Xb, Xc, Xd, and Xe represents a group having a structure represented by the following general formula (HC); and in at least one of the groups having a structure represented by the following general formula (HC), Ar represents a carbazolyl group.

Ar-(L')$_n$-*.    General formula (HC):

In the general formula (HC), L' represents an aromatic hydrocarbon ring- or aromatic heterocyclic ring-derived divalent linker group; n represents an integer of 0 to 3; when n is 2 or more, a plurality of L' may be the same or different; * denotes a bonding site to the general formula (HA) or (HB); and Ar represents a group having a structure represented by the following general formula (HD).

[Formula 31]

General formula (HD)

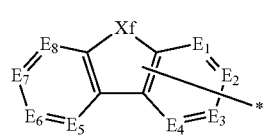

In the general formula (HD), Xf represents N(R'), O, or S; $E_1$ to $E_8$ each represents C(R") or N; R' and R" each represent a hydrogen atom, a substituent, or a bonding site to L' in the general formula (HC); and * denotes a bonding site to L' in the general formula (HC).

In the compound having a structure represented by the above general formula (HA), at least two of Xb, Xc, Xd, and Xe are preferably represented by the general formula (HC); Xc is more preferably represented by the general formula (HC); and Ar in the above general formula (HC) represents more preferably a carbazolyl group optionally having a substituent.

The substituents represented by Xb, Xc, Xd, and Xe in the general formulae (HA) and (HB) and the substituents represented by R' and R" in the general formula (HD) include the same substituents as those which the ring Z1 and ring Z2 may have in the above general formula (DP).

Examples of the aromatic hydrocarbon ring represented by L' in the general formula (HC) include a benzene ring, a p-chlorobenzene ring, a mesitylene ring, a toluene ring, a xylene ring, a naphthalene ring, an anthracene ring, an azulene ring, an acenaphthene ring, a fluorene ring, a phenanthrene ring, an indene ring, a pyrene ring, and a biphenyl ring.

Examples of the aromatic heterocyclic ring represented by L' in the general formula (HC) include a furan ring, a thiophene ring, a pyridine ring, a pyridazin ring, a pyrimidine ring, a pyrazin ring, a triazole ring, an imidazole ring, a pyrazole ring, a thiazole ring, a quinazoline ring, a carbazole ring, a carboline ring, a diazacarbazole ring (indicating a carboline ring in which any one of carbon atoms is replaced by a nitrogen atom), and a phthalazine ring.

Specific examples of the host compounds according to the present invention include, but are not particularly limited to, compounds having a structure represented by the above general formulae (HA) or (HB) as well as the following compounds applicable to the present invention.

[Formula 32]

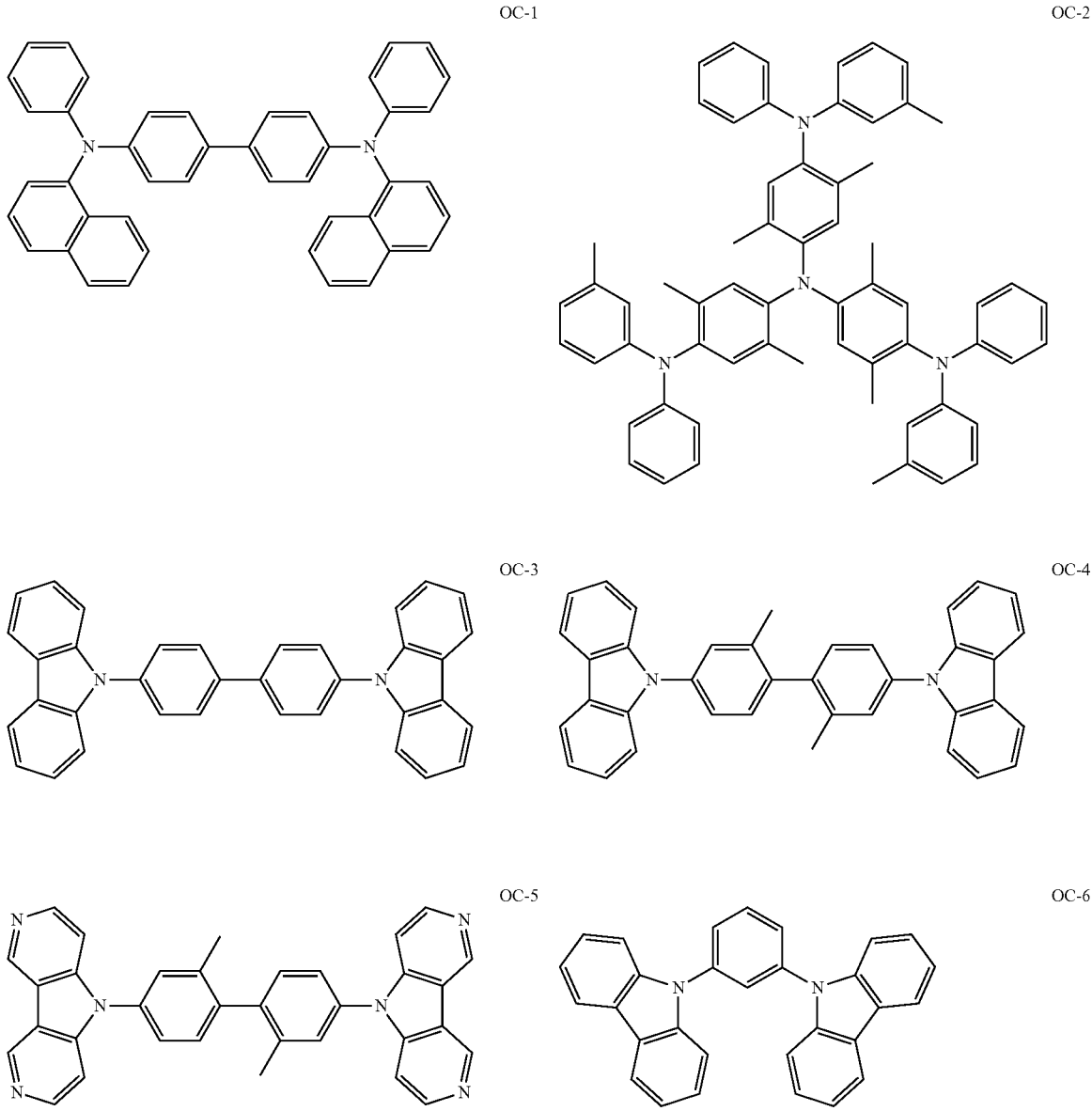

-continued
OC-7
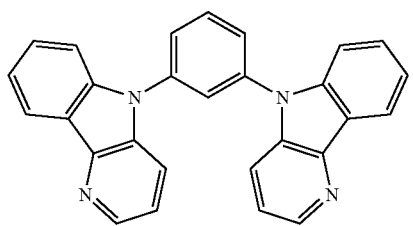
OC-8
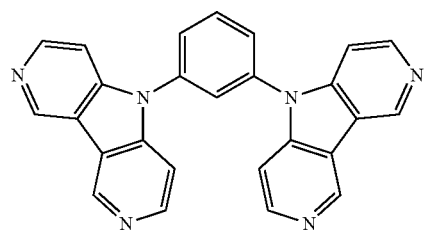
OC-9
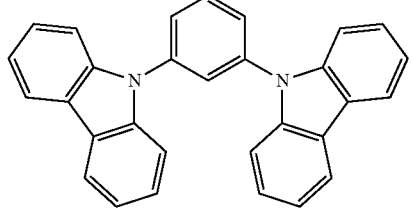
OC-10
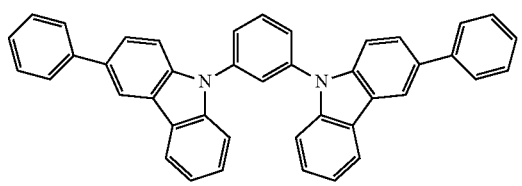
[Formula 33]
OC-11
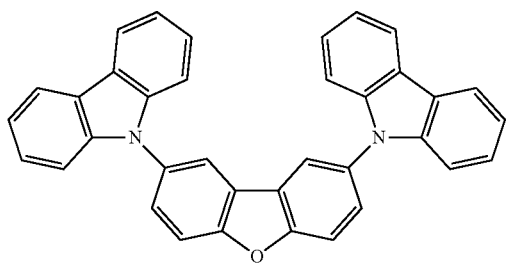
OC-12
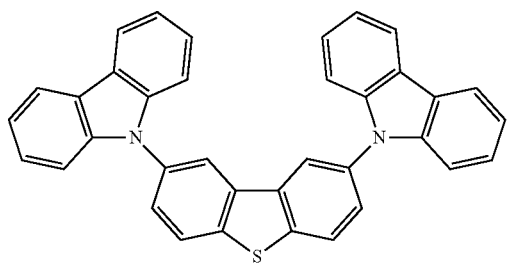
OC-13
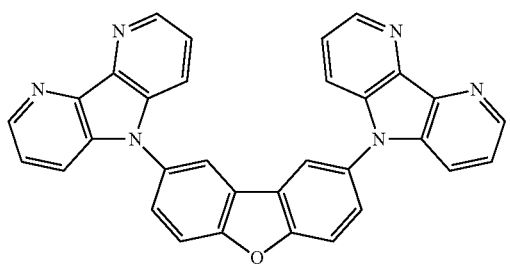

OC-14
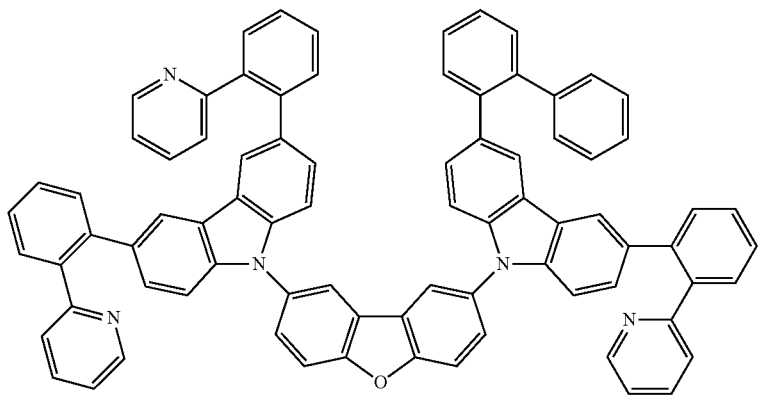
OC-15
OC-16
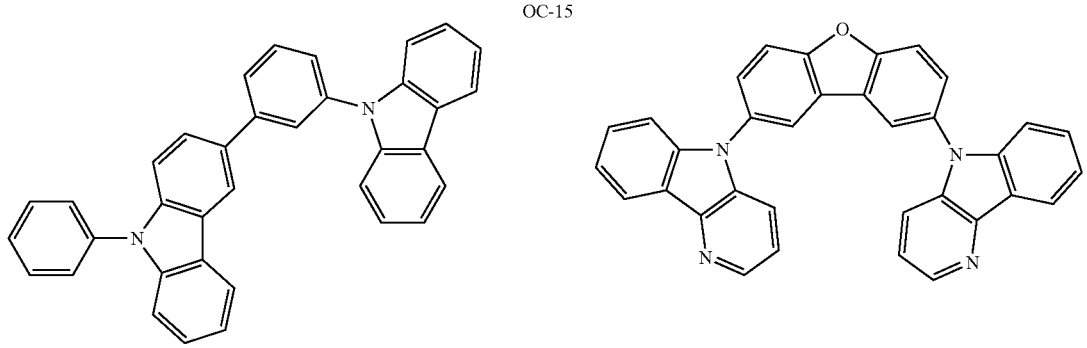
OC-17
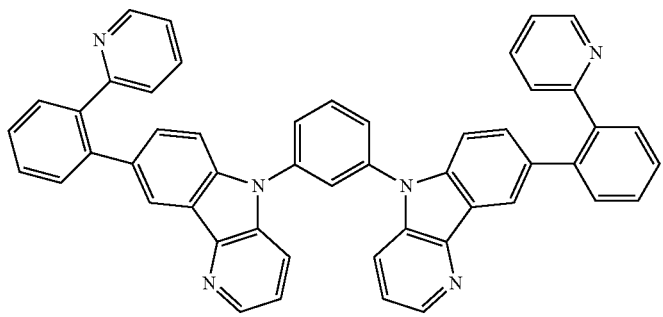
[Formula 34]
OC-18
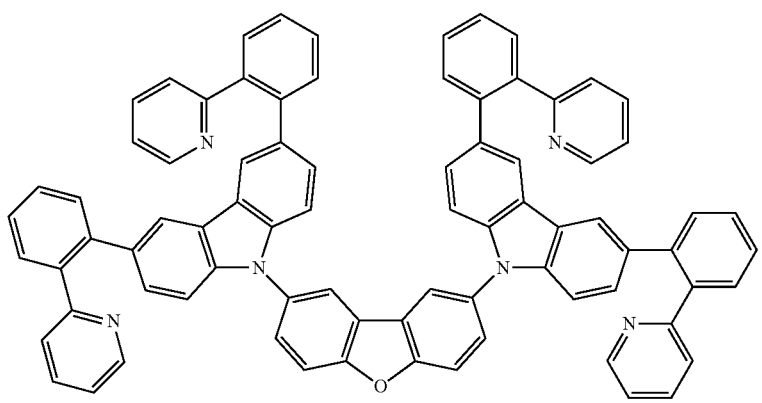

OC-19
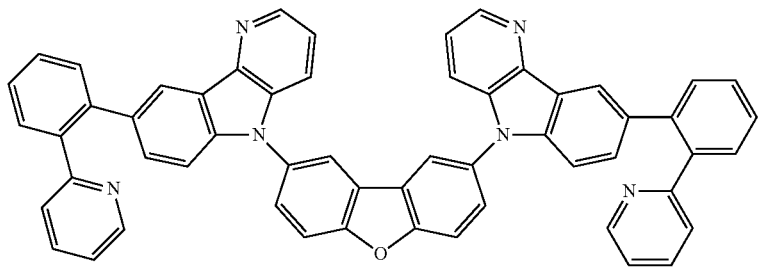
OC-20
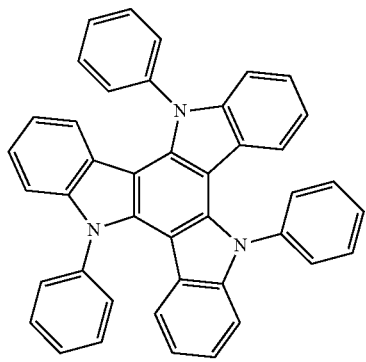
OC-21
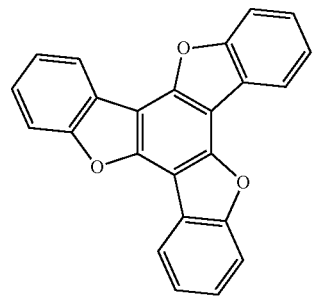
OC-22
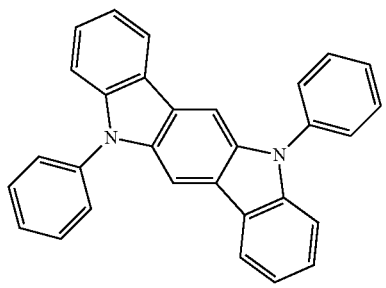
OC-23
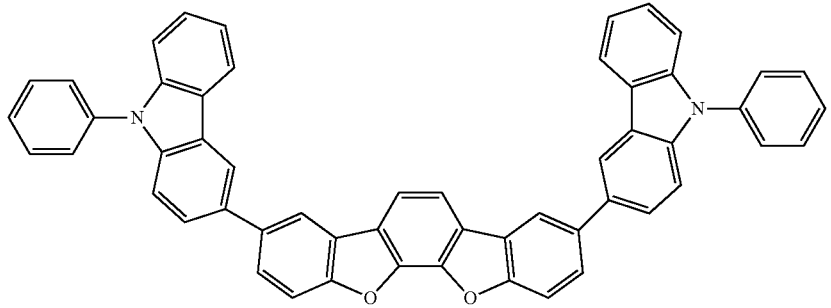
[Formula 35]
OC-24
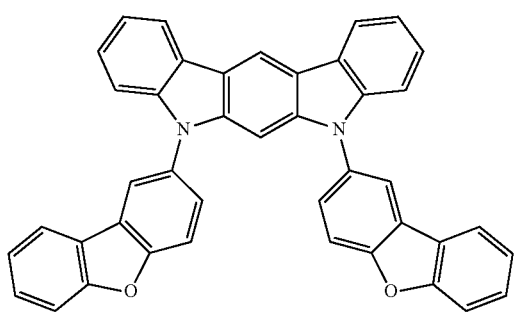
OC-25
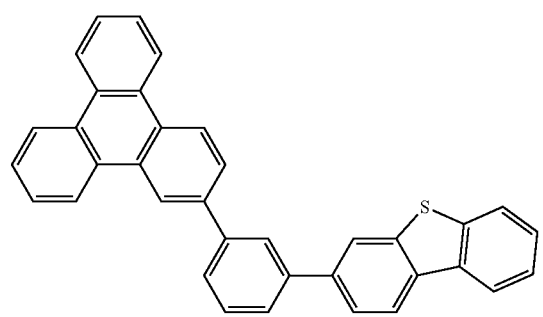

-continued
OC-26
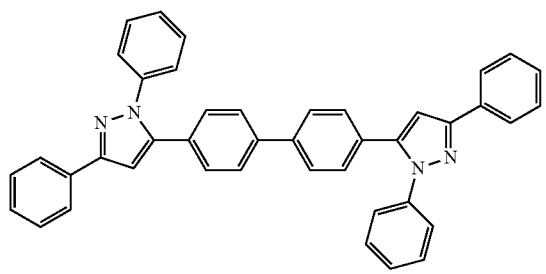
OC-27
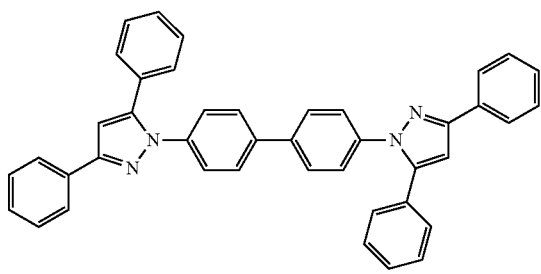
OC-28
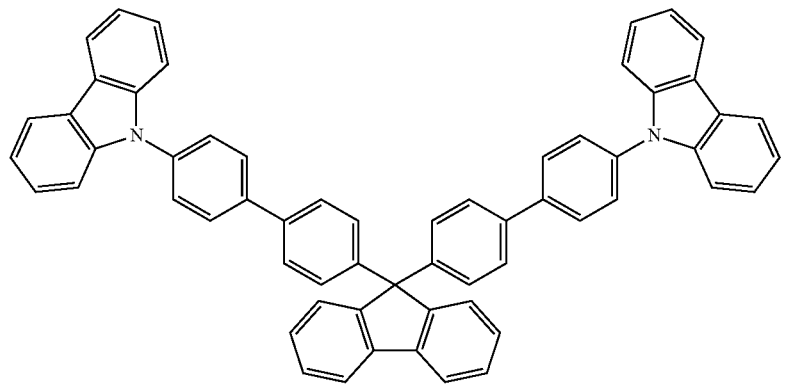
[Formula 36]
OC-29
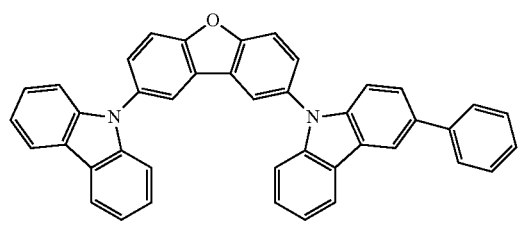
OC-30
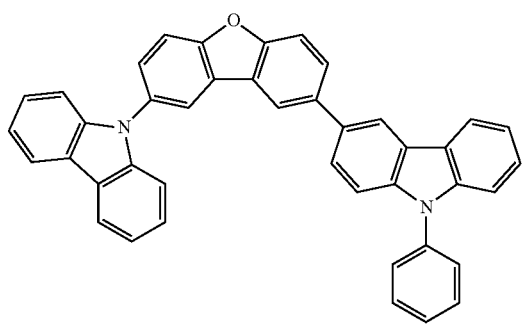
OC-31
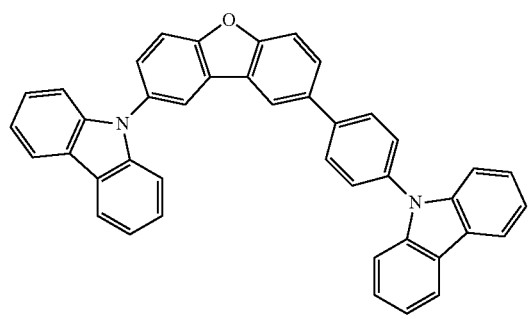
OC-32
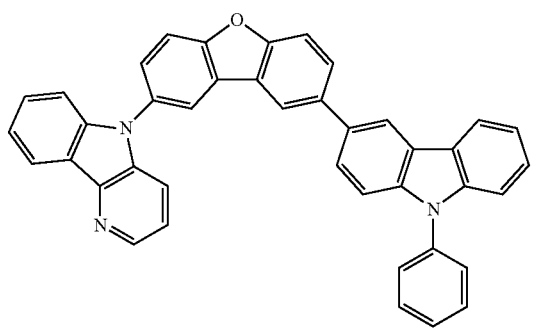

[Formula 37]
OC-33
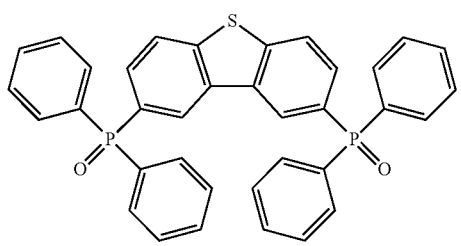
OC-34
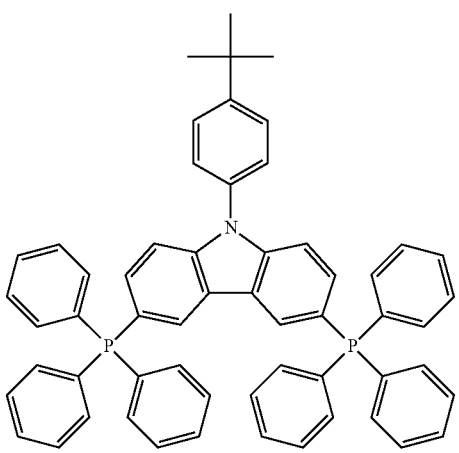
OC-35
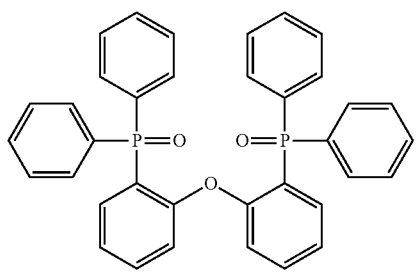
OC-36
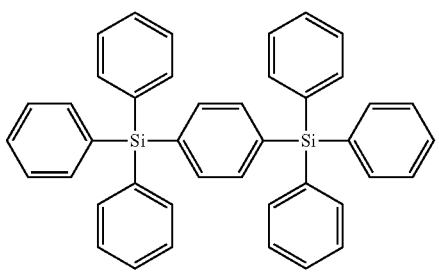
[Formula 38]
H1
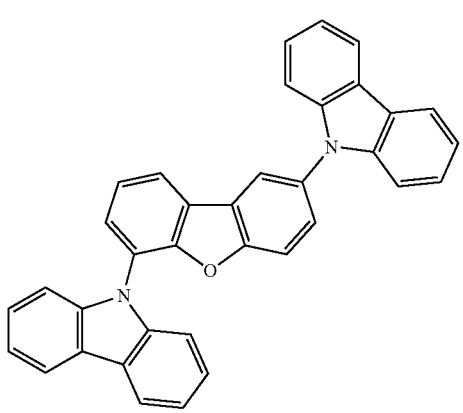
H2
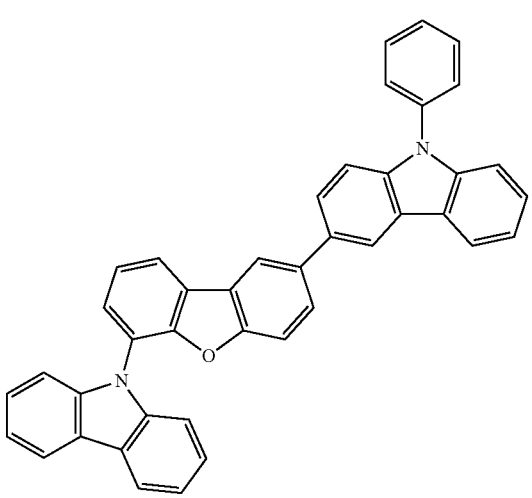

-continued
H3
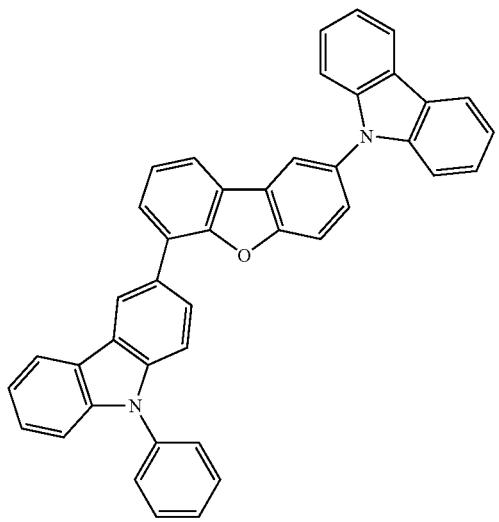
H4
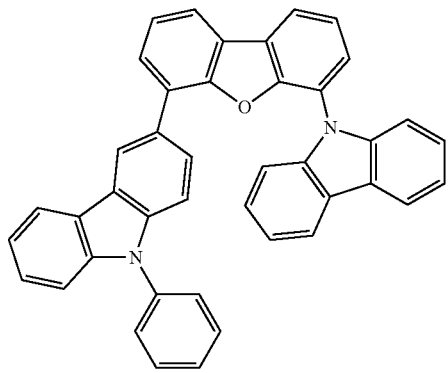
H5
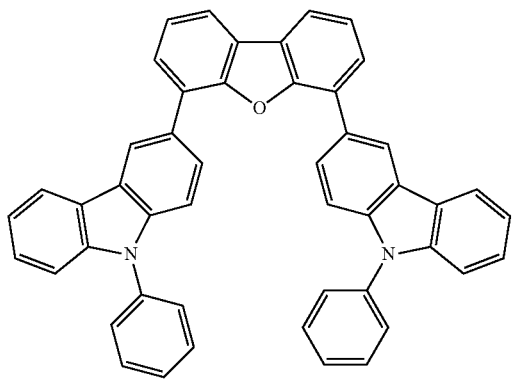
H6
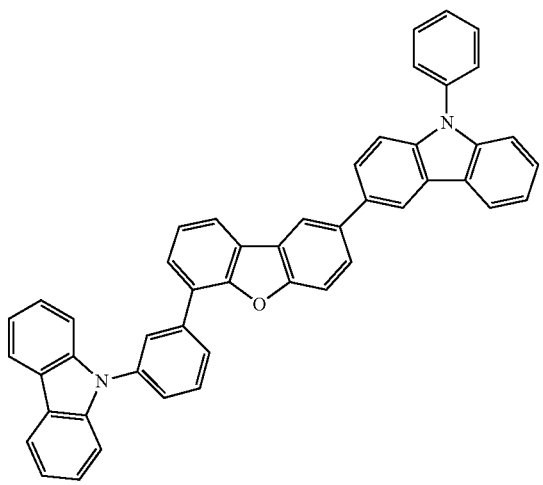
[Formula 39]
H7
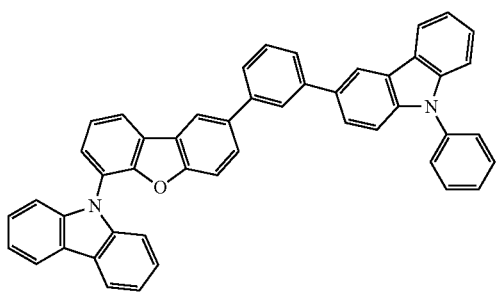
H8
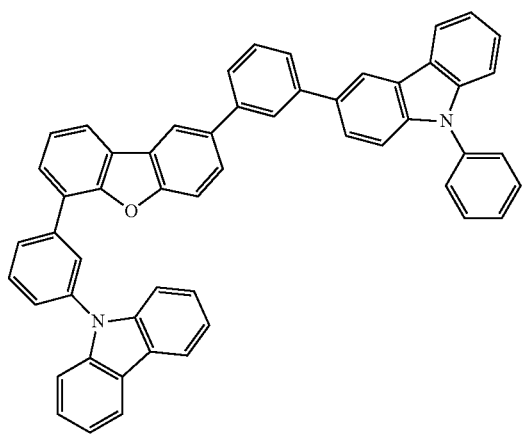

-continued
H9
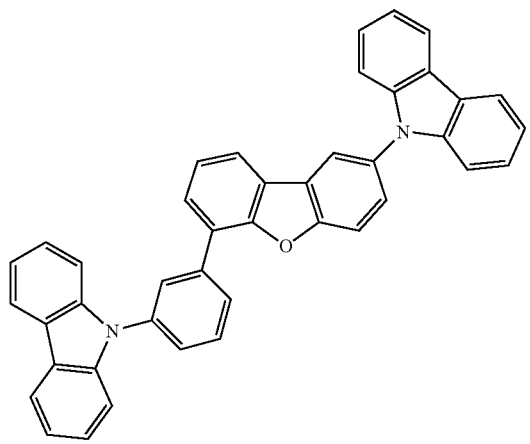
H10
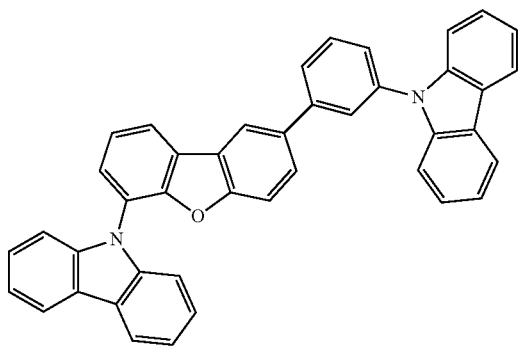
H11
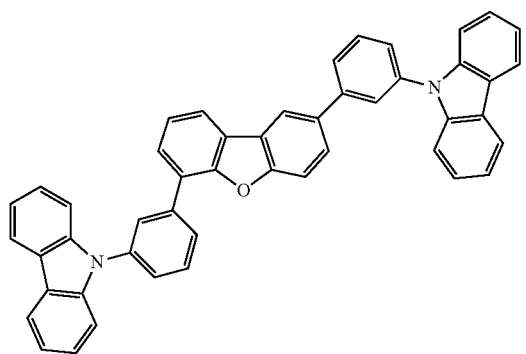
H12
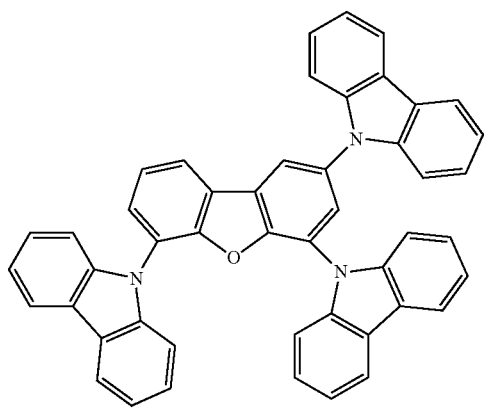
[Formula 40]
H13
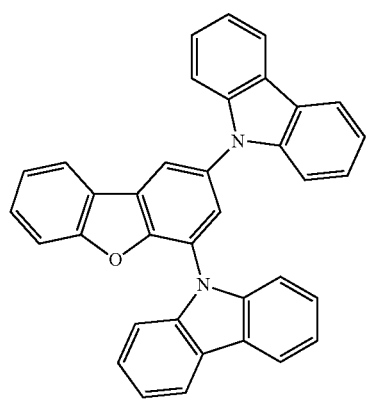
H14
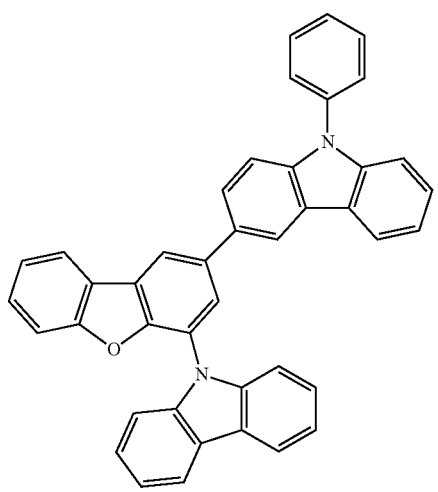

-continued
H15
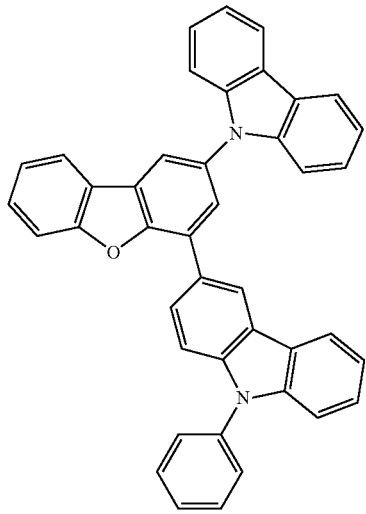
H16
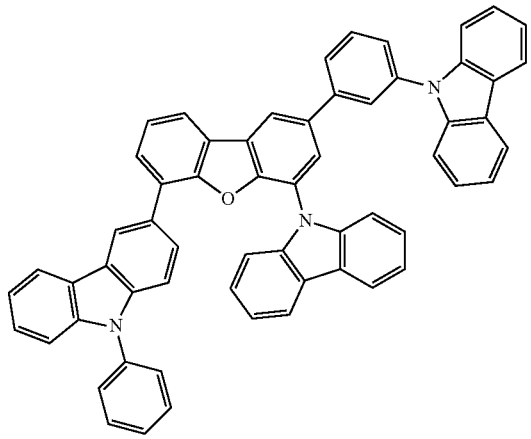
H17
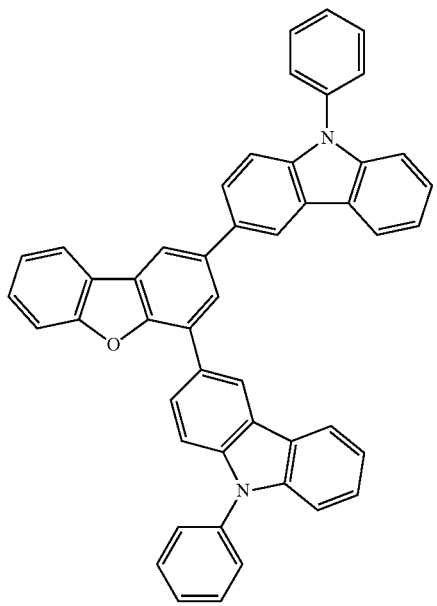
H18
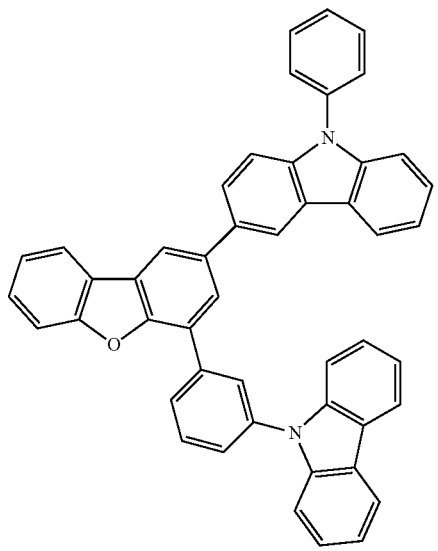
[Formula 41]
H19
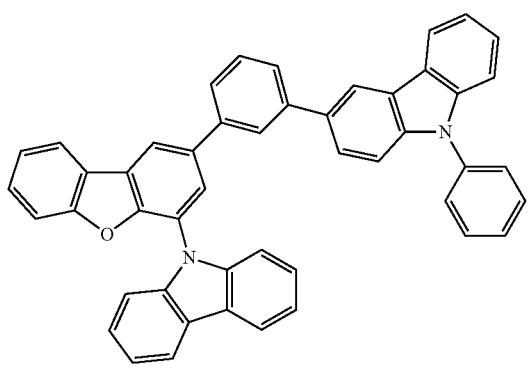
H20
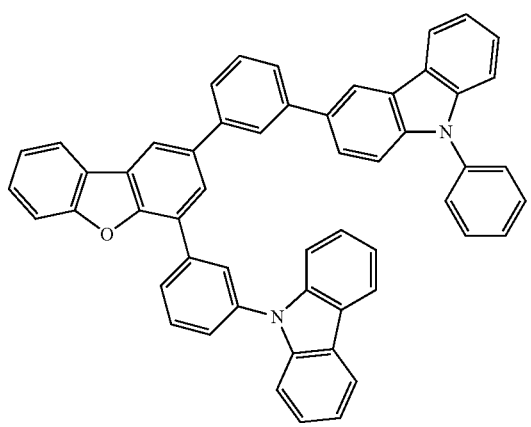

-continued
H21
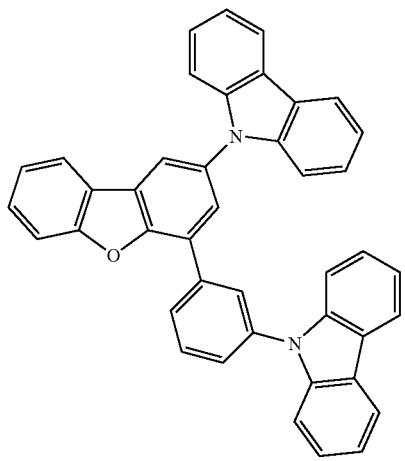
H22
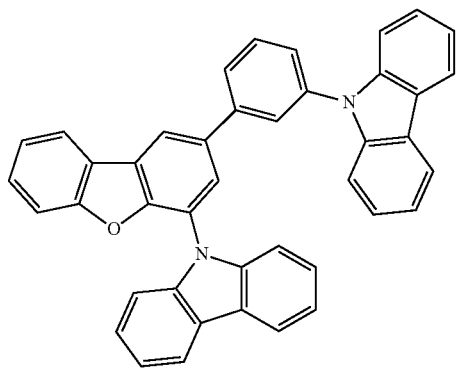
H23
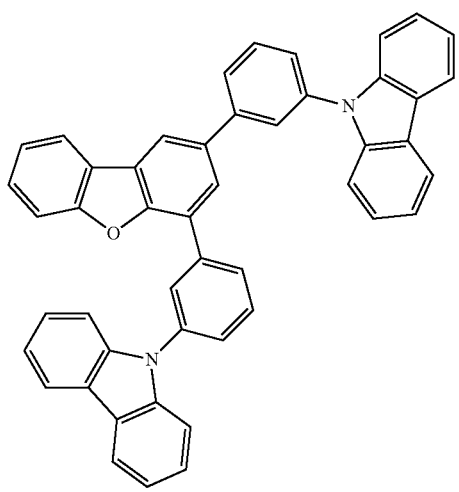
H24
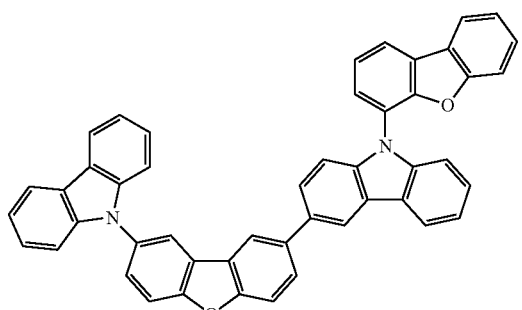
H25
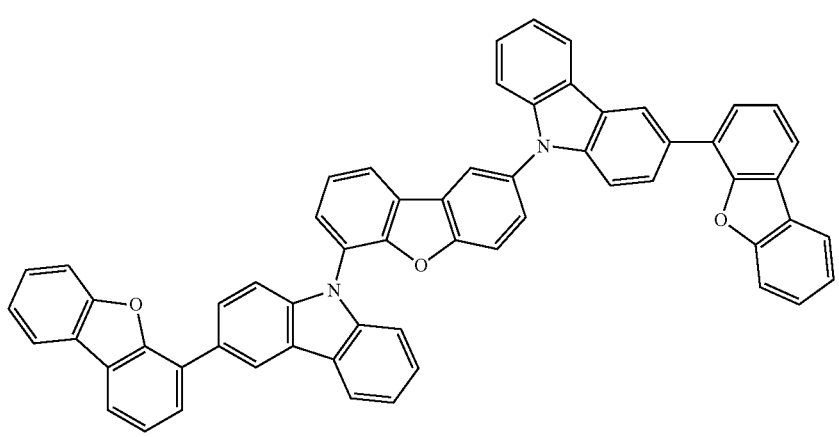

[Formula 42]
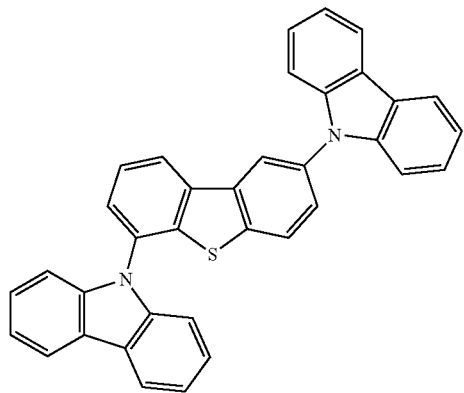
H26
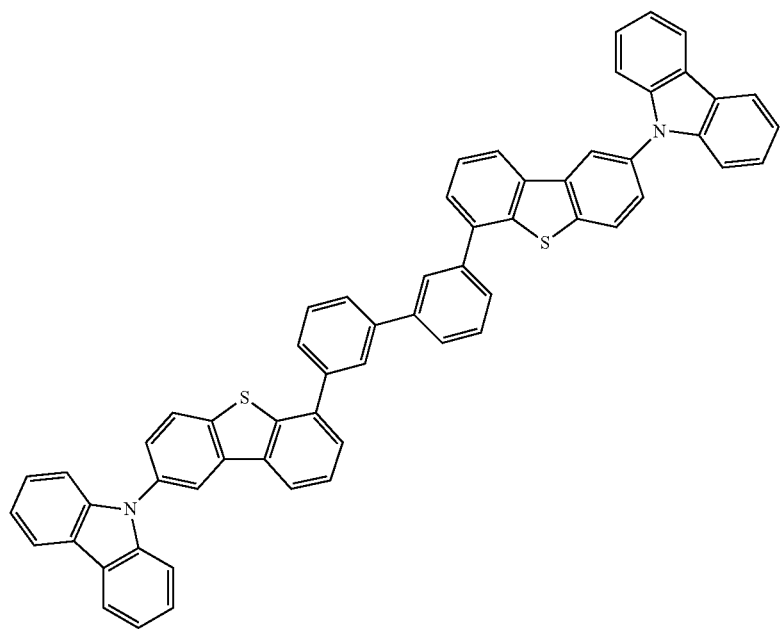
H27
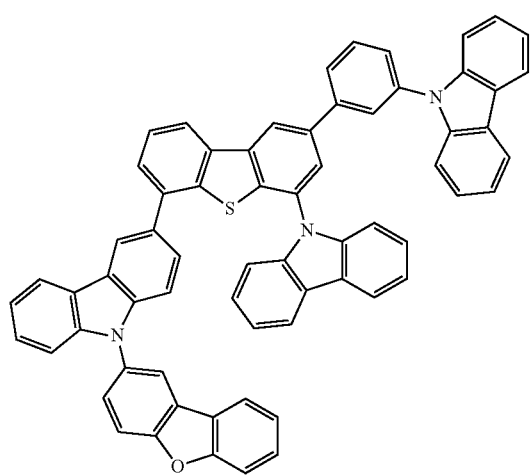
H28
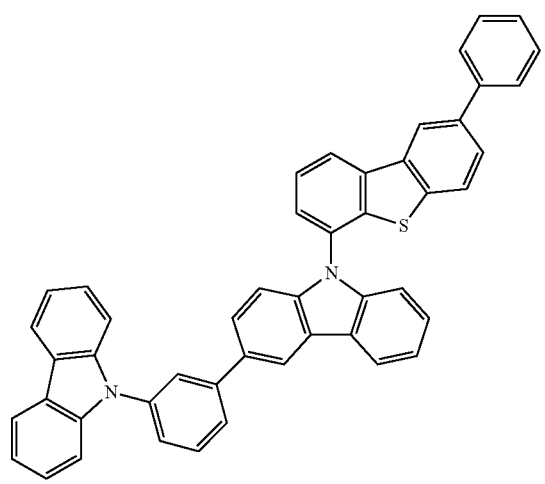
H29

H30
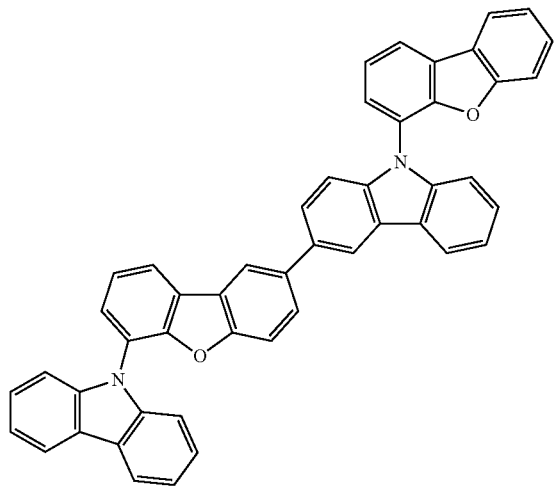
[Formula 43]
H31
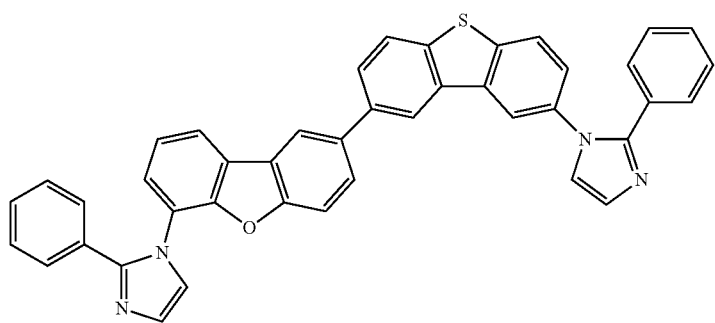
H32
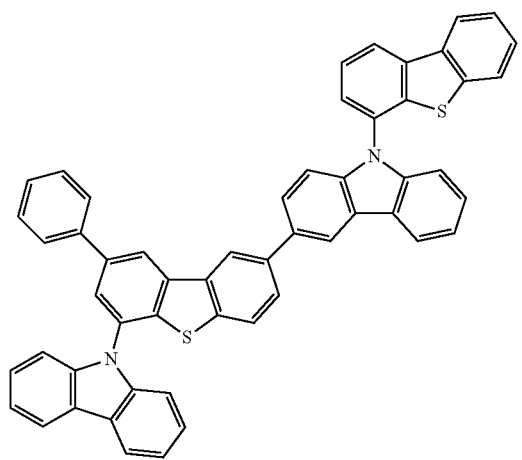
H33
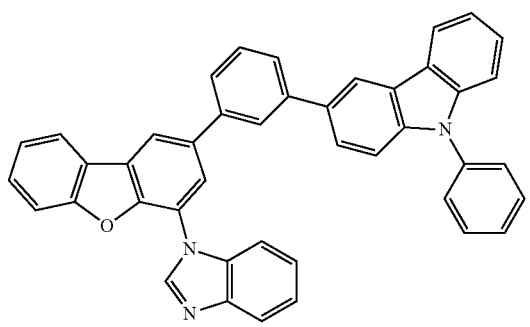

H34
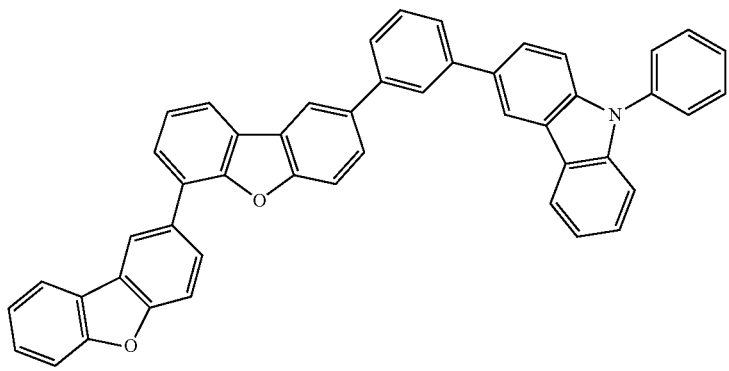
H35
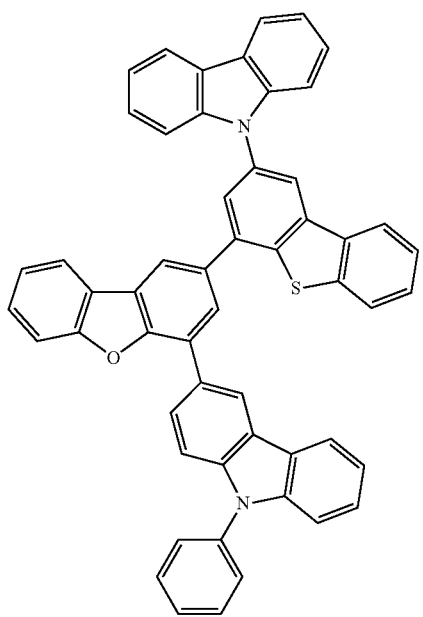
H36
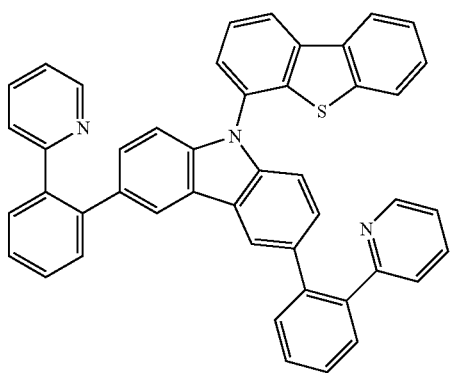
H37
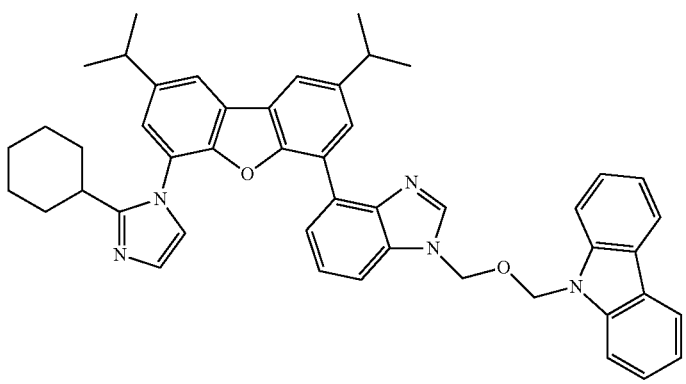

[Formula 44]
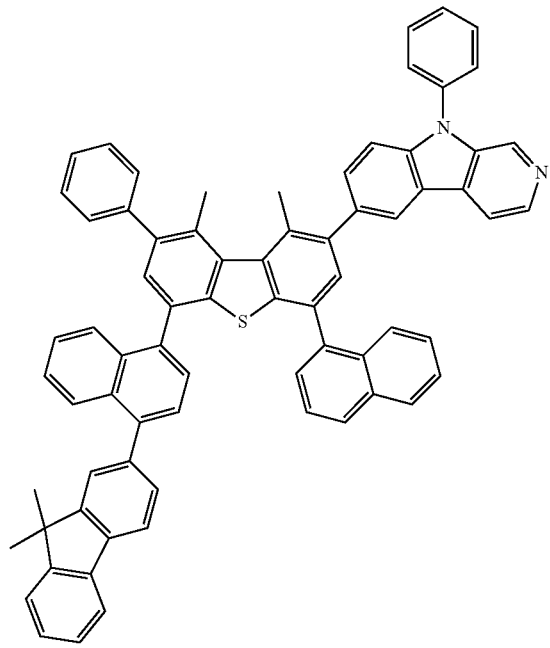
H38
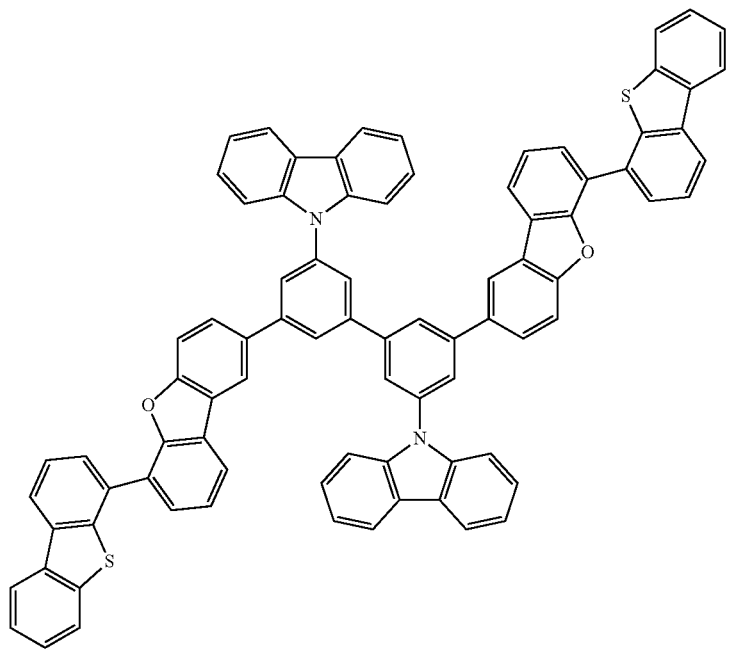
H39

H40

In addition to the above compounds, further specific examples of the host compounds according to the present invention include, but are not limited to, the compounds listed in the following literatures.

Japanese Patent Laid-Open Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, 2002-308837; US Patent Application Publication No. 2003/0175553, US Patent Application Publication No. 2006/0280965, US Patent Application Publication No. 2005/0112407, US Patent Application Publication No. 2009/0017330, US Patent Application Publication No. 2009/0030202, US Patent Application Publication No. 2005/0238919; WO 2001/039234, WO 2009/021126, WO 2008/056746, WO 2004/093207, WO 2005/089025, WO 2007/063796, WO 2007/063754, WO 2004/107822, WO 2005/030900, WO 2006/114966, WO 2009/086028, WO 2009/003898. WO 2012/023947; Japanese Patent Laid-Open No. 2008-074939, Japanese Patent Laid-Open No. 2007-254297; and EU Patent No. 2034538. Furthermore, the compounds H-1 to H-230 described in paragraphs [0255] to [0293] of Japanese Patent Laid-Open No. 2015-38941 can also be suitably used.

Note that a host compound used in the present invention may be used for a layer adjacent to an emitter layer.

The above has separately described the "blue fluorescent compound", the "blue phosphorescent compound", and the "host compound" included in a luminescent film of the present invention. However, any combination of the "blue phosphorescent compound" and the "host compound" may be allowed.

In addition, the plurality of "blue phosphorescent compounds" described above may be combined and the plurality of "host compounds" described above may also be combined. Then, luminescent films according to the present invention are applicable to various products. For instance, they are applicable to the below-described organic electroluminescent elements and organic luminescent film solar cells. Note that the luminescent film according to the present invention may further contain, in addition to the above "blue phosphorescent compounds" and "host compounds", any known substance(s) usually used at the time of application to the product.

<<Organic Electroluminescent Elements>>

A luminescent film of the present invention can be suitably employed for an emitter layer of an organic electroluminescent element provided with an emitter layer between an anode and a cathode.

<<Energy Level Relationship (Expressions (5) and (6))>>

It is desirable that a difference in energy level of the highest occupied molecular orbital (HOMO) or the lowest unoccupied molecular orbital (LUMO) between the blue phosphorescent compound and the blue fluorescent compound satisfies either of the following expressions:

$$HOMO_{BPM} > HOMO_{BFM};\quad \text{expression (5):}$$

$$LUMO_{BPM} < LUMO_{BFM};\quad \text{expression (6):}$$

wherein $HOMO_{BPM}$ represents the energy level of the highest occupied molecular orbital (HOMO) of the blue phosphorescent compound; $HOMO_{BFM}$ represents the HOMO energy level of the blue fluorescent compound; $LUMO_{BPM}$ represents the energy level of the lowest unoccupied molecular orbital (LUMO) of the blue phosphorescent compound; and $LUMO_{BFM}$ represents the LUMO energy level of the blue fluorescent compound.

(HOMO Energy Level and LUMO Energy Level Calculation Procedure)

As used herein, the structure of a blue fluorescent compound or blue phosphorescent compound may be optimized, and the electron density distribution thereof may be calculated by using molecular orbital calculation. As the calculation method, molecular orbital calculation software may be used for the calculation in which B3LYP, as a generic function, and 6-31G(d), as a basis function, are used for a host material and a fluorescent compound and B3LYP, as a generic function, and LanL2DZ, as a basis function, are used for a phosphorescent material. The software is not particularly limited, and any kind may likewise be used for the calculation.

Specific examples of the molecular orbital calculation software used include Gaussian 09 (Revision C.01, M. J. Frisch, et al, Gaussian, Inc., 2010.) manufactured by Gaussian, Inc., USA.

[Configuration Layers of Organic Electroluminescent Element]

Examples of the representative element configuration of organic EL elements of the present invention include, but are not limited to, the following configurations:

(1) anode/emitter layer/cathode;
(2) anode/emitter layer/electron transport layer/cathode;
(3) anode/hole transport layer/emitter layer/cathode;
(4) anode/hole transport layer/emitter layer/electron transport layer/cathode;
(5) anode/hole transport layer/emitter layer/electron transport layer/electron injection layer/cathode;
(6) anode/hole injection layer/hole transport layer/emitter layer/electron transport layer/cathode; and
(7) anode/hole injection layer/hole transport layer/(electron blocking layer/)emitter layer/(hole blocking layer/)electron transport layer/electron injection layer/cathode.

Among the above, the configuration (7) is preferably used but is not limited to this.

An emitter layer according to the present invention is constituted of a layer or a plurality of layers. If the emitter layer includes multiple layers, a non-luminescent intermediate layer(s) may be provided between the respective layers.

If necessary, a hole blocking layer (sometimes referred to as a hole barrier layer) and/or an electron injection layer (sometimes referred to as a cathode buffer layer) may be provided between the emitter layer and the cathode. In addition, an electron blocking layer (sometimes referred to as an electron barrier layer) and/or a hole injection layer (sometimes referred to as an anode buffer layer) may be provided between the emitter layer and the anode.

As used herein, the electron transport layer means a layer with an electron transport function, and an electron injection layer and a hole blocking layer are included in the electron transport layer in a broad sense. In addition, the electron transport layer may be constituted of a plurality of layers.

As used herein, the hole transport layer means a layer with a hole transport function, and a hole injection layer and an electron blocking layer are included in the hole transport layer in a broad sense. In addition, the hole transport layer may be constituted of a plurality of layers.

In the above representative element constitution, a layer(s) excluding the anode and the cathode is called an "organic layer(s)".

(Tandem Structure)

Meanwhile, an organic EL element according to the present invention may be what is called a tandem structure element in which a plurality of light-emitting units including at least one emitter layer are stacked.

Examples of a representative tandem structure element configuration include the following configurations.

Anode/first light-emitting unit/second light-emitting unit/third light-emitting unit/cathode; and anode/first light-emitting unit/intermediate layer/second light-emitting unit/intermediate layer/third light-emitting unit/cathode.

Here, the first light-emitting unit, the second light-emitting unit, and the third light-emitting unit may be all the same or different. In addition, two of the light-emitting units may be the same and the remaining one may be different from them.

Also, the third light-emitting unit may be absent; and, in turn, between the third light-emitting unit and the electrode may be further provided a light-emitting unit and/or an intermediate layer.

A plurality of light-emitting units may be directly stacked or may be stacked via an intermediate layer(s). The intermediate layer, in general, is also called an intermediate electrode, an intermediate conductive layer, a charge generating layer, an electron withdrawing layer, a connection layer, or an intermediate insulating layer. Any known material composition may be used as long as the layer has functions of supplying an adjacent layer on the anode side with electrons and an adjacent layer on the cathode side with holes.

Examples of the material used for the intermediate layer include: but are not limited to, electrically conductive inorganic compound layer, such as ITO (indium-tin oxide), IZO (indium-zinc oxide), $ZnO_2$, TiN, ZrN, HfN, $TiO_x$, $VO_x$, CuI, InN, GaN, $CuAlO_2$, $CuGaO_2$, $SrCu_2O_2$, $LaB_6$, $RuO_2$, Al; bilayer films such as $Au/Bi_2O_3$; multilayer films such as $SnO_2/Ag/SnO_2$, ZnO/Ag/ZnO, $Bi_2O_3/Au/Bi_2O_3$, $TiO_2/TiN/TiO_2$, $TiO_2/ZrN/TiO_2$; fullerene compounds such as $C_{60}$; electrically conductive organic matter layer, such as oligothiophene; and electrically conductive organic compound layer, such as metal phthalocyanines, non-metal phthalocyanines, metal porphyrins, and non-metal porphyrins.

Examples of a preferable configuration inside the light-emitting unit include, but are not limited to, those in which the anode and the cathode are excluded from the configurations (1) to (7) that have been listed for the above representative element constitution.

Specific examples of the tandem organic EL element involve the element constitutions and constituting materials listed in the following literatures including, but are not limited to, U.S. Pat. Nos. 6,337,492, 7,420,203, 7,473,923, 6,872,472, 6,107,734, 6,337,492, WO 2005/009087, Japanese Patent Laid-Open No. 2006-228712, Japanese Patent Laid-Open No. 2006-24791, Japanese Patent Laid-Open No. 2006-49393, Japanese Patent Laid-Open No. 2006-49394, Japanese Patent Laid-Open No. 2006-49396, Japanese Patent Laid-Open No. 2011-96679, Japanese Patent Laid-Open No. 2005-340187, Japanese Patent No. 4711424, Japanese Patent No. 3496681, Japanese Patent No. 3884564, Japanese Patent No. 4213169, Japanese Patent Laid-Open No. 2010-192719, Japanese Patent Laid-Open No. 2009-076929, Japanese Patent Laid-Open No. 2008-078414, Japanese Patent Laid-Open No. 2007-059848, Japanese Patent Laid-Open No. 2003-272860, Japanese Patent Laid-Open No. 2003-045676, and WO 2005/094130.

The following describe the respective layers constituting an organic EL element of the present invention.

<<Emitter Layer>>

An emitter layer according to the present invention is a layer providing a field in which electrons and holes injected from an electrode or a neighboring layer (hereinafter, sometimes referred to as an "adjacent layer") are recombined to emit light through excitons. A light-emitting portion may be inside the emitter layer or may be at the interface between the emitter layer and the adjacent layer. Then, the emitter layer according to the present invention may be configured to have the above-mentioned "luminescent film" of the present invention. Specifically, the emitter layer according to the present invention may be a "luminescent film" of the present invention but is not particularly limited to the above.

For instance, the luminescent film may contain another emitter layer and/or a film composed of other compounds.

Note that the structure of the emitter layer according to the present invention is not particularly limited as long as the constitution meets requirements regarding the luminescent film set forth in the present invention.

From the viewpoints of making a produced film homogeneous, preventing unnecessary high-voltage application during light emission, and enhancing luminescent color stability against driving current, the total film thickness of the emitter layers is not particularly limited and is adjusted to be within a range of preferably 2 nm to 5 µm, more preferably 2 to 500 nm, and still more preferably 5 to 200 nm.

As used herein, the thickness of the individual emitter layer is adjusted to be within a range of preferably 2 nm to 1 µm, more preferably 2 to 200 nm, and still more preferably 3 to 150 nm.

[Other Luminescent Dopants and Host Compounds]

As described above, an emitter layer according to the present invention includes a luminescent film of the present invention and is thus constituted by including the above-described "blue phosphorescent compound", "blue fluorescent compound", and "host compound".

Further, in an organic EL element according to the present invention, a luminescent film of the present invention may contain a material of a layer adjacent to the luminescent film. The material of the adjacent layer is not particularly limited as long as the material is from a layer adjacent to the luminescent film (emitter layer). Examples include compounds included in a hole transport layer. This makes it possible to stably provide an organic electroluminescent element in which the luminescent film of the present invention is unlikely to be affected by an external environment.

Meanwhile, as long as the advantageous effects of the present invention are not prevented, the emitter layer according to the present invention may contain the below-described "(1) luminescent dopants (hereinafter, sometimes referred to as "other luminescent dopants): (1.1) phosphorescent compounds (hereinafter, sometimes referred to as "other phosphorescent compounds) and (1.2) fluorescent compounds (hereinafter, sometimes referred to as "other fluorescent compounds")" and "(2) host compounds (hereinafter, sometimes referred to as "other host compounds")".

(1) Other Luminescent Dopants

Other luminescent dopants according to the present invention are explained.

It is preferable that as other luminescent dopants, other phosphorescent compounds (sometimes referred to as other phosphorescence dopants or other phosphorescent dopants) and other fluorescent compounds (other fluorescence dopants or other fluorescent dopants) are used in combination.

In addition, a plurality of the kinds of blue phosphorescent compounds and other phosphorescent compounds may be used in combination. Also, combinations of the dopants with different structures may be used. This enables any luminescent color to be produced.

The color that is emitted by an organic EL element of the present invention or a luminescent film of the present invention may be determined as a color obtained by fitting, to the CIE chromaticity coordinate, the results of measurement using a spectral emission luminance meter CS-1000 (manufactured by Konica Minolta, Inc.) in accordance with FIG. 4.16 in page 108 of "New Handbook of Color Science" (edited by The Color Science Association of Japan, The University of Tokyo Press, 1985). Note that this makes it possible to detect light emission derived from the blue fluorescent compound. The detection method is not particularly limited, and examples include a method including: separating and purifying the compound by, for instance, HPLC (High Performance Liquid Chromatography); and subjecting a blue phosphorescent compound and a blue fluorescent compound to light emission and absorption measurements.

As used herein, it is preferable that one or more of the emitter layer contain a plurality of luminescent dopants with different luminescent colors and exhibit white color light emission.

Examples of a combination of white color-exhibiting luminescent dopants include, but are not particularly limited to, a combination of blue and orange ones and a combination of blue, green, and red ones.

The white color of an organic EL element according to the present invention is not particularly limited and may be an orangish white color or a bluish white color. However, it is preferable that when front luminance at the viewing angle of 2 degrees is measured by the previously described method, the chromaticity in the CIE1931 coloring system at 1000 cd/m$^2$ is within a region defined by x=0.39±0.09 and y=0.38±0.08.

(1.1) Other Phosphorescent Compounds

Other phosphorescent compounds (hereinafter, sometimes referred to as "other phosphorescence dopants") are explained.

Other phosphorescence dopants according to the present invention are compounds where triplet excitation-derived light emission is observed. Specifically, the compounds emit phosphorescence at room temperature (25° C.). Also, the compounds are defined to have a phosphorescence quantum efficiency of 0.01 or higher at 25° C. Preferably, the phosphorescence quantum efficiency is 0.1 or higher.

As used herein, the phosphorescence quantum efficiency can be measured by the procedure described in page 398 of Spectrometry II in "Jikken Kagaku Koza (Experimental Chemistry Lectures)" 7, 4th edition (printed in 1992, Maruzen, Inc.). The in-solution phosphorescence quantum efficiency may be measured by using various solvents. Here, other phosphorescence dopants according to the present invention are allowed as long as the above phosphorescence quantum efficiency (0.01 or higher) can be achieved in any one of the solvents.

Light emission from other phosphorescence dopants has two different principles. One involves a type of energy transfer in which carrier recombinations on a host compound, to which carries are transported, occur and the host compound excited state is generated; and this energy is transferred to such a phosphorescence dopant and light is then emitted from the phosphorescence dopant. The other involves a carrier trap type in which such a phosphorescence dopant is a carrier trap and carrier recombinations on the phosphorescence dopant occur and light is emitted from the phosphorescence dopant. In any case, provided that the excited state energy of such a phosphorescence dopant is lower than that of such a host compound.

Meanwhile, other phosphorescence dopants that can be used in the present invention may be used and suitably selected from known compounds used for an emitter layer of the organic EL element.

Specific examples of other phosphorescence dopants usable in the present invention include known compounds listed in the literatures illustrating the above-mentioned blue phosphorescent compounds according to the present invention.

Among them, examples of preferable other phosphorescence dopants include organic metal complexes having Ir as a center metal. More preferred are complexes containing at least one coordination mode selected from a metal-carbon bond, a metal-nitrogen bond, a metal-oxygen bond, and a metal-sulfur bond.

(1.2) Other Fluorescent Dopants

Other fluorescent dopants (hereinafter, sometimes referred to as "other fluorescence dopants") are explained.

Other fluorescence dopants are compounds that can emit singlet excitation-derived light and are not particularly limited as long as singlet excitation-derived light emission is observed.

Examples of the other fluorescence dopants include anthracene derivatives, pyrene derivatives, chrysene derivatives, fluoranthene derivatives, perylene derivatives, fluorene derivatives, arylacetylene derivatives, styrylarylene derivatives, styrylamine derivatives, arylamine derivatives, boron complexes, coumarin derivatives, pyran derivatives, cyanine derivatives, croconium derivatives, squalium derivatives, oxobenzanthracene derivatives, fluorescein derivatives, rhodamine derivatives, pyrylium derivatives, perylene derivatives, polythiophene derivatives, or rare earth metal complex-based compounds.

Meanwhile, luminescent dopants using delayed fluorescence have recently been developed and may be used.

Specific examples of the delayed fluorescence-using luminescent dopants include, but not limited to, the compounds disclosed in WO02011/156793, JP2011-213643A, and JP2010-93181A.

(2) Other Host Compounds

Other host compounds according to the present invention are compounds that primarily participate in charge injection and transport into an emitter layer, and the light emission of the compound itself in the organic EL element is substantially unobserved.

The host compound preferably has a phosphorescence quantum efficiency of phosphorescence light emission at room temperature (25° C.) of less than 0.1 and preferably has a phosphorescence quantum efficiency of less than 0.01.

In addition, the excited state energy of the host compound is preferably higher than the excited state energy of the luminescent dopant included in the same layer.

Such other host compounds may be used singly or in combination of two or more. Use of the plurality of the different host compounds enables charge transfer to be adjusted, thereby making the organic EL element highly efficient.

Examples of the other host compounds that can be used include, but are not limited to, conventional compounds used for organic EL elements. Either low-molecular-weight compounds or polymer compounds having repeating units may be allowed. Also, compounds having a reactive group such as a vinyl group or an epoxy group are acceptable.

As the known host compounds, those having a high glass-transition temperature (Tg) are preferable from the viewpoints of possessing hole or electron transport capability and preventing the wavelength of emitted light from becoming longer and further stabilizing the organic EL element when heat is generated during high-temperature operation and/or during element operation. The Tg is preferably 90° C. or higher and more preferably 120° C. or higher.

Here, the glass-transition temperature (Tg) refers to a value calculated, using DSC (Differential Scanning Calorimetry), in accordance with the protocol of JIS-K-7121.

Specific examples of the other host compounds usable in an organic EL element according to the present invention include, but are not limited to, known compounds listed in the literatures illustrating the above-mentioned host compounds according to the present invention.

In addition, such a host compound according to the present invention may be used for an adjacent layer adjacent to the emitter layer.

<<Electron Transport Layer>>

As used herein, the electron transport layer may contain a material having an electron transport function and may have a function of transporting, to the emitter layer, electrons injected from the cathode.

The total thickness of an electron transport layer according to the present invention is not particularly limited and ranges usually from 2 nm to 5 µm, more preferably from 2 to 500 nm, and still more preferably from 5 to 200 nm.

Meanwhile, when light occurring at the emitter layer of the organic EL element is extracted through an electrode, it has been known that there is interference between light directly extracted from the emitter layer and light extracted after reflected by the other electrode positioned opposite to the electrode from which the light is extracted. If light is reflected by the cathode, the total thickness of the electron transport layer may be suitably adjusted to be between 5 nm and 1 µm, so that this interference effect can be exploited efficiently.

Here, as the thickness of the electron transport layer is increased, the voltage is likely to become higher. Accordingly, when the thickness is increased, in particular, the electron transport layer has an electron transfer rate of preferably $10^{-5}$ cm$^2$/Vs or higher.

Materials used in the electron transport layer (hereinafter, referred to as electron transport materials) may have either electron injection or transport property or hole barrier property. They may be used and selected from any of known conventional compounds.

Examples include nitrogen-containing aromatic heterocyclic ring derivatives (e.g., carbazole ring derivatives, azacarbazole ring derivatives (those in which one or more of the carbon atoms of a carbazole ring are replaced by a nitrogen atom), pyridine derivatives, pyrimidine derivatives, pyrazin derivatives, pyridazin derivatives, triazine derivatives, quinoline derivatives, quinoxaline derivatives, phenanthroline derivatives, azatriphenylene derivatives, oxazole derivatives, thiazole derivatives, oxadiazole derivatives, thiadiazole derivatives, triazole derivatives, benzimidazole derivatives, benzoxazole derivatives, benzthiazole derivatives), dibenzofuran derivatives, dibenzothiophene derivatives, silole derivatives, and aromatic hydrocarbon ring derivatives (e.g., naphthalene derivatives, anthracene derivatives, triphenylenes)

In addition, examples of the electron transport material include metal complexes having, as a ligand, a quinolinol backbone or dibenzoquinolinol backbone, such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, and bis(8-quinolinol)zinc (Znq), and the above metal complexes in which a center metal thereof is replaced by In, Mg, Cu, Ca, Sn, Ga, or Pb.

In addition, metal-free or metal phthalocyanines or those phthalocyanines with a terminal substituted by an alkyl group or a sulfonate group, may be preferably used as the electron transport material. Further, distyrylpyrazin derivatives exemplified as the emitter layer material may be used as the electron transport material. Like the case of the hole injection layer or the hole transport layer, n-type-Si and n-type-SiC inorganic semiconductors, for instance, may be used as the electron transport material.

Furthermore, polymer materials, a polymer chain of which contains the above materials, or polymer materials having the above materials as a main chain of the polymer may also be used.

In an electron transport layer according to the present invention, a doping material may be doped, as a guest material, in the electron transport layer to form an (electron-rich) electron transport layer of a higher n property. Examples of the doping material include n-type dopants such as metal compounds such as metal complexes and metal halides. Specific examples of the electron transport layer having such a configuration include those listed in the literatures including JP04-297076A, JP10-270172A, JP2000-196140A, JP2001-102175A, and J. Appl. Phys., 95, 5773 (2004).

Specific examples of the known preferable electron transport material used for an organic EL element of the present invention include, but are not limited to, the compounds listed in the following literatures.

U.S. Pat. Nos. 6,528,187, 7,230,107, US Patent Application Publication No. 2005/0025993, US Patent Application Publication No. 2004/0036077, US Patent Application Publication No. 2009/0115316, US Patent Application Publication No. 2009/0101870, US Patent Application Publication No. 2009/0179554, WO 2003/060956, WO 2008/132085, Appl. Phys. Lett. 75, 4 (1999), Appl. Phys. Lett. 79, 449 (2001), Appl. Phys. Lett. 81, 162 (2002), Appl. Phys. Lett. 81, 162 (2002), Appl. Phys. Lett. 79, 156 (2001), U.S. Pat. No. 7,964,293, US Patent Application Publication No. 2009/030202, WO 2004/080975, WO 2004/063159, WO 2005/085387, WO 2006/067931, WO 2007/086552, WO 2008/114690, WO 2009/069442, WO 2009/066779, WO 2009/054253, WO 2011/086935, WO 2010/150593, WO 2010/047707, EU Patent No. 2311826, Japanese Patent Laid-Open No. 2010-251675, Japanese Patent Laid-Open No. 2009-209133, Japanese Patent Laid-Open No. 2009-124114, Japanese Patent Laid-Open No. 2008-277810, Japanese Patent Laid-Open No. 2006-156445, Japanese Patent Laid-Open No. 2005-340122, Japanese Patent Laid-Open No. 2003-45662, Japanese Patent Laid-Open No. 2003-31367, Japanese Patent Laid-Open No. 2003-282270, and WO 2012/115034.

Examples of more preferable electron transport materials according to the present invention include pyridine derivatives, pyrimidine derivatives, pyrazin derivatives, triazine derivatives, dibenzofuran derivatives, dibenzothiophene derivatives, carbazole derivatives, azacarbazole derivatives, and benzimidazole derivatives.

The electron transport materials may be used singly or in combination of two or more.

<<Hole Blocking Layer>>

The hole blocking layer is a layer having an electron transport layer function in a broad sense. Preferably, the layer contains a material with small hole transport capability while possessing an electron transport function, wherein holes are blocked while electrons are transported so as to be able to increase the probability of recombination between the electron and the hole.

Meanwhile, depending on the needs, the configuration of the previously described electron transport layer is applicable to a hole blocking layer according to the present invention.

It is preferable that a hole blocking layer provided in an organic EL element of the present invention is disposed next to the cathode side of the emitter layer thereof.

The thickness of a hole blocking layer according to the present invention ranges preferably from 3 to 100 nm and more preferably from 5 to 30 nm.

The above-mentioned materials used for the electron transport layer are preferably used as materials used for the hole blocking layer. In addition, materials used as the above-mentioned host compounds and other host compounds according to the present invention are also preferably used for the hole blocking layer.

<<Electron Injection Layer>>

An electron injection layer (sometimes referred to as a "cathode buffer layer) according to the present invention refers to a layer interposed between a cathode and an emitter layer so as to decrease an operation voltage and increase light emission luminance and is described in detail in the second chapter "Electrode Materials" (pages 123 to 166) of the "Organic EL elements and Their Industrialization Front Line (published by NTS Inc. on Nov. 30, 1998)", the Second Edition.

An electron injection layer according to the present invention may be provided as needed and may be present between a cathode and an emitter layer, as described above, or between a cathode and an electron transport layer.

The electron injection layer is preferably a very thin film and the thickness preferably ranges from 0.1 to 5 nm depending on its material. In addition, its components may be provided intermittently to form a non-uniform film.

The electron injection layer is detailed in, for instance, JP06-325871A, JP09-17574A, and JP10-74586A. Specific examples of the materials preferably used for the electron injection layer include: metals represented by, for instance, strontium, aluminum; alkali metal compounds represented by, for instance, lithium fluoride, sodium fluoride, potassium fluoride; alkaline-earth metal compounds represented by, for instance, magnesium fluoride, calcium fluoride; metal oxides represented by aluminum oxide; and metal complexes represented by, for instance, lithium 8-hydroxyquinolate (Liq). In addition, it is possible to use the above-mentioned electron transport materials.

Further, the materials used for the above electron injection layer may be used singly or in combination of two or more.

<<Hole Transport Layer>>

As used herein, the hole transport layer may contain a material having a hole transport function and may have a function of transporting, to the emitter layer, holes injected from the anode.

The total thickness of a hole transport layer according to the present invention is not particularly limited and ranges usually from 5 nm to 5 nm, more preferably from 2 to 500 nm, and still more preferably from 5 nm to 200 nm.

Materials used in the hole transport layer (hereinafter, referred to as hole transport materials) may have either hole injection or transport property or electron barrier property. They may be used and selected from any of known conventional compounds.

Examples include porphyrin derivatives, phthalocyanine derivatives, oxazole derivatives, oxadiazole derivatives, triazole derivatives, imidazole derivatives, pyrazoline derivatives, pyrazolone derivatives, phenylenediamine derivatives, hydrazone derivatives, stilbene derivatives, polyarylalkane derivatives, triarylamine derivatives, carbazole derivatives, indolocarbazole derivatives, isoindole derivatives, acene-based derivatives such as anthracene and naphthalene, fluorene derivatives, fluorenone derivatives, and polymer materials, a main or side chain of which contains polyvinyl carbazole and/or an aromatic amine, or oligomers, polysilanes, and conductive polymers or oligomers thereof (e.g., PEDOT:PSS, aniline-based copolymers, polyanilines, polythiophenes).

Examples of the triallylamine derivatives include benzidine-type compounds represented by α-NPD, star-burst-type compounds represented by MTDATA, and compounds having fluorene and/or anthracene in the triallylamine-linkage core portion.

Also, as the hole transport materials may be likewise used hexaazatriphenylene derivatives described in JP2003-519432A and JP2006-135145A.

Further, it is possible to use a hole transport layer with a high p property, wherein impurities are doped. Examples thereof include those listed in the patent literatures including JP04-297076A, JP2000-196140A, and JP2001-102175A, and J. Appl. Phys., 95, 5773 (2004).

Furthermore, it is also possible to use what is called p-type hole transport materials and p-type-Si or p-type-SiC inorganic compounds described in JP11-251067A and the article by J. Huang et. al. (Applied Physics Letters 80 (2002), p. 139). Moreover, preferably used are ortho-metallized organic metal complexes having Ir or Pt as a center atom, which are represented by $Ir(ppy)_3$.

As the hole transport materials may be used the above-described ones. Preferably used are triarylamine derivatives, carbazole derivatives, indolocarbazole derivatives, azatriphenylene derivatives, organic metal complexes, or polymer materials or oligomers, a main or side chain of which contains an aromatic amine.

Specific examples of the known preferable hole transport material used for an organic EL element of the present invention include, but are not limited to, the compounds listed in the following literatures in addition to the above-described literatures.

Examples include Appl. Phys. Lett. 69, 2160 (1996), J. Lumin. 72-74, 985 (1997), Appl. Phys. Lett. 78, 673 (2001), Appl. Phys. Lett. 90, 183503 (2007), Appl. Phys. Lett. 90, 183503 (2007), Appl. Phys. Lett. 51, 913 (1987), Synth. Met. 87, 171 (1997), Synth. Met. 91, 209 (1997), Synth. Met. 111, 421 (2000), SID Symposium Digest, 37, 923 (2006), J. Mater. Chem. 3, 319 (1993), Adv. Mater. 6, 677 (1994), Chem. Mater. 15, 3148 (2003), US Patent Application Publication No. 2003/0162053, US Patent Application Publication No. 2002/0158242, US Patent Application Publication No. 2006/0240279, US Patent Application Publication No. 2008/0220265, U.S. Pat. No. 5,061,569, WO 2007/002683, WO 2009/018009, EU Patent No. 650955, US Patent Application Publication No. 2008/0124572, US Patent Application Publication No. 2007/0278938, US Patent Application Publication No. 2008/0106190, US Patent Application Publication No. 2008/0018221, WO 2012/115034, National Publication of International Patent Application No. 2003-519432, Japanese Patent Laid-Open No. 2006-135145; and U.S. patent application Ser. No. 13/585,981.

The hole transport materials may be used singly or in combination of two or more.

<<Electron Blocking Layer>>

The electron blocking layer is a layer having a hole transport layer function in a broad sense. Preferably, the layer contains a material with small electron transport capability while possessing a hole transport function, wherein electrons are blocked while holes are transported so as to be able to increase the probability of recombination between the electron and the hole.

Meanwhile, depending on the needs, the configuration of the previously described hole transport layer is applicable to an electron blocking layer according to the present invention.

It is preferable that an electron blocking layer provided in an organic EL element of the present invention is disposed next to the anode side of the emitter layer thereof.

The thickness of an electron blocking layer according to the present invention ranges preferably from 3 to 100 nm and more preferably from 5 to 30 nm.

The above-mentioned materials used for the hole transport layer are preferably used as materials used for the electron blocking layer. In addition, materials used as the above-mentioned host compounds and other host compounds according to the present invention are also preferably used for the electron blocking layer.

<<Hole Injection Layer>>

A hole injection layer (sometimes referred to as an "anode buffer layer") according to the present invention refers to a layer interposed between an anode and an emitter layer so as to decrease an operation voltage and increase light emission luminance and is described in detail in the second chapter "Electrode Materials" (pages 123 to 166) of the "Organic EL elements and Their Industrialization Front Line (published by NTS Inc. on Nov. 30, 1998)", the Second Edition.

A hole injection layer according to the present invention may be provided as needed and may be present between an anode and an emitter layer, as described above, or between an anode and a hole transport layer.

The hole injection layer is detailed in, for instance, JP09-45479A, JP09-260062A, and JP08-288069A. Examples of materials used for the hole injection layer include the above-mentioned materials used for the hole transport layer.

Among them, preferred are: phthalocyanine derivatives represented by copper phthalocyanine; hexaazatriphenylene derivatives described in JP2003-519432A and JP2006-135145A; metal oxides represented by vanadium oxide; conductive polymers such as amorphous carbon, polyaniline (emeraldine), polythiophene; ortho-metalized complexes represented by tris(2-phenylpyridine)iridium complexes; or triarylamine derivatives.

The above materials used for the hole injection layer may be used singly or in combination of two or more.

<<Contents>>

The above-mentioned organic layers according to the present invention may further include another content(s).

Examples of the contents include: halogen elements such as bromine, iodine, and chlorine or their halides; alkali metals or alkaline-earth metals such as Pd, Ca, Na; and transition metal compounds, complexes, and salts.

The amount of content may be optionally determined and is preferably 1000 ppm or less, more preferably 500 ppm or less, and still more preferably 50 ppm or less with respect to the total mass % of the layer having the content.

Provided that in order to improve electron and/or hole transport capabilities and make the energy transfer of excitons efficient, the amount may not be within this range.

<<Process for Forming Organic Layers>>

Any know procedure may be preferably employed as a method for producing an organic electroluminescent element having a luminescent film of the present invention. A particularly preferable embodiment involves the luminescent film formed by using a wet process or a dry process.

The following describes a process for forming organic layers (e.g., a hole injection layer, a hole transport layer, an electron blocking layer, an emitter layer, a hole blocking layer, an electron transport layer, an electron injection layer).

The process for forming organic layers according to the present invention is not particularly limited. Known conventional formation processes such as dry processes such as vacuum vapor deposition or wet processes may be used. In addition, depending on materials such as compounds used for each layer, the wet processes and the dry processes are selectively used to stack the layers, so that the organic layer may be formed in such a process. Here, it is preferable that the organic layers are layers formed by a wet process. That is, the wet process is preferably used to produce an organic EL element. When the organic EL element is produced by a wet process, advantageous effects can be exerted such that a uniform film (coating film) may be obtained easily and pinholes are unlikely to be generated. Note that the film (coating film) herein refers to a dry-state one after coated by a wet process.

Examples of the wet process include spin coating, casting, inkjet technique, printing, die coating, blade coating, roll coating, spray coating, curtain coating, and LB method (Langmuir-Blodgett method). From the viewpoints of easy-to-produce uniform thin film and high productivity, preferred are roll-to-roll processing applicable processes such as die coating, roll coating, inkjet technique, or spray coating.

Note that examples of the dry process include vapor deposition (e.g., resistance heating, EB process), sputtering, and CVD.

Examples of liquid solvents used to dissolve or disperse an organic EL material according to the present invention include: ketones such as methyl ethyl ketone, cyclohexanone; fatty acid esters such as ethyl acetate; halogenated hydrocarbons such as dichlorobenzene; aromatic hydrocarbons such as toluene, xylene, mesitylene, cyclohexyl benzene; aliphatic hydrocarbons such as cyclohexane, decalin, dodecane; and organic solvents such as DMF and DMSO.

Meanwhile, as the dispersion method, dispersion procedures such as ultrasonic dispersion, high shearing force dispersion, and media dispersion may be used.

Further, different film formation processes are applicable to the respective layers. When vapor deposition is employed for the film formation, the vapor deposition conditions are different depending on, for instance, the kinds of compounds used. Generally, it is desirable to suitably select the conditions such that the boat heating temperature is from 50 to 450° C., the degree of vacuum is from $10^{-6}$ to $10^{-2}$ Pa, the vapor deposition rate is from 0.01 to 50 nm/sec, the substrate temperature is from −50 to 300° C., and the thickness is from 0.1 to 5 μm and preferably from 5 to 200 nm.

To form organic layers according to the invention, it is preferable to thoroughly produce layers from a hole injection layer to a cathode at once under vacuum. However, the layers may be collected at an intermediate time point and a different film formation process may be applied thereto. At that time, the manipulation is preferably conducted under a dry inert gas atmosphere.

<<Anode>>

Regarding an anode in the organic EL element, a metal, alloy, or electrically conductive compound with a large work function (4 eV or higher and preferably 4.5 V or higher) or a mixture thereof is preferably used as an electrode substance. Specific examples of such an electrode substance include: metals such as Au; and conductive transparent materials such as CuI, indium-tin oxide (ITO), $SnO_2$, and ZnO. In addition, it is possible to use materials, such as IDIXO($Ir_2O_3$—ZnO), that can be used to produce an amorphous transparent conductive film.

Regarding the anode, a thin film may be formed by a process such as vapor deposition or sputtering using such an electrode substance and a pattern with a desired shape may then be formed by photolithography. Alternatively, when pattern precision is not strictly necessary (about 100 μm or more), a mask with a desired shape may be used to form a pattern at the time of vapor deposition or sputtering using the above electrode substance.

In addition, when a coatable substance such as an organic conductive compound is used, it is possible to use a wet film formation process such as printing or coating. When light emission is extracted from this anode, it is desirable that the transmittance is made 10% or larger; and the sheet resistance of the anode is preferably several hundred Ω/sq. or lower.

Depending on the material, the thickness of the anode is selected from ranges usually from 10 nm to 1 μm and preferably from 10 to 200 nm.

<<Cathode>>

Regarding the cathode, a metal (referred to as an electron injectable metal), alloy, or electrically conductive compound having a small work function (4 eV or less) or a mixture thereof may be used as an electrode substance. Specific examples of such an electrode substance include sodium, sodium-potassium alloys, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, aluminum, and rare earth metals. Among them, from the viewpoints of electron injectability and oxidation endurance, etc., preferred is a mixture of an electron injectable metal and a second metal that is a stable metal having a work function value larger than that of the former metal. Examples include a magnesium/silver mixture, a magnesium/aluminum mixture, a magnesium/indium mixture, an aluminum/aluminum oxide ($Al_2O_3$) mixture, a lithium/aluminum mixture, and aluminum.

The cathode may be produced by forming a thin film by a process such as vapor deposition or sputtering using the above electrode substance. In addition, the sheet resistance of the cathode is preferably several hundred Ω/sq. or less; and the thickness is usually selected from ranges from 10 nm to 5 μm and preferably from 50 to 200 nm.

Note that if either the anode or the cathode of the organic EL element is transparent or semi-transparent so as to make emitted light permeate therethrough, the light emission luminance is increased and is thus favorable.

Meanwhile, the above metal may be placed at a thickness of 1 to 20 am on a cathode and a conductive transparent material, which is listed in the description of the anode, may then be placed thereon to prepare a transparent or semi-transparent cathode. This process is applied to prepare an element in which both the anode and the cathode have transparency.

<<Support Substrate>>

A support substrate (hereinafter, sometimes referred to as a base body, substrate, base material, or support body) that can be used for an organic EL element of the present invention may be transparent or opaque while the kinds, such as glass or plastic, are not particularly limited. When light is extracted from the support substrate side, the support substrate is preferably transparent. Examples of a preferably used transparent support substrate include glass, quartz substrates, and transparent resin films. A particularly preferred support substrate is a resin film that can give the organic EL element flexibility.

Examples of the resin film material include: polyesters such as polyethylene terephthalate (PET), polyethylene naphthalate (PEN); cellulose esters or derivatives thereof such as polyethylene, polypropylene, cellophane, cellulose diacetate, cellulose triacetate (TAC), cellulose acetate butyrate, cellulose acetate propionate (CAP), cellulose acetate phthalate, cellulose nitrate; and polyvinylidene chloride, polyvinyl alcohol, polyethylene vinyl alcohol, syndiotectic polystyrene, polycarbonate, norbornene resins, polymethylpentene, polyether ketone, polyimide, polyethersulfone (PES), polyphenylene sulfide, polysulfones, polyetherimide, polyetherketoneimide, polyamide, fluorine resins, nylon, polymethylmethacrylate, acryl or polyarylates, and cycloolefin-based resins such as ARTON (trade name; manufactured by JSR Inc.) and APEL (trade name; manufactured by Mitsui Chemicals, Inc.).

The resin film surface may have, as a gas barrier layer, a film made of an inorganic matter or organic matter or a hybrid film made of the both. Such a gas barrier layer is provided in order to prevent infiltration of those causing the element to deteriorate, such as moisture content or oxygen.

The gas barrier layer-forming material may be a material with a function of preventing infiltration of those causing the element to deteriorate, such as moisture content or oxygen. Examples of the material that can be used include silicon oxide, silicon dioxide, and silicon nitride. Further, to improve the friability of the film, it is more preferable to have a structure in which the above inorganic layer and an organic material-made layer are stacked. The order of how the inorganic layer and the organic layer are stacked is not particularly limited and it is preferable that the inorganic layer and the organic layer are alternately stacked multiple times.

Examples of the gas barrier layer formation process used include, but are not particularly limited to, vacuum vapor deposition, sputtering, reactive sputtering, molecular beam epitaxy, cluster ion-beam technique, ion plating, plasma polymerization, atmospheric plasma polymerization, plasma CVD, laser CVD, thermal CVD, and coating. Particularly preferred is atmospheric plasma polymerization described in Japanese Patent Laid-Open No. 2004-68143.

Examples of the opaque support substrate include: aluminum or stainless metal plates and films; opaque resin substrates; and ceramic-made substrates.

The external quantum efficiency at room temperature of light emission from an organic EL element of the present invention is preferably 1% or higher and more preferably 5% or higher.

Here, external quantum efficiency (%)=the number of photons emitted outside the organic EL element/the number of electrons flowing through the organic EL element/100.

In addition, it is possible to together use, for instance, a color phase-improving filter such as a color filter or a color conversion filter for converting the luminescent color of the organic EL element to multicolor by using a phosphor.

<<Sealing>>

Examples of a sealing means used to seal an organic EL element of the present invention include a process for bonding a sealing member to an electrode or support substrate by using an adhesive. The sealing member may be placed so as to cover a display area of the organic EL element and may be like a recessed or flat plate. Meanwhile, neither its transparency nor electric insulation is particularly limited.

Examples include glass plates, polymer plates and films, and metal plates and films. Examples of the glass plate material include, in particular, soda-lime glass, barium/strontium-containing glass, lead glass, aluminosilicate glass, borosilicate glass, barium borosilicate glass, and quartz. In addition, examples of the polymer plate material include polycarbonate, acryl, polyethylene terephthalate, polyether sulfide, and polysulfone. Examples of the metal plate material include: one or more metals selected from the group consisting of stainless, iron, copper, aluminum, magnesium, nickel, zinc, chromium, titanium, molybdenum, silicon, germanium, and tantalum; and alloys thereof.

As used herein, because the organic EL element can be made a thinner film, a polymer film and/or a metal film may be preferably used. Further, the polymer film is preferably a gas-barrier film (i.e., a gas barrier layer) having gas barrier properties such as a water vapor transmittance (WVTR) of 0.001 to 1 g/(m$^2$·day), as measured by the protocol according to JIS K 7129-1992, and an oxygen transmittance (OTR) of 0.001 to 1 mL/(m$^2$·day·atm), as measured by the protocol according to JIS K 7126-1987. The WVTR of the above polymer film ranges more preferably from 0.01 to 1 g/(m$^2$·day) and the OTR thereof ranges more preferably from 0.01 to 1 mL/(m$^2$·day·atm).

The sealing member may be processed, like a recessed shape, by using sand blasting, chemical etching, etc.

Specific examples of the adhesive include: a reactive vinyl group-containing photo-curable and thermo-curable adhesives such as acrylic acid-based oligomers, methacrylic acid-based oligomers; and moisture-curable adhesives such as 2-cyano acrylic acid ester. In addition, the examples can also include epoxy-based thermo- and chemical-curable (two liquid-mixing) ones. In addition, the examples can also include hot-melt polyamides, polyesters, and polyolefins. In addition, the examples can also include cation-curable, UV-curable epoxy resin adhesives.

Note that the organic EL element may deteriorate due to heat treatment. In this case, the adhesive may be preferably cured at a temperature from room temperature to 80° C. Also, a desiccant may be dispersed in the above adhesive. The adhesive may be coated on a sealing portion by using a commercially available dispenser or by printing such as screen printing.

In addition, it is possible to suitably coat an electrode and organic layers, which electrode is on the opposite side of a support substrate and which organic layers are sandwiched therebetween, such that the outside thereof is provided with, as a sealing film, inorganic and/or organic material-made layer(s) while the layer(s) is in contact with the support substrate. In this case, the film-forming material may be a material with a function of preventing infiltration of those causing the element to deteriorate, such as moisture content or oxygen. Examples of the material that can be used include silicon oxide, silicon dioxide, and silicon nitride.

Further, to improve the friability of the film, it is preferable to have a structure in which the above inorganic or organic material-made layers are stacked. Examples of the film formation process that can be used include, but are not particularly limited to, vacuum vapor deposition, sputtering, reactive sputtering, molecular beam epitaxy, cluster ion-beam technique, ion plating, plasma polymerization, atmospheric plasma polymerization, plasma CVD, laser CVD, thermal CVD, and coating.

It is preferable to inject, into a gap between the sealing member and a display area of the organic EL element, inert gas such as nitrogen or argon and/or inert liquid such as fluorinated hydrocarbon or silicon oil as gas and liquid phases. In addition, vacuum is allowed. Also, a hygroscopic compound may be sealed inside thereof.

Examples of the hygroscopic compound include: metal oxides (e.g., sodium oxide, potassium oxide, calcium oxide, barium oxide, magnesium oxide, aluminum oxide); sulfates (e.g., sodium sulfate, calcium sulfate, magnesium sulfate, cobalt sulfate); metal halides (e.g., calcium chloride, magnesium chloride, cesium fluoride, tantalum fluoride, cerium bromide, magnesium bromide, barium iodide, magnesium iodide); and perchloric acids (e.g., barium perchlorate, magnesium perchorate). Anhydrous salts are suitably used as the sulfates, metal halides, and perchloric acids.

<<Protective Film and Protective Plate>

To increase the mechanical strength of the element, a protective film or protective plate may be disposed outside the sealing membrane or the sealing film which is provided on the opposite side of the support substrate such that the organic layers are sandwiched therebetween. When the sealing is performed using the above sealing membrane, the mechanical strength is not necessarily high. Thus, it is preferable to provide such a protective film or a protective plate. Examples of the material that can be used for this include glass plates, polymer plates and films, and metal plates and films like those used for the sealing. Preferred are polymer films in view of making them weigh lighter and thinner.

<<Light Extraction-improving Technology>>

Generally, the organic electroluminescent element emits light inside a layer with a higher refractive index (refractive index ranging from about 1.6 to 2.1) than the air; and only about 15% to 20% of the light generated in the emitter layer can be extracted. This is because light incident at the angle θ equal to or larger than the critical angle on the interface (interface between a transparent substrate and the air) cannot be extracted outside the element due to the occurrence of total reflection; and the total reflection of light occurs between the transparent substrate and a transparent electrode to an emitter layer and the light wave travels through the transparent electrode to the emitter layer, so that the resulting light escapes in the element lateral surface direction.

Examples of a technique for improving this light extraction efficiency include: a method for forming roughness on a surface of a transparent substrate and preventing total reflection on an interface between the transparent substrate and the air (e.g., U.S. Pat. No. 4,774,435); a method for providing a substrate with a light-condensing property to increase the efficiency (e.g., Japanese Patent Laid-Open No. 63-314795); a method for forming a reflection surface on, for instance, a lateral surface of an element (e.g., Japanese Patent Laid-Open No. 01-220394); a method for introducing a flat layer with an intermediate refractive index between a substrate and a light-emitting body to form an antireflection film (e.g., Japanese Patent Laid-Open No. 62-172691); a method for introducing, between a substrate and a light-emitting body, a flat layer with a lower refractive index than the substrate (e.g., Japanese Patent Laid-Open No. 2001-202827); and a method for forming a diffraction grating between any layers of a substrate, a transparent electrode, and an emitter layer (or on an interface between the substrate and the outside) (Japanese Patent Laid-Open No. 11-283751).

In the present invention, each of the above methods may be combined with an organic EL element of the present invention. Suitably used is a method for introducing, between a substrate and a light-emitting body, a flat layer with a lower refractive index than the substrate or a method for forming a diffraction grating between any layers of a substrate, a transparent electrode, and an emitter layer (or on an interface between the substrate and the outside.

In the present invention, the above means may be combined to produce an element having further higher luminance and excellent durability.

A medium with a low refractive index may be formed, between the transparent electrode and the transparent substrate, at a thickness that is longer than the wavelength of light. In this case, as the refractive index of the medium becomes lower, the external extraction efficiency of the light coming from the transparent electrode increases.

Examples of a material for the layer with a low refractive index include aerogels, porous silica, magnesium fluoride, and fluorine-containing polymers. The refractive index of the transparent substrate typically ranges from about 1.5 to 1.7. Preferably, the layer with a low refractive index has a refractive index of about 1.5 or less. More preferred is about 1.35 or less.

In addition, it is desirable that the thickness of the medium with a low refractive index is two or more times the wavelength in the medium. This is because when the thickness of the medium with a low refractive index is a thickness allowing an evanescent electromagnetic wave with approximately a light wavelength to be incident on the substrate, less effects of the layer with a low refractive index are exerted.

A method for introducing a diffraction grating on an interface where total reflection occurs or in any of the media is characterized by a high effect of improving light extraction efficiency. This method takes advantage of a characteristic where a diffraction grating can change the direction of light to a specific direction different from that of reflection by means of primary diffraction and/or secondary diffraction, namely Bragg diffraction. Then, light that cannot go out due to total reflection between the layers among the light emitted from the emitter layer is made to be subject to light diffraction because the diffraction grating has been introduced between any layers or in the medium (in the transparent substrate and/or in the transparent electrode) so as to extract the light to the outside.

The diffraction grating to be introduced desirably has a two-dimensional periodic refractive index. This is because the light emitted from the emitter layer occurs randomly in every direction. In a common one-dimensional diffraction grating just having a periodic refractive index distribution only in a certain direction, light traveling in a specific direction can just be diffracted, so that the light extraction efficiency is not increased considerably.

However, when the refractive index distribution is a two-dimensional distribution, light traveling in any direction can be diffracted, so that the light extraction efficiency increases.

Regarding the position where the diffraction grating is introduced, the diffraction grating may be provided between any layers or in any medium (in the transparent substrate or the transparent electrode). The position is desirably at or near the organic emitter layer where light occurs. At this time, the period of the diffraction grating is preferably about ½ to 3 times the wavelength of light in the medium. Examples of how the diffraction grating is arranged include square lattice-like, triangular lattice-like, and honeycomb lattice-like arrangements. It is preferable to two-dimensionally repeat such an arrangement.

<<Light Condensing Sheet>>

An organic EL element of the present invention may be processed such that, for instance, a structure on a microlens array is provided on the light extraction side of a support substrate (substrate). Alternatively, what is called a light condensing sheet may be combined therewith. Accordingly, light can be condensed in the front direction relative to, for instance, the element luminescent surface. In this way, luminance in a specific direction can be made higher.

In the microlens array, for instance, quadrangular pyramids are two-dimensionally arranged on the light extraction side of the substrate such that the side is 30 μm and the vertical angle is 90 degrees. The side preferably ranges from 10 to 100 μm. If the side is smaller than that, a diffraction effect occurs to exhibit coloring. If the side is larger than that, the thickness is too thick and not preferable.

As the light condensing sheet may be used those that have been put into practice and used for, for example, LED backlights of liquid crystal display devices. Examples of such a sheet that can be used include brightness-enhancing films (BEF) manufactured by Sumitomo 3M Limited. Regarding the shape of the prism sheet, for instance, a substrate may be provided with A-shaped stripes of which the vertical angle is 90 degrees and the pitch is 50 μm. The vertex may be rounded; the pitch may be randomly changed; and other shapes may also be allowed.

In addition, to control the radiation angle of light from the organic EL element, a light diffusion plate or film may be used in combination with the light condensing sheet. For instance, a (light-up) diffusion film manufactured by Kimoto, Co., Ltd., may be used.

<<Applications>>

Organic EL elements of the present invention may be used for display devices, displays, or various emission light sources.

Examples of the emission light sources include: but are not limited to, light sources of lighting systems (home lights, vehicle lights), backlights for watches or liquid crystal displays, advertising signboards, traffic signals, or optical storage media; light sources of electrophotographic copiers; light sources of optical communication instruments; and light sources of optical sensors. Applications as light sources for backlights of liquid crystal display devices or lighting systems, in particular, are used effectively.

For an organic EL element of the present invention, patterning, if necessary, may be carried out by using, for instance, a metal mask or an inkjet printing at the time of film formation. In the case of the patterning, only an electrode may be subject to patterning; an electrode and an emitter layer may be subject to patterning; or all the element layers may be subject to patterning. Known conventional methods may be used to produce the element.

<<Display Device>>

Based on drawings, the following describes an example of a display device having an organic EL element of the present invention.

FIG. 4 is a perspective view schematically illustrating the constitution of a display device containing an organic EL element according to an example of the present invention. This schematic view shows, for instance a mobile phone display that can utilize light emission of the organic EL element to display image information. As shown in FIG. 4, a display 1 includes: a display part A having a plurality of pixels; and a controlling part B configured to perform scanning for the image on the display part A, based on the image information.

The controlling part B is electrically connected to the display part A. The controlling part B sends, based on external image information, scanning signals and image data signals to each of a plurality of pixels. As a result, each pixel, depending on the scanning signals, sequentially emits light in response to the image data signals provided per scanning line, so that the image information is displayed on the display part A.

Figure 5:
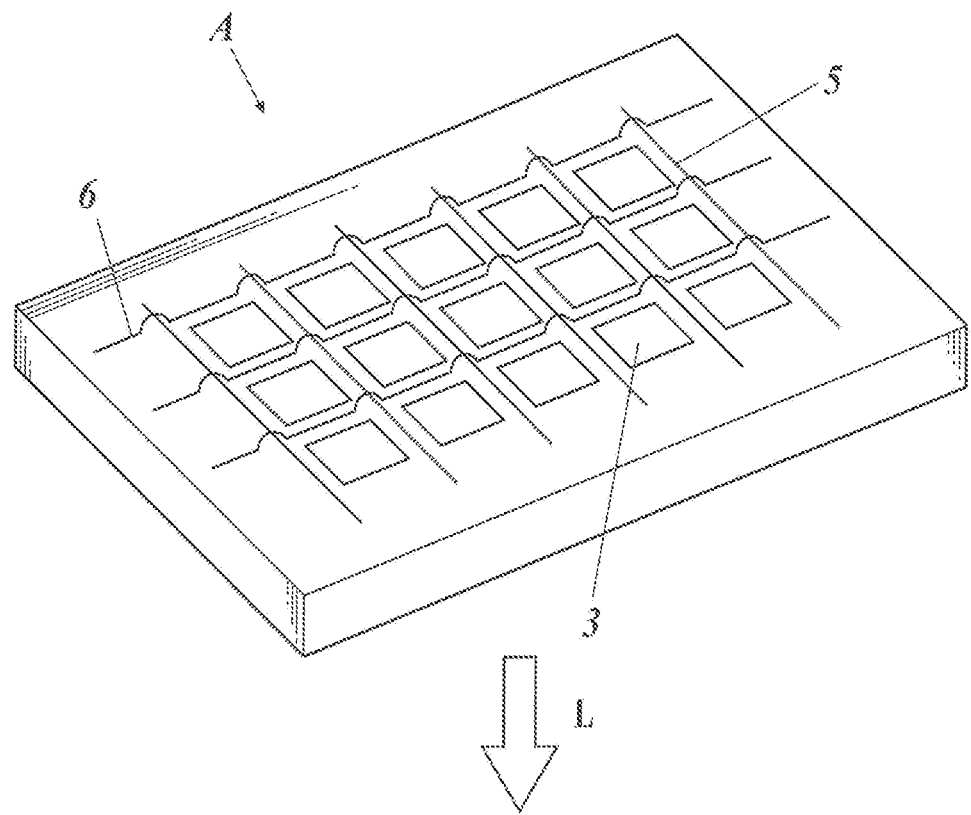
FIG. 5 is a schematic view of a display part A shown in FIG. 4.

FIG. 5 is a schematic view of the display part A shown in FIG. 4.

The display part A includes: on a substrate, a wiring part containing a plurality of scanning lines 5 and data lines 6; and a plurality of pixels 3.

The main members of the display part A are described below.

FIG. 5 shows the case where light emitted by the pixels 3 is extracted (downwardly) in the white arrow direction. The plurality of scanning lines 5 and data lines 6 of the wiring part are each composed of electrically conductive material. The scanning line 5 and the data line 6 are perpendicular to each other and are like a grid. Then, each grid is positioned at and connected to the pixel 3 (the details are not shown).

Once the scanning line 5 is used to transmit scanning signals, the pixels 3 receive image data signals from the data line 6 to emit light in accordance with the image data received.

Pixels within a range of a red luminescent color, pixels within a range of a green luminescent color, and pixels within a range of a blue luminescent color are appropriately arranged in parallel on the same substrate to allow for a full-color display.

<<Lighting Apparatus>>

The following describes a lighting apparatus according to an embodiment of the present invention, which apparatus includes an organic EL element of the present invention.

Figure 6:
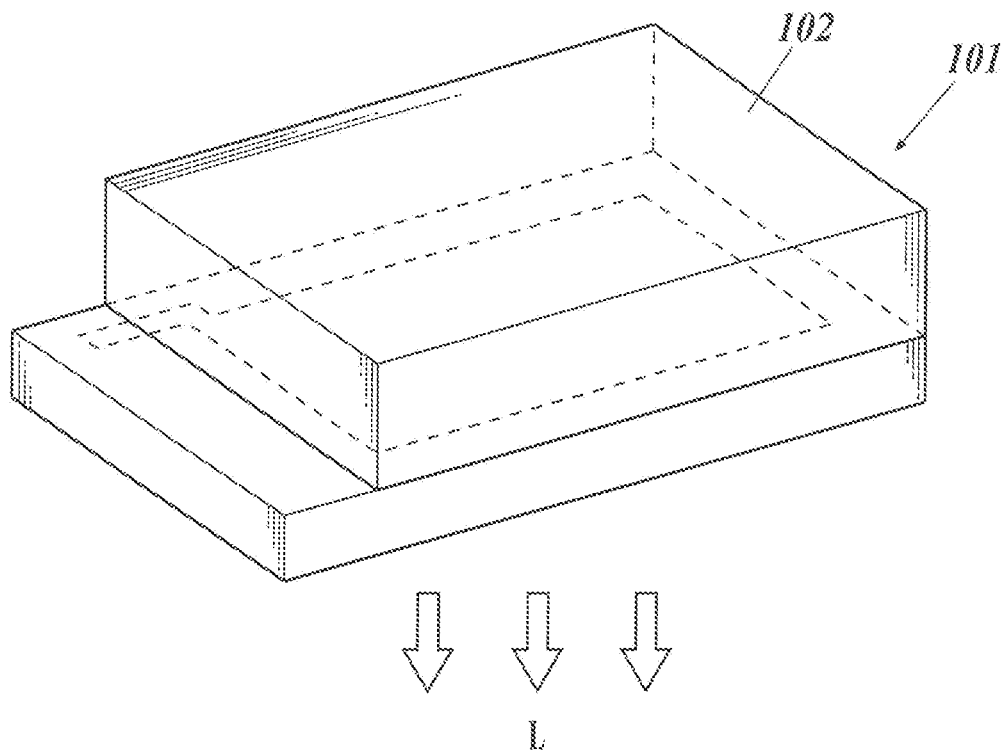
FIG. 6 is a schematic view of a lighting apparatus according to the present invention.
Figure 7:
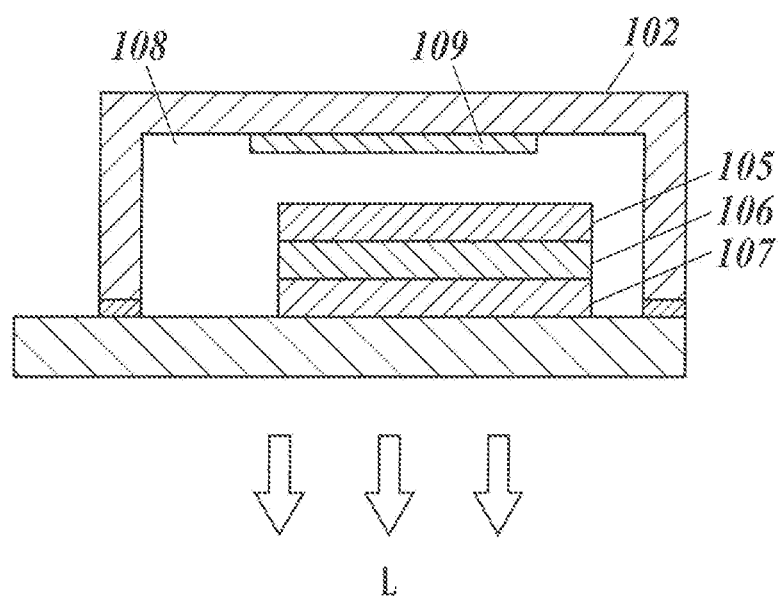
FIG. 7 is a cross-sectional view of the lighting apparatus according to the present invention.

A lighting apparatus shown in FIG. 6 and FIG. 7 may be formed such that a non-luminescent surface of an organic EL element of the present invention is covered with a glass case; a glass substrate at a thickness of 300 μm is used as a base material for sealing; an epoxy-based photo-curable adhesive (LUXTRACK LC0629B; manufactured by TOAGOSEI CO., LTD.) is applied therearound as a sealant; this structure is stacked on a cathode so as to tightly attach to a transparent support substrate; and the resulting structure is irradiated with UV light from the glass substrate side and is thus cured and sealed.

FIG. 6 is a schematic view of the lighting apparatus in which an organic EL element 101 of the present invention is covered with a glass cover 102 (note that the glass cover sealing manipulation should be conducted in a glove box under a nitrogen gas atmosphere (under a highly pure nitrogen gas atmosphere with a purity of 99.999% or higher) while the organic EL element 101 is not in contact with the air).

FIG. 7 is a cross-sectional view of the lighting apparatus. In FIG. 7, illustrated are a cathode 105, an organic EL layer (light-emitting unit) 106, and a transparent electrode-attached glass substrate 107. Note that the inside of a glass cover 102 is filled with nitrogen gas 108 and is provided with a water scavenger 109.

<<Organic Material Composition>>

A host compound, a blue phosphorescent compound, and a blue fluorescent compound included in a luminescent film of the present invention may be suitably employed in an organic material composition.

Specifically, there may be provided an organic material composition including a host compound, a blue phosphorescent compound and a blue fluorescent compound, wherein the emission spectrum of the blue phosphorescent compound and the absorption spectrum of the blue fluorescent compound have portions overlapping with each other;

the shortest wavelength-side maximum emission wavelengths of the blue phosphorescent compound (abbreviated as "BPM" in the expression) and the blue fluorescent compound (abbreviated as "BFM" in the expression) satisfy the following expression (1); and light emission derived from the blue fluorescent compound is detected.

$$\lambda_{BFM} \pm \lambda_{BPM} \qquad \text{expression (1):}$$

wherein $\lambda_{BFM}$ represents the shortest wavelength-side maximum emission wavelength of the blue fluorescent compound; and $\lambda_{BPM}$ represents the shortest wavelength-side maximum emission wavelength of the blue phosphorescent compound.

The organic material composition according to the present invention may be dissolved or dispersed in a liquid medium into which the above-described organic EL materials, for example, are dissolved or dispersed. Accordingly, the organic material composition according to the present invention may be suitably employed when the emitter layer is formed by a wet process and a luminescent film of the present invention may also be produced suitably.

Note that embodiments applicable to the present invention are not limited to the above-mentioned embodiments and can be appropriately modified without departing from the spirit of the present invention.

For instance, there may be provided an organic electroluminescent element, wherein an emitter layer contains a host compound and a blue phosphorescent compound according to the present invention;

a layer adjacent to the emitter layer contains a blue fluorescent compound according to the present invention;

the emission spectrum of the blue phosphorescent compound and the absorption spectrum of the blue fluorescent compound have portions overlapping with each other;

the shortest wavelength-side maximum emission wavelengths of the blue phosphorescent compound (abbreviated as "BPM" in the expression) and the blue fluorescent compound (abbreviated as "BFM" in the expression) satisfy the above-described expression (1);

and light emission derived from the blue fluorescent compound is detected. This makes longer the distance between the blue fluorescent compound and the blue phosphorescent compound, resulting in suppression of Dexter energy transfer. This can also suppress a decrease in the element lifetime.

In this case, the layer adjacent to the emitter layer is not particularly limited as long as the layer is adjacent to the emitter layer. Examples include, but are not limited to, a hole transport layer and an electron transport layer.

Specifically, when a fluorescent compound is added to the hole transport layer, for instance, a portion of the hole transport layer next to the emitter layer may be provided as a mixed layer of the hole transport layer and the fluorescent compound.

Note that the host compound, the blue phosphorescent compound, and the blue fluorescent compound included in the emitter layer and the emitter layer-adjacent layer of the organic electroluminescent element of such an embodiment are a host compound, a blue phosphorescent compound, and a blue fluorescent compound used for a luminescent film of the present invention.

In addition, an embodiment of the present invention may provide an organic electroluminescent element including the above emitter layer between an anode and a cathode, wherein the emitter layer contains a blue phosphorescent compound and a blue fluorescent compound; the emission spectrum of the blue phosphorescent compound and the absorption spectrum of the blue fluorescent compound have portions overlapping with each other, the emission decay time τ of the emitter layer/monolayer (i.e., the blue fluorescent compound-containing luminescent film) satisfies the following expression (A1); the absolute quantum efficiency PLQE of the emitter layer/monolayer satisfies the following expression (A2); and the phosphorescent compound and the fluorescent compound satisfy the following expression (A3) or the following expression (A4). Note that in elements where conventional luminescent materials are used singly, the roll-off is increased ($J_0$ is decreased) and/or the acceleration factor is increased at the time of electric field operation under high luminance and high current density. This causes the luminosity to decrease and the element lifetime to decrease markedly. In this embodiment, excitons generated through the blue phosphorescent compound are transferred to the blue fluorescent compound by Förster energy transfer. This enables radiative deactivation such that the excitons are subject to immediate light emission and can suppress the roll-off (increase $J_0$) and suppress an increase in the acceleration factor. Note that $J_0$ refers to a current density at which the EQE of the organic EL element is a value half the maximum EQE achieved by increasing the current density.

$$0 < \tau/\tau_0 \leq 0.7 \qquad (A1)$$

$$0.6 \leq PLQE/PLQE_0 \leq 1 \qquad (A2)$$

$$HOMO(F) \leq HOMO(P) \qquad (A3)$$

$$LUMO(P) \leq LUMO(F) \qquad (A4)$$

wherein τ: emission decay time of the emitter layer/monolayer;

$\tau_0$: emission decay time of a film containing the phosphorescent compound alone (i.e., a blue fluorescent compound-free luminescent film);

PLQE: absolute quantum efficiency of the emitter layer/monolayer;

$PLQE_D$: absolute quantum efficiency of the film containing the phosphorescent compound alone;

HOMO (P), LUMO (P): the highest occupied molecular orbital (HOMO) and the lowest unoccupied molecular orbital (LUMO), respectively, of the phosphorescent compound; and HOMO (F), LUMO (F): the highest occupied molecular orbital (HOMO) of the fluorescent compound and the lowest unoccupied molecular orbital (LUMO) of the fluorescent compound, respectively.

[Explanation of Expressions (A1) to (A4)]

<Expression (A1)>

It has been known that inclusion of a phosphorescent compound and a fluorescent compound into an emitter layer can shorten the emission decay time of the phosphorescent compound.

Here, the shorter emission decay time of the phosphorescent compound means more rapid consumption of the triplet excitation energy of the phosphorescent compound. However, the present inventors have found that when the emission decay time of the present inventors is shortened to 0.7 or less ($\tau/\tau_0$), the effect of lowering the acceleration factor of the half-life of the organic EL element is large.

Note that when the value is larger than 0 in the present invention, a smaller $\tau/\tau_0$ is better.

<Expression (A2)>

Mixing of the fluorescent compound with the phosphorescent compound may cause Dexter energy transfer from the triplet excited state of the phosphorescent compound to the triplet excited state of the fluorescent compound. When the Dexter energy transfer occurs, the triplet excited state of the fluorescent compound is deactivated without emitting light, so that the absolute quantum efficiency (i.e., the absolute quantum efficiency PLQE of the emitter layer/monolayer) decreases.

However, in view of performance of the organic EL element, the higher absolute quantum efficiency PLQE of the emitter layer/monolayer, the more desirable.

Practical phosphorescent compounds should have a high absolute quantum efficiency close to 100% (i.e., the absolute quantum efficiency $PLQE_0$ of the film containing the phosphorescent compound alone). Even when the fluorescent compound is added, a decrease in the absolute quantum efficiency obtained by Dexter energy transfer should be suppressed and the high absolute quantum efficiency should thus be kept.

In light of the above aspects, when the $PLQE/PLQE_0$ ranges from 0.6 to 1.0, it is possible to suitably maintain practical luminescent element performance. Note that in a sense of maintaining (not decreasing) $PLQE_0$ of the phosphorescence alone, the maximum value of $PLQE/PLQE_0$ is 1.

<Expression (A3) or Expression (A4)>

If either expression (A3) or expression (A4) is satisfied, electrons are not directly recombined on the fluorescent compound, so that a decrease in the external quantum efficiency (EQE) can be suppressed suitably.

As described previously, the emission decay time can be measured by using a streak camera C4334 (manufactured by Hamamatsu Photonics K. K.).

In addition, the emission decay time to of the blue fluorescent compound-free luminescent film may be likewise measured with respect to a luminescent film produced in the same manner as the luminescent film of which the emission decay time τ has been measured except that no fluorescent compound is included.

As described previously, a fluorescence lifetime-measuring device (e.g., a streak camera C4334 and a small fluorescence lifetime-measuring device C11367-03 (both manufactured by Hamamatsu Photonics K. K.)) may be used to measure the PLQE.

In addition, the absolute quantum efficiency $PLQE_0$ of the blue fluorescent compound-free luminescent film may be likewise measured with respect to a luminescent film produced in the same manner as the luminescent film of which the PLQE has been measured except that no fluorescent compound is included.

EXAMPLES

Hereinafter, the present invention will be specifically described by referring to Examples. However, the present invention is not limited to them. Note that in Examples, the term "part(s)" or "%" is used, but unless otherwise specified, the term indicates the "part(s) by mass" or "mass %".

Hereinafter, Examples that meet the requirements of the present invention and Comparative Examples without meeting them are exemplified to explain luminescent films and organic electroluminescent elements according to the present invention.

<<Production of Luminescent Films for Evaluation>>

A quartz substrate with a size of 50 mm×50 mm and a thickness of 0.7 mm was subjected to ultrasonic cleaning with isopropyl alcohol, was dried with dry nitrogen gas, and was subjected to UV ozone cleaning for 5 min. Next, this transparent substrate was fixed to a substrate holder of a commercially available vacuum vapor deposition device. Then, each of vapor deposition crucibles of the vacuum vapor deposition device was filled with a "host compound (hereinafter, sometimes simply referred to as a "host compound"), a "blue phosphorescent compound (hereinafter, sometimes simply referred to as a "phosphorescent compound"), or a "blue fluorescent compound (hereinafter, sometimes simply referred to as a "fluorescent compound") so as to provide an optimal amount for production of each element. As the vapor deposition crucibles were used those made of molybdenum material for resistance heating.

After the inside pressure of the vacuum vapor deposition device was reduced to the degree of vacuum of $1\times10^{-4}$ Pa, the host compound was vapor-deposited at a vapor deposition rate of 0.56 Å/sec, the phosphorescent compound was vapor-deposited at a vapor deposition rate of 0.1 Å/sec, and the fluorescent compound was vapor-deposited at a vapor deposition rate of 0.06 Å/sec so as to have 84 volume % of the host compound, 15 volume % of the phosphorescent compound, and 1 volume % of the fluorescent compound. In this way, evaluation-use luminescent films with a film thickness of 30 nm (luminescent films 1-1 to 1-25) were produced.

Various compounds used in the Examples of the present invention are shown below.

[Formula 45]

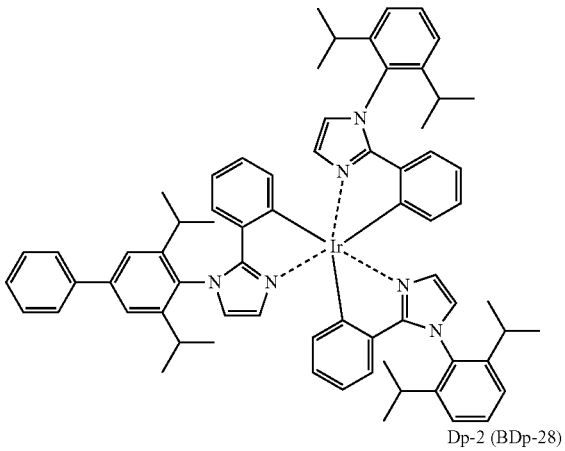

Dp-1 (BDp-11)

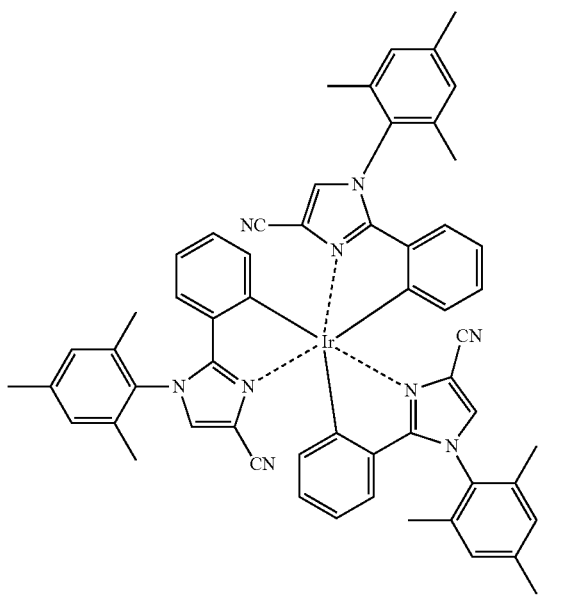

Dp-2 (BDp-28)

-continued
Dp-3 (BDp-29)
[Formula 46]
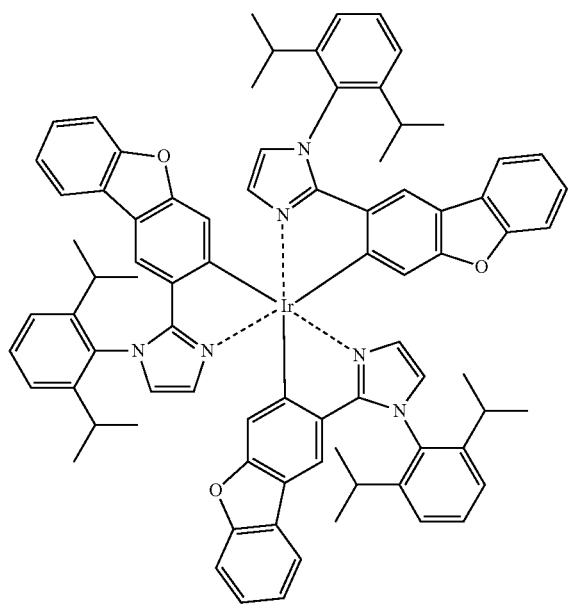
Dp-4 (BDp-23)
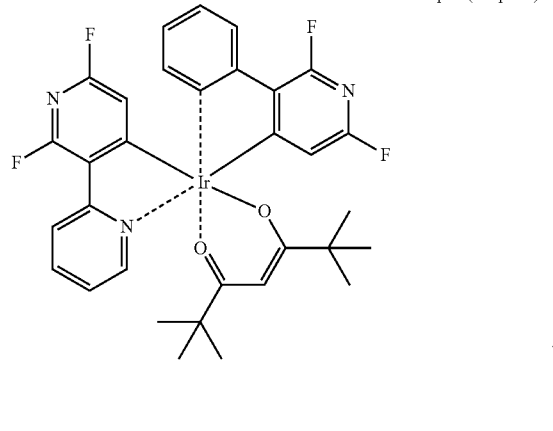
Dp-5 (BDp-2)
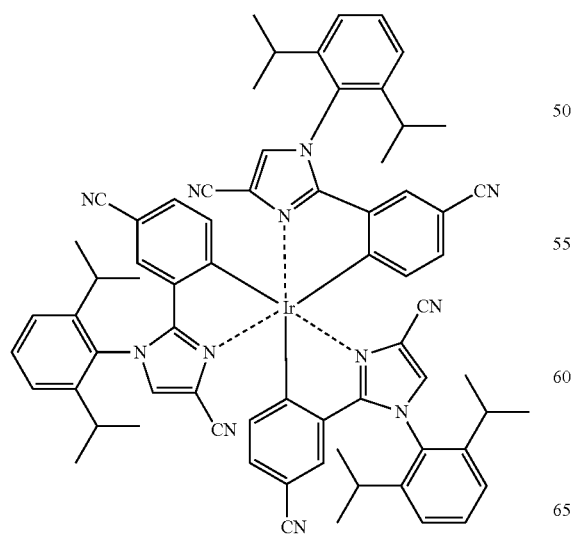
Dp-6 (BDp-9)
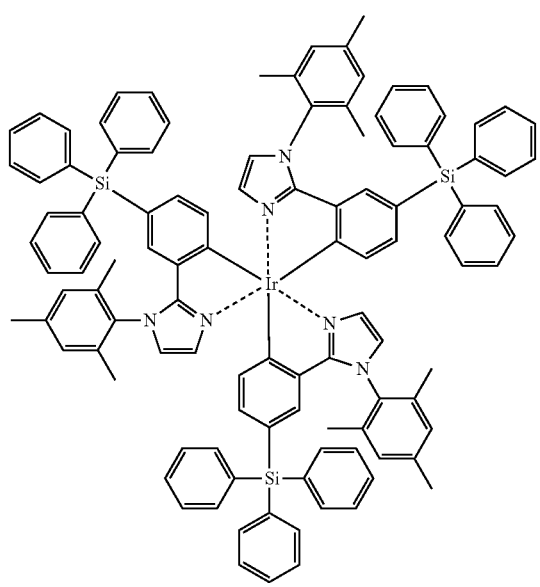
Dp-7 (BDp-8)
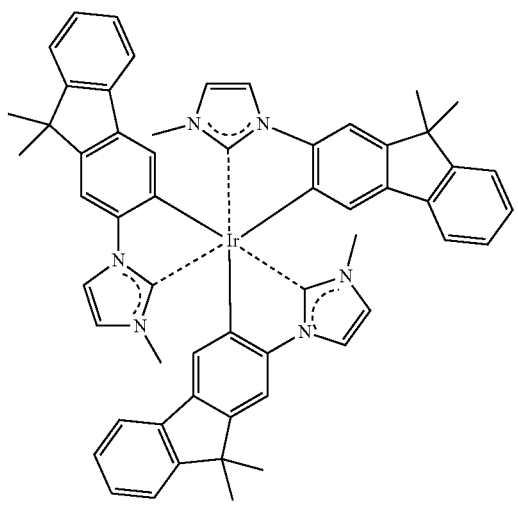
[Formula 47]
F-2
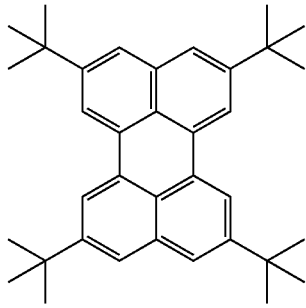

-continued

F-3 (Exemplified compound 6)

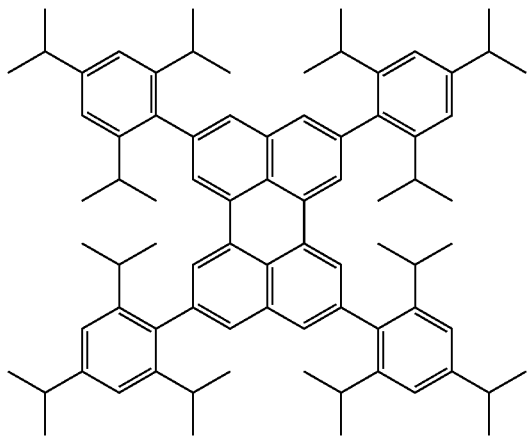

F-4 (Exemplified compound 10)

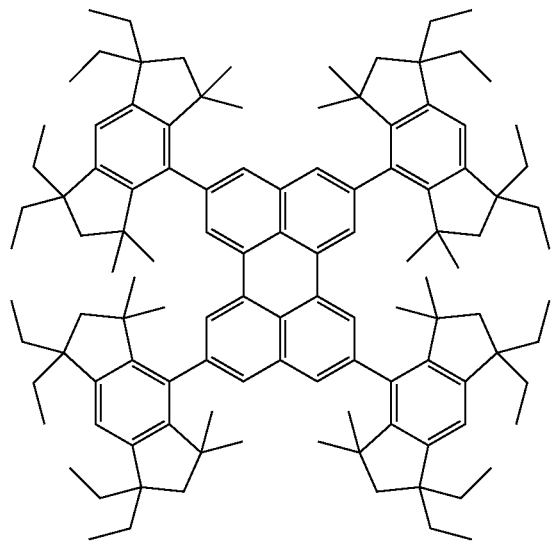

F-5 (Exemplified compound 23)

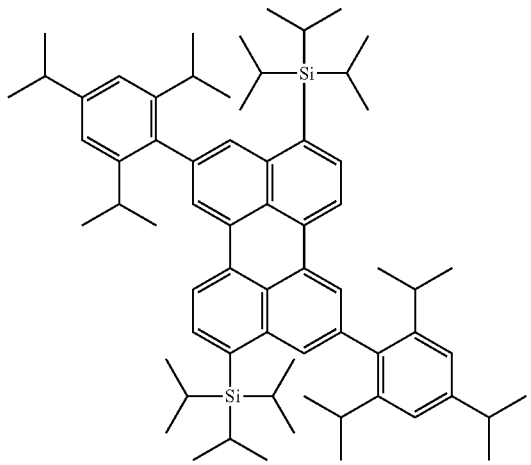

-continued

F-6 (Exemplified compound 34)

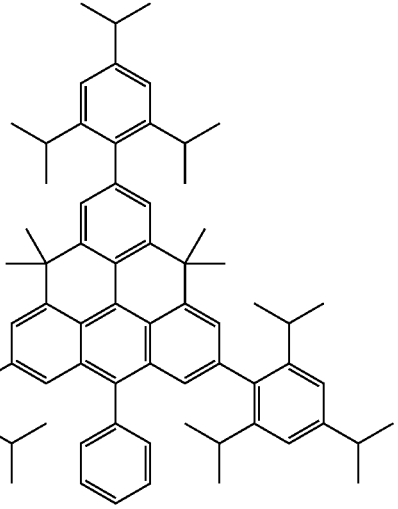

Example 1

In Example 1, compounds assuming the phosphorescent compound and the fluorescent compound were used to produce luminescent films 1-1 to 1-25. $P_F/P_D$ with respect to the overlap integral value was observed. In addition, it was checked whether or not the luminescent film of the present invention exhibited light emission derived from the fluorescent compound, the chromaticity (y value) thereof was capable of being improved, and the PLQE thereof was advantageously maintained.

Note that as a Comparative Example (luminescent film 1-1) was used a combination of which the shortest wavelength-side maximum emission wavelength of the fluorescent compound is present on the wavelength side shorter than the shortest wavelength-side maximum emission wavelength of the phosphorescent compound.

Also note that the luminescent films 1-1 to 1-25 were produced by the above procedure for production of the luminescent films for evaluation. In addition, as the phosphorescent compounds and the fluorescent compounds were used those listed in Table 1. The following H1 was used as the host compound.

[Formula 48]

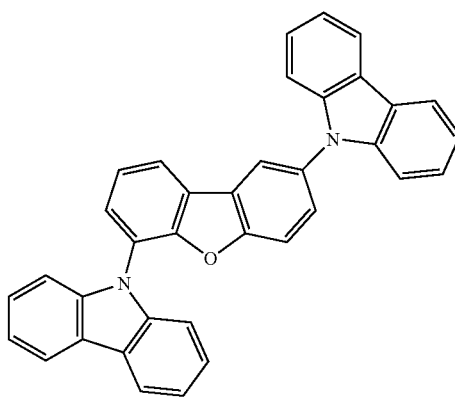

H1

<Evaluation>

Hereinafter, the luminescent films 1-1 to 1-25 were evaluated.

The evaluation procedures are as follows. Note that Table 1 shows the results.

<<Calculation of Efficiency of Energy Transfer from Phosphorescent Compound to Fluorescent Compound>>

Changes in τ and PLQE before and after the fluorescent compound was added and the above expressions (D) were used to calculate each of the energy transfer efficiencies $P_F$ and $P_D$.

(Measurement of Emission Decay Time τ)

The emission decay time τ in the above expressions (D) was calculated by measuring a transient PL characteristic. A small fluorescence lifetime-measuring device C11367-03 (manufactured by Hamamatsu Photonics K. K.) was used to measure the transient PL characteristic. The decay component was measured in TCC900 mode by using 280-nm LED as an excitation light source.

(Measurement of Absolute Quantum Efficiency (PLQE))

An absolute quantum efficiency-measuring device C9920-02 (manufactured by Hamamatsu Photonics K. K.) was used to measure an absolute quantum efficiency. Note that the PLQE (relative value) of Table 1 is a relative value for the PLQE of each of the luminescent films 1-1 to 1-25 with respect to the PLQE of the luminescent film 1-1 while the PLQE of the luminescent film 1-1 was defined as 1.

($P_F/P_D$ Criteria)

The $P_F/P_D$ was evaluated as follows.

○: $P_F/P_D$ was 0.5 or higher (very good, acceptable);

Δ: $P_F/P_D$ was from 0.34 to less than 0.5 (good, acceptable); and x: $P_F/P_D$ was less than 0.34 (poor, unacceptable).

<Emission Spectrum and Absorption Spectrum Measurement>

The emission spectrum and the absorption spectrum were measured as follows.

Note that FIGS. 8A to 8E show, as examples, the emission spectra of the luminescent films 1-1 to 1-5 (in FIG. 8A to FIG. 8E, designated as Dp-1*F-2, Dp-2*F-2, Dp-3*F-2, Dp-4*F-2, and Dp-5*F-2, respectively). The abscissa represents the wavelength (nm) and the ordinate represents the emission intensity and the absorbance (both are in an arbitrary unit).

(Emission Spectrum Measurement)

The emission spectra and the absorption spectra of the luminescent films 1-1 to 1-25 were measured.

An F-7000 model spectrofluorometer manufactured by Hitachi, Ltd., was used to measure an emission spectrum at room temperature (300 K). In addition, a U-3300 spectrophotometer was used to measure an absorption spectrum at room temperature (300 K).

(Absorption Spectrum Measurement)

The absorption spectrum (solution spectrum) of the fluorescent compound was measured as follows.

First, fluorescent compounds included in the luminescent films 1-1 to 1-25 were each dissolved in 2-methyltetrahydrofuran (2m-THF) (without any stabilizer) to prepare a solution at a concentration of $1.0 \times 10^{-5}$ mol/L. The resulting solution was placed in a quartz cell (a rectangular cell with a length of 10 mm). Next, a spectrophotometer (HITACHI spectrophotometer U-3000) was used to measure the absorbance of the solution at a wavelength region ranging from 250 to 500 nm. Then, this was determined as the absorption spectrum of the fluorescent compound (note that the solution temperature was 300 K).

(Chromaticity (y Value) Measurement)

Regarding the color that was emitted by each of the luminescent films 1-1 to 1-25 or a luminescent film containing only the phosphorescent compound, the y value was determined as a color obtained by fitting, to the CIE chromaticity coordinate, the results of measurement using a spectral emission luminance meter CS-1000 (manufactured by Konica Minolta, Inc.) in accordance with FIG. 4.16 in page 108 of "New Handbook of Color Science" (edited by The Color Science Association of Japan, The University of Tokyo Press, 1985). The chromaticity (relative value) of Table 1 is a relative value of the y value for each of the luminescent films 1-1 to 1-25 with respect to the y value for the luminescent film 1-1 while the y value for the luminescent film 1-1 was defined as 1. Note that in the present invention, as the chromaticity (relative value) becomes smaller, the bluishness increases and the chromaticity becomes better.

(Difference in Maximum Wavelength)

Calculated was a difference in the maximum wavelength between the phosphorescent compound and the fluorescent compound included in the luminescent film. The measurement procedure is as follows.

First, the fluorescent compound-free luminescent films Dp-1 to Dp-7 containing the host compound and any one of the phosphorescent compounds Dp-1 to Dp-7 were prepared.

Next, the phosphorescent compound-free luminescent films F-2 to F-6 containing the host compound and any one of the fluorescent compounds F-2 to F-6 were prepared.

Note that the above luminescent films Dp-1 to Dp-7 were prepared using the same procedure as for the above "Production of Luminescent Films for Evaluation" except that the fluorescent compound was not vapor-deposited (the fluorescent compound was at 0 volume % and a decreased portion (1 volume %) of the fluorescent compound was changed to the host compound).

In addition, the above luminescent films F-2 to F-6 were prepared using the same procedure as for the above "Production of Luminescent Films for Evaluation" except that the phosphorescent compound was not vapor-deposited (the phosphorescent compound was at 0 volume % and a decreased portion (15 volume %) of the phosphorescent compound was replaced by the host compound).

The emission spectra and the absorption spectra of the above luminescent films Dp-1 to Dp-7 and F-2 to F-6 were measured under the same conditions as above. In each emission spectrum measured, the maximum emission wavelength refers to the shortest wavelength-side wavelength where the emission intensity (emission peak intensity) is maximum.

The maximum emission wavelength as so calculated was the maximum emission wavelength of each of the phosphorescent compounds Dp-1 to Dp-7 and the fluorescent compounds F-2 to F-6.

From the maximum emission wavelengths of the phosphorescent compounds Dp-1 to Dp-7 and the fluorescent compounds such as F-2 was calculated a difference in the maximum emission wavelength between the fluorescent compound and the phosphorescent compound included in each of the luminescent films 1-1 to 1-25. If the difference is positive, it is indicated that the maximum emission wavelength of the relevant fluorescent compound is larger. Table 1 shows the results.

Figure 8A:
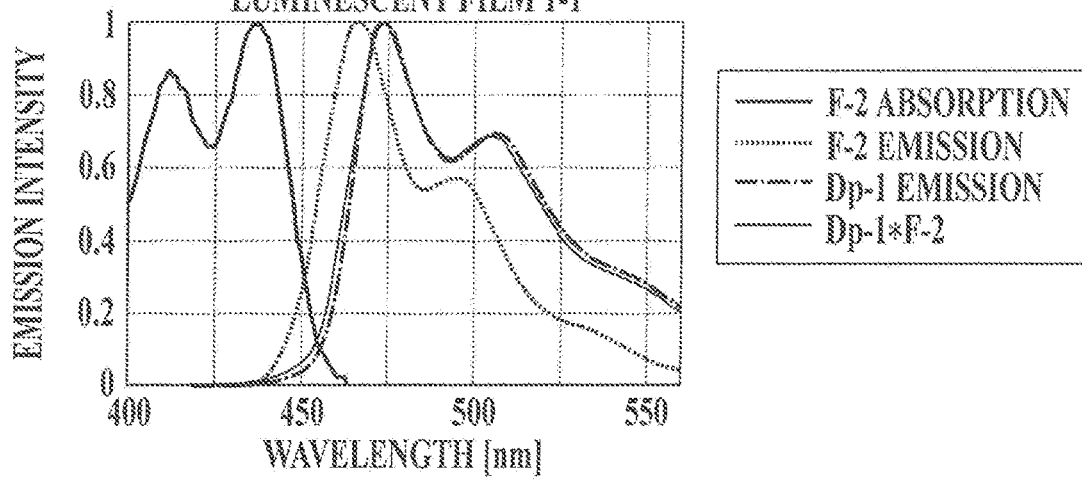
FIG. 8A is a graph showing the emission intensities and the absorbances measured for a luminescent film of Example 1.
Figure 8B:
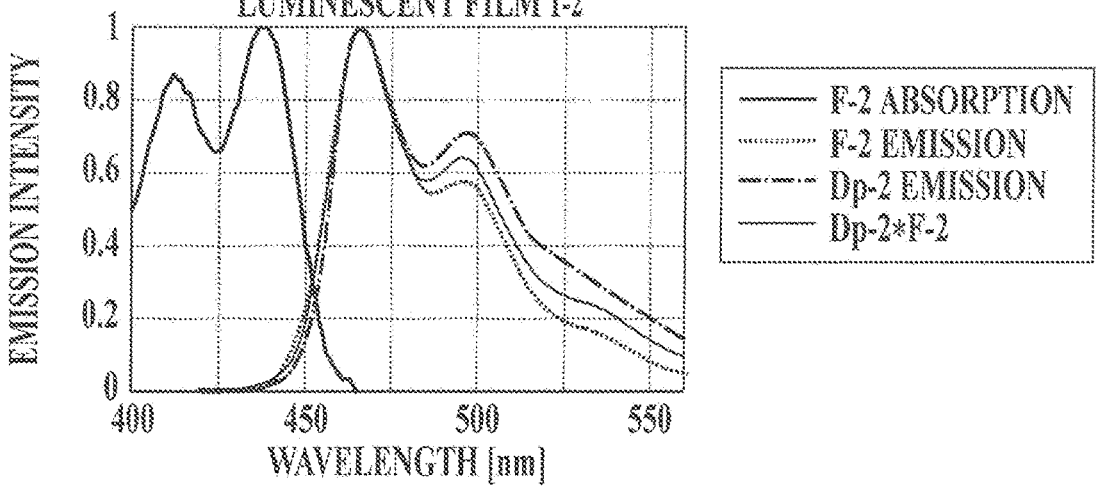
FIG. 8B is a graph showing the emission intensities and the absorbances measured for a luminescent film of Example 1.
Figure 8C:
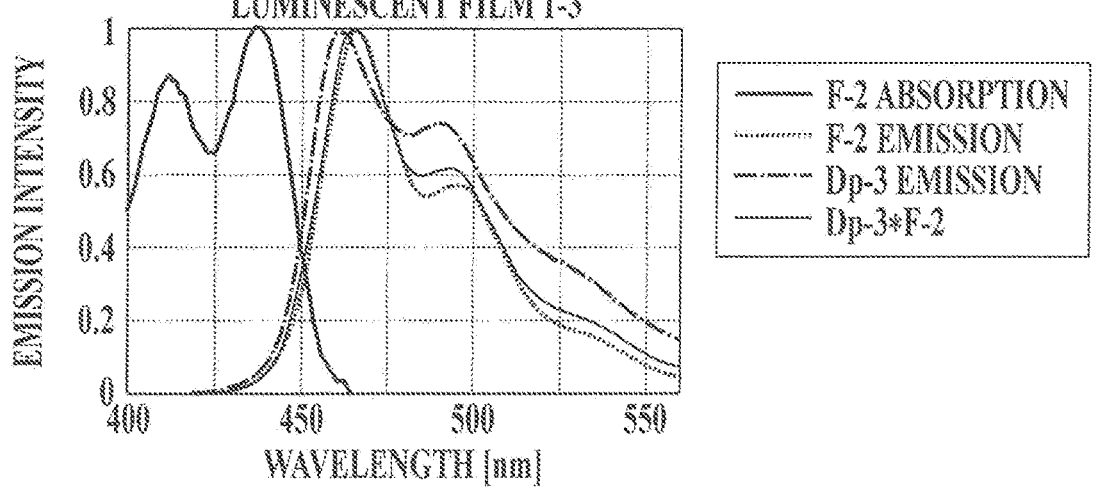
FIG. 8C is a graph showing the emission intensities and the absorbances measured for a luminescent film of Example 1.
Figure 8D:
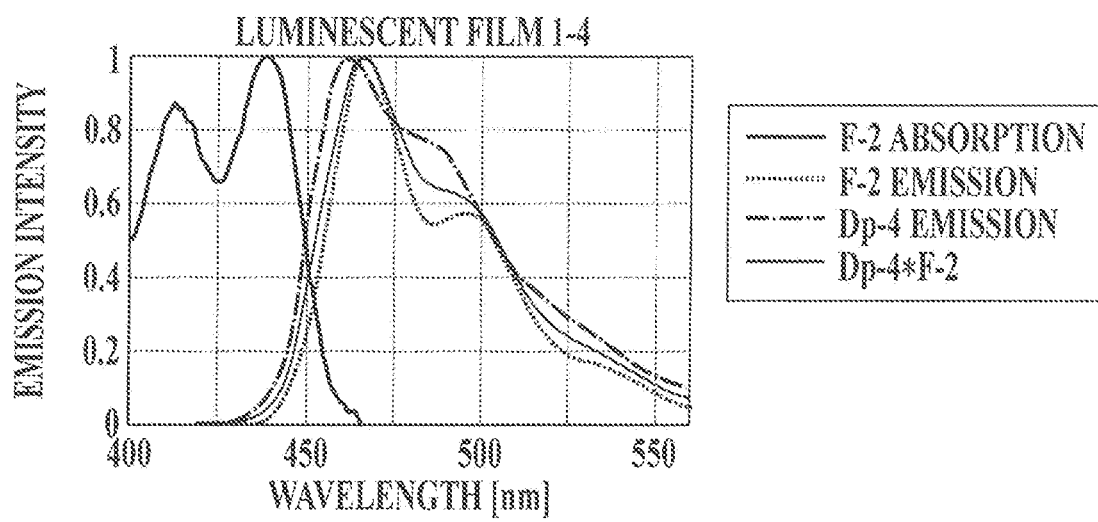
FIG. 8D is a graph showing the emission intensities and the absorbances measured for a luminescent film of Example 1.
Figure 8E:
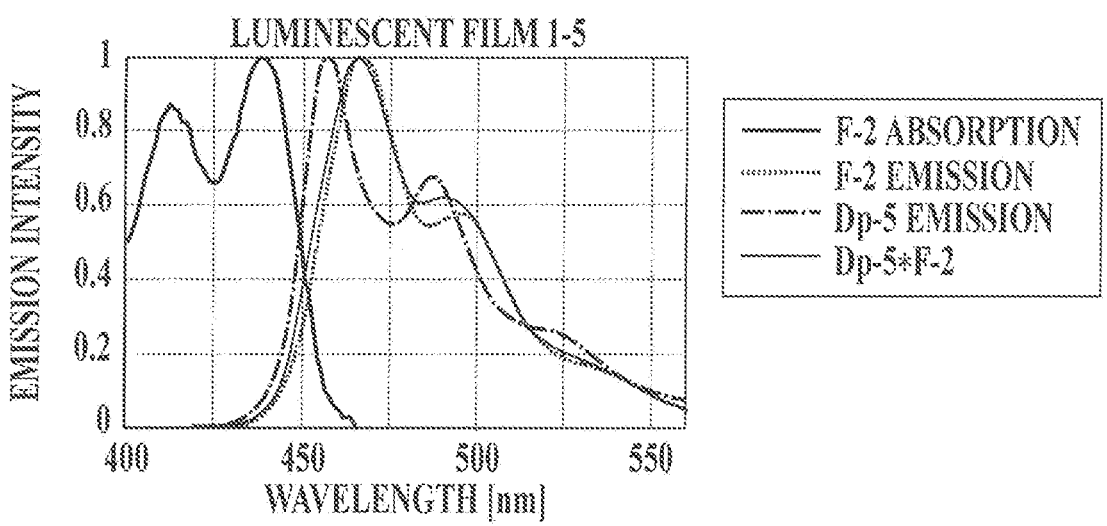
FIG. 8E is a graph showing the emission intensities and the absorbances measured for a luminescent film of Example 1.

Note that regarding the luminescent films Dp-1 to Dp-5, FIG. 8A to Figure SE show the emission spectra of the phosphorescent compounds Dp-1 to Dp-5, which spectra were determined as described above (as designated as Dp-1 to Dp-5 EMISSION in FIG. 8A to Figure SE).

In addition, regarding the luminescent film F-2, FIG. 8A to FIG. 8E show the emission spectra and the absorption spectra of the fluorescent compound F-2, which spectra were determined as described above (as designated as F-2 EMISSION and F-2 ABSORPTION in FIG. 8A to Figure SE).

(Overlap Integral Value)

The overlap integral value was calculated using the above expression (OI). The value of Table 1 is a relative value when the overlap integral of the luminescent film 1-1, which is a Comparative Example, was defined as 1.

demonstrating that the $P_F/P_D$ was markedly improved when compared to that of the combination of which the shortest wavelength-side maximum emission wavelength of the fluorescent compound was present on the short wavelength side.

Further, the luminescent films 1-2 to 1-5 of the present invention each had a better chromaticity than the luminescent film 1-1, which is a Comparative Example. Besides, the PQLE was shown to increase. This has demonstrated that use of each combination of the phosphorescent compound and the fluorescent compound, which combination causes the overlap integral value to increase, allows for more

TABLE 1

| Luminescent film No. | Kind of phosphorescent compound | Kind of fluorescent compound | Maximum wavelength difference [nm] | Overlap integral value (Relative value) | $P_F/P_D$ | Chromaticity (Relative value) | PLQE (Relative value) | Remark |
| --- | --- | --- | --- | --- | --- | --- | --- | --- |
| 1-1 | Dp-1 | F-2 | −12 | 1.0 | X | 1.0 | 1.0 | Comparative Example |
| 1-2 | Dp-2 | F-2 | 0 | 2.9 | Δ | 0.7 | 1.5 | Present Invention |
| 1-3 | Dp-3 | F-2 | +2 | 9.5 | ○ | 0.6 | 1.8 | Present Invention |
| 1-4 | Dp-4 | F-2 | +3 | 13.5 | ○ | 0.5 | 2.0 | Present Invention |
| 1-5 | Dp-5 | F-2 | +5 | 15.4 | ○ | 0.5 | 2.3 | Present Invention |
| 1-6 | Dp-6 | F-2 | 0 | 2.7 | Δ | 0.8 | 1.4 | Present Invention |
| 1-7 | Dp-7 | F-2 | +1 | 3.5 | ○ | 0.7 | 1.6 | Present Invention |
| 1-8 | Dp-2 | F-3 | 0 | 11.1 | ○ | 0.6 | 1.8 | Present Invention |
| 1-9 | Dp-3 | F-3 | +2 | 26.6 | ○ | 0.6 | 1.9 | Present Invention |
| 1-10 | Dp-4 | F-3 | +4 | 35.3 | ○ | 0.5 | 2.1 | Present Invention |
| 1-11 | Dp-5 | F-3 | +5 | 42.6 | ○ | 0.5 | 2.1 | Present Invention |
| 1-12 | Dp-6 | F-3 | 0 | 10.6 | ○ | 0.6 | 1.7 | Present Invention |
| 1-13 | Dp-7 | F-3 | +1 | 16.2 | ○ | 0.6 | 1.9 | Present Invention |
| 1-14 | Dp-2 | F-4 | 0 | 10.4 | ○ | 0.7 | 1.8 | Present Invention |
| 1-15 | Dp-3 | F-4 | +1 | 24.8 | ○ | 0.7 | 2.0 | Present Invention |
| 1-16 | Dp-4 | F-4 | +3 | 32.1 | ○ | 0.6 | 2.2 | Present Invention |
| 1-17 | Dp-5 | F-4 | +4 | 36.2 | ○ | 0.7 | 2.2 | Present Invention |
| 1-18 | Dp-6 | F-4 | 0 | 8.5 | ○ | 0.8 | 1.8 | Present Invention |
| 1-19 | Dp-7 | F-4 | 0 | 13.1 | ○ | 0.7 | 1.9 | Present Invention |
| 1-20 | Dp-1 | F-5 | 0 | 2.5 | Δ | 0.8 | 1.3 | Present Invention |
| 1-21 | Dp-2 | F-5 | +11 | 36.7 | ○ | 0.7 | 2.1 | Present Invention |
| 1-22 | Dp-3 | F-5 | +15 | 52.3 | ○ | 0.7 | 2.2 | Present Invention |
| 1-23 | Dp-6 | F-5 | +10 | 34.4 | ○ | 0.7 | 2.0 | Present Invention |
| 1-24 | Dp-7 | F-5 | +12 | 38.1 | ○ | 0.7 | 2.1 | Present Invention |
| 1-25 | Dp-1 | F-6 | +7 | 32.4 | ○ | 0.8 | 1.6 | Present Invention |

<<Examination of Results>>

FIG. 8A to FIG. 8E show the emission intensities and the absorbances determined for the luminescent films 1-1 to 1-5.

As described above, the luminescent film 1-1, which is a Comparative Example, was a luminescent compound combination of which the shortest wavelength-side maximum emission wavelength of the fluorescent compound was present on the wavelength side shorter than the shortest wavelength-side maximum emission wavelength of the phosphorescent compound (see Figure SA). In the luminescent film 1-1, the overlap integral value between the emission spectrum of the phosphorescent compound and the absorption spectrum of the fluorescent compound was small and the Förster energy transfer efficiency was small. This caused the $P_F/P_D$ to be 0.1 or lower.

By contrast, the luminescent films 1-2 to 1-5 were luminescent compound combinations of which the shortest wavelength-side maximum emission wavelength of the fluorescent compound was present at or on the wavelength side longer than the shortest wavelength-side maximum emission wavelength of the phosphorescent compound (see FIG. 8B to FIG. 8E). As shown in Table 1, the overlap integral value between the emission spectrum of the phosphorescent compound and the absorption spectrum of the fluorescent compound in each of the luminescent films 1-2 to 1-5 was large, efficient Förster energy transfer from the phosphorescent compound to the fluorescent compound.

In addition, the chromaticity improvement and/or the luminosity maintenance were less affected by a variation of the kinds of the phosphorescent compound. It was revealed that the integral of overlap with the absorption wavelength of the fluorescent compound was correlated to an improvement in the physical properties.

Further, when the luminescent films 1-2 to 1-7 were compared with the luminescent films 1-8 to 1-13, use of F-3, only the absorption wavelength of which is longer than that of F-2, caused the overlap integral value to become larger, thereby increasing the Förster transfer efficiency. This has demonstrated that the use can improve the chromaticity and can maintain the luminosity (PLQE).

Furthermore, when the luminescent films 1-2 to 1-7 were compared with the luminescent films 1-14 to 1-19, use of F-4, only the absorption wavelength of which is longer than that of F-2, caused the overlap integral value to become larger, thereby increasing the Förster transfer efficiency. This has demonstrated that the use can improve the chromaticity and can maintain the luminosity (PLQE).

The overlap integral values for the F-4-using luminescent films 1-14 to 1-19 were smaller than those for the F-3-using luminescent films 1-8 to 1-13. However, because their substituents were bulky (i.e., a covering rate on the π-plane was high), it has been revealed that suppression of the Dexter energy transfer enables the luminosity to be maintained highly efficiently.

Both the fluorescence emission and absorption wavelengths of F-5 were longer than those of F-2 to F-4. Thus, it has been demonstrated that this enables the luminosity to be maintained highly efficiently (see the luminescent films 1-20 to 1-22). Provided that regarding the chromaticity improvement, because the wavelengths became longer, the fluorescence chromaticity was provided such that the degree of improvement in the chromaticity of each of the F-5-using luminescent films 1-20 to 1-22 was not largely changed before and after addition of the fluorescent compound when compared to the F-2- to F-4-using luminescent films 1-2 to 1-19.

Regarding the luminescent film 1-25 using F-6, the core of which is different from that of F-2, it has been verified that the luminosity thereof can be maintained, in accordance with the magnitude of the overlap integral value, in the same manner as of the luminescent films 1-2 to 1-24 using F-2 to F-5.

Example 2

Next, in Example 2, the element lifetime (half-life) of the lighting apparatus (organic electroluminescent element) was checked.

<<To Manufacture Lighting Apparatuses for Evaluation>>

(Anode Formation)

An ITO (indium-tin oxide) film was deposited at a thickness of 150 nm on a glass substrate (transparent substrate) with a size of 50 mm×50 mm and a thickness of 0.7 mm. After patterning, this ITO transparent electrode-attached transparent substrate was subjected to ultrasonic cleaning with isopropyl alcohol, was dried with dry nitrogen gas, and was subjected to UV ozone cleaning for 5 min.

Vapor deposition-use resistance-heating boats in a vacuum vapor deposition device were each filled with the optimum amount of each component material for each layer so as to produce each element. The resistance-heating boats used were made of molybdenum or tungsten.

(Hole Injection Layer Formation)

After the pressure was reduced to the degree of vacuum of $1\times10^{-4}$ Pa, the resistance-heating boat containing HT-1 was heated by applying electricity. Then, vapor deposition was performed at a vapor deposition rate of 0.1 nm/sec on the ITO transparent electrode to form a hole injection layer at a thickness of 10 nm.

[Formula 49]

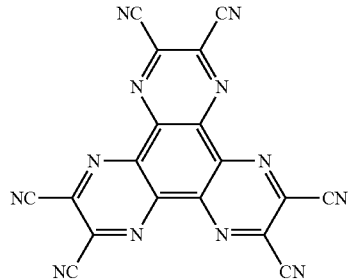

HI-1

(Hole Transport Layer Formation)

Next, HT-1 was vapor-deposited at a vapor deposition rate of 1.0 Å/sec to form a hole transport layer at a thickness of 30 nm.

[Formula 50]

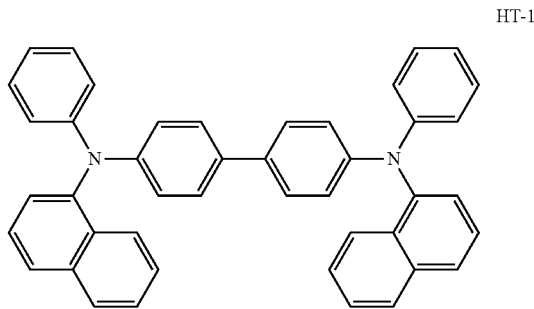

HT-1

(Emitter Layer Formation)

Next, resistance-heating boats each containing one of the host compound (H1), and the "phosphorescent compounds" and the "fluorescent compounds" listed in Table 2 (hereinafter, they are sometimes simply referred to as "dopants") were heated by applying electricity. The host compound (H1) and the dopants were together vapor-deposited on the hole transport layer at vapor deposition rates of 0.56 Å/sec, 0.1 Å/sec, 0.006 Å/sec to form an emitter layer having a thickness of 30 nm and having 84 volume %, 15 volume %, and 1 volume % thereof, respectively.

(Electron Transport Layer Formation)

Next, a second electron transport layer and a second electron transport layer were formed as the electron transport layer on the emitter layer. Specifically, HB-1 was vapor-deposited at a vapor deposition rate of 1.0 Å/sec to form the first electron transport layer at a thickness of 30 am. Further, ET-1 was vapor-deposited at a vapor deposition rate of 1.0 Å/sec to form the second electron transport layer thereon at a thickness of 30 nm.

[Formula 51]

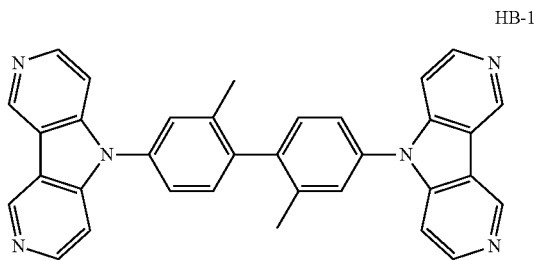

HB-1

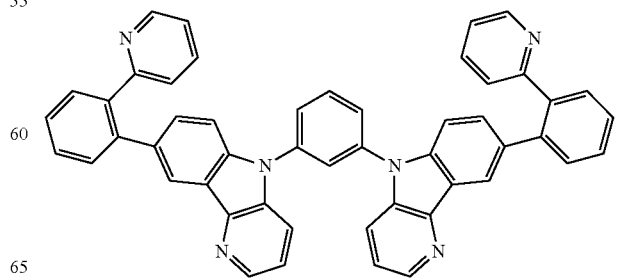

ET-1

(Cathode Formation)

After lithium fluoride was vapor-deposited at a thickness of 0.5 am, aluminum was vapor-deposited at a thickness of 100 nm to form a cathode. Then, an organic EL element for evaluation was produced.

After the organic EL element had been produced, lighting apparatuses 2-1 to 2-21 for evaluation that were configured as shown in FIG. 6 and FIG. 7 were manufactured such that a non-luminescent surface of the organic EL element was covered with a glass case under an atmosphere containing high-purity nitrogen gas with a purity of 99.999% or higher; a glass substrate at a thickness of 300 m was used as a base material for sealing; an epoxy-based photo-curable adhesive (LUXTRACK LC0629B; manufactured by TOAGOSEI CO., LTD.) was applied therearound as a sealant; this structure is stacked on the above cathode so as to tightly attach to a transparent support substrate; and the resulting structure was irradiated with UV light from the glass substrate side and was thus cured and sealed.

<Evaluation>

The above lighting apparatuses for evaluation were evaluated as follows. Table 2 shows the results. Note that the same procedure as of Example 1 was used for evaluation except that the overlap integral value designated in Table 2 was a relative value while the overlap integral value of the apparatus 2-2 was defined as 1.0.

<<Luminous Efficiency Measurement>>

The luminous efficiency was measured such that the light was turned on under conditions at room temperature (25° C.) and a constant current density of 2.5 mA/cm$^2$; a spectral emission luminance meter CS-2000 (manufactured by Konica Minolta Holdings, Inc.) was used to measure the light emission luminance of the lighting apparatus for evaluation; and the luminous efficiency (external quantum efficiency) at that current value was determined. Note that Table 2 provides relative values for the luminous efficiencies of the luminescent films 2-1 to 2-21 with respect to the luminous efficiency of apparatus 2-2 while the luminous efficiency of the apparatus 2-2 was defined as 1.

<<Half-Life Evaluation>>

For the lighting apparatus for evaluation, a spectral emission luminance meter CS-2000 was used to measure the luminance. Then, the time by which the measured luminance was decreased to half (LT50) was determined as half-life. The operation conditions included a current value of 15 mA/cm$^2$.

In addition to the respective lighting apparatuses for evaluation (apparatuses 2-1 to 2-21) of the present invention, fluorescent compound-free comparative lighting apparatuses 2-1 to 2-21 were manufactured. Then, the relative value (half-life: a relative value) was determined while the half-life of the corresponding comparative lighting apparatus was defined as 1.0. Specific examples are picked up to describe that the half-life listed in Table 2 was determined such that the relative value for the half-life of the apparatus 2-1 was determined while the half value of the comparative lighting apparatus 2-1 was defined as 1; and the relative value for the half-life of the apparatus 2-2 was determined while that of the comparative lighting apparatus 2-2 was defined as 1.

(HOMO Energy Level and LUMO Energy Level Calculation Procedure)

The structure optimization and the electron density distribution were determined by calculating the molecular orbitals of compounds constituting an assembly of the fluorescent compound and the phosphorescent compound. The calculation was performed by using, as molecular orbital calculation software, Gaussian 09 (Revision C.01, M. J. Frisch, et al, Gaussian, Inc., 2010.) created by Gaussian, Inc., USA.

Note that Table 2 lists the energy levels and the LUMO energy levels of F-2 and Dp-1 to Dp-7.

(Y Value (Chromaticity) Measurement)

The y values for the respective apparatuses for evaluation and the above comparative lighting apparatuses were measured. Note that the measuring procedure was the same procedure as of Example 2.

Note that the chromaticity (relative value) of Table 2 is a relative value of the y value for each of the luminescent films 2-1 to 2-21 with respect to the y value for the apparatus 2-2 while the y value for the apparatus 2-2 was defined as 1.

TABLE 2

| Apparatus No. | Phosphorescent compound | | | Fluorescent compound | | | Luminous efficiency (Relative value) | Overlap integral value (Relative value) | Half-life (Relative value) | Chromaticity (Relative value) | Remark |
|---|---|---|---|---|---|---|---|---|---|---|---|
| | Kind | HOMO [eV] | LUMO [eV] | Kind | HOMO [eV] | LUMO [eV] | | | | | |
| 2-1 | — | — | — | F-2 | −4.7 | −1.7 | 0.5 | — | — | 0.5 | Comparative Example |
| 2-2 | Dp-1 | −4.4 | −1.1 | F-2 | −4.7 | −1.7 | 1.0 | 1.0 | 0.5 | 1.0 | Comparative Example |
| 2-3 | Dp-2 | −4.7 | −0.7 | F-2 | −4.7 | −1.7 | 1.8 | 2.9 | 1.1 | 0.9 | Present Invention |
| 2-4 | Dp-3 | −4.6 | −0.9 | F-2 | −4.7 | −1.7 | 2.6 | 9.5 | 3.2 | 0.7 | Present Invention |
| 2-5 | Dp-4 | −5.8 | −1.8 | F-2 | −4.7 | −1.7 | 2.6 | 13.5 | 1.8 | 0.7 | Present Invention |
| 2-6 | Dp-5 | −5.8 | −1.7 | F-2 | −4.7 | −1.7 | 2.5 | 15.4 | 2.2 | 0.6 | Present Invention |
| 2-7 | Dp-6 | −4.6 | −0.7 | F-2 | −4.7 | −1.7 | 1.9 | 2.7 | 1.3 | 0.9 | Present Invention |
| 2-8 | Dp-7 | −4.7 | −0.7 | F-2 | −4.7 | −1.7 | 1.8 | 3.5 | 1.1 | 0.9 | Present Invention |
| 2-9 | Dp-2 | −4.7 | −0.7 | F-3 | −5.0 | −2.0 | 2.5 | 11.1 | 2.1 | 0.7 | Present Invention |
| 2-10 | Dp-3 | −4.6 | −0.9 | F-3 | −5.0 | −2.0 | 3.5 | 26.6 | 2.5 | 0.6 | Present Invention |
| 2-11 | Dp-6 | −4.6 | −0.7 | F-3 | −5.0 | −2.0 | 2.4 | 10.6 | 1.9 | 0.8 | Present Invention |
| 2-12 | Dp-7 | −4.7 | −0.7 | F-3 | −5.0 | −2.0 | 2.8 | 16.2 | 2.0 | 0.7 | Present Invention |
| 2-13 | Dp-2 | −4.7 | −0.7 | F-4 | −5.0 | −2.0 | 2.9 | 10.4 | 2.5 | 0.7 | Present Invention |
| 2-14 | Dp-3 | −4.6 | −0.9 | F-4 | −5.0 | −2.0 | 3.8 | 24.8 | 3.6 | 0.7 | Present Invention |
| 2-15 | Dp-6 | −4.6 | −0.7 | F-4 | −5.0 | −2.0 | 2.7 | 8.5 | 2.3 | 0.8 | Present Invention |
| 2-16 | Dp-7 | −4.7 | −0.7 | F-4 | −5.0 | −2.0 | 3.1 | 13.1 | 2.2 | 0.8 | Present Invention |
| 2-17 | Dp-2 | −4.7 | −0.7 | F-5 | −5.0 | −2.0 | 3.1 | 36.7 | 1.1 | 0.6 | Present Invention |
| 2-18 | Dp-3 | −4.6 | −0.9 | F-5 | −5.0 | −2.0 | 3.6 | 52.3 | 1.3 | 0.6 | Present Invention |
| 2-19 | Dp-6 | −4.6 | −0.7 | F-5 | −5.0 | −2.0 | 2.9 | 34.4 | 1.5 | 0.7 | Present Invention |

TABLE 2-continued

| Apparatus No. | Phosphorescent compound Kind | HOMO [eV] | LUMO [eV] | Fluorescent compound Kind | HOMO [eV] | LUMO [eV] | Luminous efficiency (Relative value) | Overlap integral value (Relative value) | Half-life (Relative value) | Chromaticity (Relative value) | Remark |
|---|---|---|---|---|---|---|---|---|---|---|---|
| 2-20 | Dp-7 | −4.7 | −0.7 | F-5 | −5.0 | −2.0 | 3.0 | 38.1 | 1.7 | 0.7 | Present Invention |
| 2-21 | Dp-1 | −4.4 | −1.1 | F-6 | −4.7 | −0.7 | 2.3 | 32.4 | 2.1 | 0.9 | Present Invention |

<<Examination of Results>>

First, like Example 1, the emission spectra and the absorption spectra were measured and the overlap integral value was then calculated; the emission spectrum of the blue phosphorescent compound and the absorption spectrum of the blue fluorescent compound of each of the apparatuses 2-3 to 2-21 had portions overlapping with each other; and the expression (1) was satisfied and light emission derived from the blue fluorescent compound was detected.

The apparatuses 2-3 to 2-21, each using an element having, as a dopant, a phosphorescent compound and having a sensitized fluorescent compound, were found to have a higher luminous efficiency than that of the apparatus 2-1 using a phosphorescent compound-free emitter layer containing only a fluorescent compound and a host compound.

Meanwhile, the apparatus 2-2 had an emitter layer containing a combination of dopants of which the shortest wavelength-side maximum emission wavelength of the fluorescent compound was present on the wavelength side shorter than the shortest wavelength-side maximum emission wavelength of the phosphorescent compound. In this apparatus, the Dexter energy transfer from the phosphorescent compound to the fluorescent compound contributed considerably to exciton deactivation. As a result, the element lifetime (half-life) decreased when compared to that before addition of the fluorescent compound.

By contrast, the apparatuses 2-3 to 2-21 each had an emitter layer containing a combination of dopants of which the shortest wavelength-side maximum emission wavelength of the fluorescent compound, which exerted enhanced Förster energy transfer efficiency, was present on the wavelength side longer than the shortest wavelength-side maximum emission wavelength of the phosphorescent compound. In these apparatuses, both the element lifetime (half-life) improvement and the chromaticity improvement were demonstrated to be established.

Among them, the apparatus 2-4, in particular, contained a combination of the phosphorescent compound and the fluorescent compound of which the energy levels of the highest occupied molecular orbital (HOMO) satisfied the relationship: $HOMO_{BFM} < HOMO_{BPM}$ or the energy levels of the lowest unoccupied molecular orbital (LUMO) satisfied the relationship: $LUMO_{BFM} > LUMO_{BPM}$. This combination was found to successfully produce an element having high luminous efficiency and long element lifetime. This is because the probability of direct recombination on the fluorescent compound is decreased.

Further, the apparatuses 2-4 and 2-5 were compared. The element lifetime of the relevant element was found to be markedly increased when a ligand linked by a coordinate bond to a center metal in the structure of the phosphorescent compound is an aromatic hydrocarbon ring or an aromatic heterocyclic ring. Here, inclusion of a Dp-4-like highly reactive ligand weakens exciton stability and causes a reaction point when an electric field is applied. Thus, the phosphorescent compound seems to be preferred that has, as a ligand, an aromatic hydrocarbon ring or an aromatic heterocyclic ring and has increased exciton stability so as to better elicit the effects of the fluorescent compound.

In addition, the chromaticity improvement and/or the luminosity maintenance were less affected by a variation of the kinds of the phosphorescent compound. It was revealed that the integral of overlap with the absorption wavelength of the fluorescent compound as well as the HOMO-LUMO levels were correlated to an improvement in the physical properties.

Further, when the overlap integral value became large (e.g., the apparatus 2-9), the luminosity was maintained advantageously. It has been revealed that the luminous efficiency can be increased at the time of production of the element as well as the chromaticity can be improved and the element lifetime can be prolonged.

The overlap integral value of each of the apparatuses 2-13 to 2-16 using F-4 was somewhat smaller than that of each of the apparatuses 2-9 to 2-12 using F-3. Here, bulkiness of the substituent can suppress not only the Dexter energy transfer from $T_1$ of the phosphorescent compound to $T_1$ of the fluorescent compound, but also the direct recombination on the fluorescent compound. As a result, the luminous efficiency is better than that using F-3. However, the physical distance between the fluorescent compound and the phosphorescent compound becomes longer, so that the amount of Förster transfer to the fluorescent compound when F-4 is used is less than that when F-3 is used. This results in a better y value of chromaticity when F-3 is used than when F-4 is used.

Lifetime extension was confirmed in triisopropylsilyl (TIPS)-containing system in which not all substituents are identical. However, fluorescence-related exciton stability when F-5 was used was poorer than when another fluorescent compound (e.g., F-3) was used. As a result, the effect of increasing the lifetime when another fluorescent compound (e.g., F-2) is used is better than when F-5 is used (see the apparatuses 2-7 to 2-12 and 2-17 to 2-20).

Example 3

<<To Manufacture Lighting Apparatuses for Evaluation>>

<Formation of Layers Up to Hole Injection Layer>

The same manufacturing procedure as of each lighting apparatus for evaluation in Example 2 was repeated to form layers up to the hole injection layer.

<Hole Transport Layer Formation>

A hole transport layer was formed on the hole injection layer as follows.

Note that described are the cases where to the hole transport layer, which is a layer adjacent to the emitter layer, is added no fluorescent compound ("Absent" in the column "Addition to the hole transport layer" of Table 3) or the fluorescent compound ("Present" in the column "Addition to the hole transport layer" of Table 3).

(Case where No Fluorescent Compound was Added to Hole Transport Layer)

HT-1 was vapor-deposited at a vapor deposition rate of 0.1 Å/sec to form a hole transport layer at a thickness of 25 nm on the hole injection layer.

(Case Where Fluorescent Compound Was Added to Hole Transport Layer)

HT-1 was vapor-deposited at a vapor deposition rate of 0.1 Å/sec to form a fluorescent compound-free hole transport layer at a thickness of 25 nm on the hole injection layer. Next, HT-1, which was a material for the hole transport layer, and the fluorescent compound designated in Table 3 were together vapor-deposited at vapor deposition rates of 0.6 Å/sec and 0.02 Å/sec to form the fluorescent compound-containing hole transport layer having a thickness of 5 nm and having 97 volume % and 3 volume % thereof, respectively, on the fluorescent compound-free hole transport layer.

<Emitter Layer Formation>

Next, resistance-heating boats each containing one of the above host compound H1 and the "phosphorescent compound" designated in Table 3 were heated by applying electricity. The host compound H1 and the phosphorescent compound were together vapor-deposited at 0.56 Å/sec and 0.1 Å/sec to form an emitter layer having a thickness of 30 nm and having 85 volume % and 15 volume % thereof, respectively, on the hole transport layer.

<Electron Transport Layer and Cathode Formation)

Described are the cases where to the electron transport layer, which is a layer adjacent to the emitter layer, is added no fluorescent compound ("Absent" in the column "Addition to the electron transport layer" of Table 3) or the fluorescent compound ("Present" in the column "Addition to the electron transport layer" of Table 3).

(Case where No Fluorescent Compound was Added to Electron Transport Layer)

The same manufacturing procedure as of each lighting apparatus for evaluation in Example 2 was repeated to form a first electron transport layer, a second electron transport layer, and a cathode on the emitter layer. The organic EL element for evaluation was produced and the lighting apparatus for evaluation was then manufactured.

Note that the apparatus 3-1, which is a Comparative Example, is an apparatus in which no fluorescent compound was mixed in the layer adjacent to the emitter layer.

With respect to the apparatuses 3-1 to 3-4, which were lighting apparatuses for evaluation as so manufactured, the luminous efficiency and element lifetime (half-life) were evaluated like Example 2. Note that Table 3 provides relative values for the luminous efficiencies of the luminescent films 3-1 to 3-4 with respect to the luminous efficiency of apparatus 3-1 while the luminous efficiency of the apparatus 3-1 was defined as 1.

Note that an increase in each of the acceleration factor and the roll-off (about $J_0$) was calculated as follows. Meanwhile, Table 3 lists relative values for the increase in each of the acceleration factor and the roll-off (about $J_0$) while the values for the apparatus 3-1 were defined as 1.

(Acceleration Factor)

The acceleration factor was defined as a multiplier obtained by extrapolating, on a power approximation curve, the time by which the initial luminance was decreased to half while a current was applied at 2.5 mA/cm$^2$ or 16.25 mA/cm$^2$. That is, the acceleration factor refers to the acceleration factor n regarding the half-life in the following equation (E).

$$t_1/t_2 = (L_1/L_2)^{-n} \qquad (E)$$

[$L_1$: initial luminance when a current density of 2.5 mA/cm$^2$ is applied;

$L_2$: initial luminance when a current density of 16.25 mA/cm$^2$ is applied;

$t_1$: element lifetime (luminance half-life) at a luminance $L_1$ (a low luminance and a low current of 2.5 mA/cm$^2$);

$t_2$: element lifetime (luminance half-life) at a luminance $L_2$ (a high luminance and a high current of 16.25 mA/cm$^2$)]

Note that a spectral emission luminance meter CS-2000 (manufactured by Konica Minolta Holdings, Inc.) was used to measure the luminance.

(Increase in Roll-Off (about $J_0$))

In order to evaluate an increase in roll-off, $J_0$ is calculated as follows. First, a current density was increased in the apparatus and the maximum EQE was measured. A current density where the EQE was half the maximum EQE was determined to be $J_0$.

TABLE 3

| Apparatus No. | Kind of phosphorescent compound | Kind of fluorescent compound | Addition to the hole transport layer | Addition to the electron transport layer | Luminous efficiency (Relative value) | Half-life (Relative value) | $J_0$ (Relative value) | Acceleration factor (Relative value) | Remark |
|---|---|---|---|---|---|---|---|---|---|
| 3-1 | Dp-5 | F-2 | Absent | Absent | 1.0 | 1.0 | 1.0 | 1.00 | Comparative Example |
| 3-2 | Dp-5 | F-2 | Present | Absent | 1.0 | 1.1 | 5.1 | 0.99 | Present Invention |
| 3-3 | Dp-5 | F-2 | Absent | Present | 1.0 | 1.3 | 6.3 | 0.97 | Present Invention |
| 3-4 | Dp-5 | F-2 | Present | Present | 0.9 | 2.1 | 7.1 | 0.95 | Present Invention |

(Case where Fluorescent Compound was Added to Electron Transport Layer)

The electron transport compound and the fluorescent compound like Example 2 were together vapor-deposited at 0.6 Å/sec and 0.02 Å/sec to form the 5-nm-thickness fluorescent compound-containing electron transport layer having a thickness of 5 nm and having 97 volume % and 3 volume % thereof, respectively, on the emitter layer.

The electron transport compound HB-1 like Example 2 was vapor-deposited at a vapor deposition rate of 1.0 Å/sec to form a fluorescent compound-free electron transport layer at a thickness of 25 nm thereon.

<<Examination of Results>>

It has been revealed that addition of the fluorescent compound to the adjacent layer but not the emitter layer can increase the half-life while a decrease in EQE was suppressed. The reason why a difference in the effect of prolonging the half-life between 3-2 and 3-3 occurred seems to be due to the charge recombination position (luminescent center) in the emitter layer. In this Example, the luminescent position in the emitter layer was on the electron transport layer side. Accordingly, 3-3 containing the fluorescent compound in the hole transport layer had increased energy transfer efficiency. This might cause the effect of prolonging the element lifetime to appear. As such, addition of the fluorescent compound to the layer adjacent to the emitter layer makes it possible to suppress a decrease in EQE.

In addition, Förster transfer from the phosphorescent compound to the fluorescent compound may be adequately allowed by a combination thereof. In this case, when the fluorescent compound is added to the adjacent layer, excitons in the emitter layer may diffuse rapidly. This has been found to be able to improve the roll-off and the acceleration factor.

Example 4

<<To Manufacture Lighting Apparatuses for Evaluation>>

(Formation of Layers Up to Hole Injection Layer)

The same manufacturing procedure as of each lighting apparatus for evaluation in Example 2 was repeated to form layers up to the hole injection layer.

(Hole Transport Layer Formation)

Next, HT-1 was vapor-deposited at a vapor deposition rate of 1.0 Å/sec to form a hole transport layer at a thickness of 25 nm.

(Formation of Luminescent Film (Mixed Layer) Containing Material of Adjacent Layer)

Next, resistance-heating boats each containing one of the host compound H1 and "phosphorescent compound" and the "fluorescent compound" designated in Table 4 were heated by applying electricity. Then, HT-1 (material for the hole transport layer as the adjacent layer), the host compound H1, each phosphorescent compound, and the fluorescent compound were together vapor-deposited at vapor deposition rates of 0.25 Å/sec, 0.25 Å/sec, 0.1 Å/sec, and 0.003 Å/sec to form a mixed layer of the hole transport layer and the emitter layer (i.e., a luminescent film containing the material of the adjacent layer) at 5 nm on the hole transport layer, which mixed layer contained 42 volume %, 42 volume %, 15 volume %, and 1 volume % thereof, respectively.

(Emitter Layer Formation)

Next, resistance-heating boats each containing one of the host compound H1 and each "phosphorescent compound" and the "fluorescent compound" designated in Table 4 were heated by applying electricity. The host compound H1, each phosphorescent compound, and the fluorescent compound were together vapor-deposited at vapor deposition rates of 0.5 Å/sec, 0.1 Å/sec, and 0.003 Å/sec to form an emitter layer at a thickness of 30 nm on the layer mixed with the adjacent layer, which mixed layer contained 84 volume %, 15 volume %, and 1 volume % thereof, respectively.

Note that regarding the apparatus 4-0, resistance-heating boats each containing one of the host compound H1 and the "fluorescent compound" designated in Table 4 were heated by applying electricity. The host compound H1 and the fluorescent compound were together vapor-deposited at vapor deposition rates of 0.64 Å/sec and 0.02 Å/sec to form an emitter layer at a thickness of 30 nm on the layer mixed with the adjacent layer, which mixed layer contained %, 97 volume % and 3 volume % thereof, respectively.

(Electron Transport Layer and Cathode Formation)

Next, the same manufacturing procedure as of each lighting apparatus for evaluation in Example 2 was repeated to form a first electron transport layer, a second electron transport layer, and a cathode on the emitter layer. The organic EL element for evaluation was produced and the lighting apparatus for evaluation was then manufactured.

Note that as a Comparative Example was used a combination of which the shortest wavelength-side maximum emission wavelength of the fluorescent compound is present on the wavelength side shorter than the shortest wavelength-side maximum emission wavelength of the phosphorescent compound.

With respect to the apparatuses 4-0 to 4-5, the luminous efficiency and half-life were evaluated like Example 2. Note that the same procedure as of Example 1 was used for evaluation except that each overlap integral value designated in Table 4 was a relative value while the overlap integral value of the apparatus 4-1 was defined as 1.

Note that the same procedure as of Example 2 was used for evaluation except that the luminous efficiency was a relative value while the luminous efficiency of the apparatus 4-1 was defined as 1.0.

The half-life was evaluated by the same method as of Example 2.

TABLE 4

| Apparatus No. | Kind of phosphorescent compound | Kind of fluorescent compound | Overlap integral value (Relative value) | Luminous efficiency (Relative value) | Half-life (Relative value) | Remark |
| --- | --- | --- | --- | --- | --- | --- |
| 4-0 | — | F-2 | — | 0.1 | — | Comparative Example |
| 4-1 | Dp-1 | F-2 | 1.0 | 1.0 | 0.4 | Comparative Example |
| 4-2 | Dp-2 | F-2 | 2.9 | 2.2 | 1.1 | Present Invention |
| 4-3 | Dp-3 | F-2 | 9.5 | 2.7 | 1.3 | Present Invention |
| 4-4 | Dp-4 | F-2 | 13.5 | 2.2 | 1.3 | Present Invention |
| 4-5 | Dp-5 | F-2 | 15.4 | 2.5 | 1.5 | Present Invention |

<<Examination of Results>>

First, like Example 1, the emission spectra and the absorption spectra were measured and the overlap integral value was then calculated; the emission spectrum of the blue phosphorescent compound and the absorption spectrum of the blue fluorescent compound of each of the apparatuses 4-2 to 4-5 had portions overlapping with each other; and the expression (1) was satisfied and light emission derived from the blue fluorescent compound was detected.

In Comparative Example 4-1, a luminescent film containing the phosphorescent compound and the fluorescent compound, between which the efficiency of Förster energy transfer was poor, was mixed with the material of the layer adjacent to the luminescent film. At that time, the material HT-1 of the adjacent layer (the hole transport layer in Example 4) became deactivated to low $T_1$ or direct recombination on the hole transport layer occurred. This was found to cause a marked decrease in the element lifetime when compared to the apparatus without the mixed layer.

By contrast, the apparatuses 4-2 to 4-5 of the present invention each had a sufficiently large overlap integral value; and the Förster energy transfer from the phosphorescent compound to $S_1$ of the fluorescent compound occurred efficiently and light was thus emitted rapidly. This may make it possible to suppress a decrease in the luminous efficiency when the material of the adjacent layer was included in the luminescent film. In this way, it is clear that the overlap integral value is important in maintaining and prolonging the element lifetime.

Example 5

<<To Produce Organic EL Element 5-1>>

As described below, the anode/hole injection layer/hole transport layer/emitter layer/blocking layer/electron transport layer/electron injection layer/cathode were stacked and sealed on a substrate to produce a bottom-emission type organic EL element.

(Substrate Preparation)

The whole surface of a polyethylene naphthalate film (hereinafter, abbreviated as PEN; manufactured by Teijin DuPont Films, Inc.) on the side facing the anode was provided with an $SiO_x$ inorganic matter-containing gas barrier layer at a thickness of 500 nm by using an atmospheric discharge plasma processing device having the configuration described in Japanese Patent Laid-Open No. 2004-68143. Accordingly, prepared was a flexible substrate having gas barrier properties such as an oxygen transmittance of 0.001 mL/(m²·24 h) or less and a water vapor transmittance of 0.001 g/(m²·24 h) or less.

(Anode Formation)

A film at a thickness of 120 nm was formed on the above substrate by sputtering using ITO (indium-tin oxide) and patterning was then conducted by photolithography to form an anode. Note that the resulting pattern was a pattern with an area of the luminescent region of 5 cm×5 cm.

(Hole Injection Layer Formation)

The anode-attached substrate was subjected to ultrasonic cleaning with isopropyl alcohol, was dried with dry nitrogen gas, and was subjected to UV ozone cleaning for 5 min. Then, a dispersion containing poly(3,4-ethylenedioxy thiophene)/polystyrene sulfonate (PEDOT/PSS) as prepared like Example 16 of Japanese Patent No. 4509787 was diluted with isopropyl alcohol; the resulting 2 mass % solution was coated on the anode-attached substrate by spin coating; the resulting substrate was dried at 80° C. for 5 min; and a hole injection layer at a thickness of 40 nm was then formed.

(Hole Transport Layer Formation)

Next, the hole injection layer-attached substrate was transferred to a place under nitrogen gas (grade G1)-using nitrogen atmosphere; a coating liquid used for hole transport layer formation and composed of the following composition was used to conduct coating by spin coating; the resulting substrate was dried at 130° C. for 30 min; and a hole transport layer at thickness of 30 nm was then formed.

<Coating Liquid for Hole Transport Layer Formation>

| Hole transport material (Compound (HT-1)) (weight average molecular weight Mw = 80000) | 10 parts by mass |
|---|---|
| Chlorobenzene | 3000 parts by mass |

(Emitter Layer Formation)

Next, a coating liquid used for emitter layer formation and composed of the following composition was used to coat the hole transport layer-attached substrate by spin coating; the resulting substrate was dried at 120° C. for 30 min; and an emitter layer at thickness of 50 nm was then formed.

<Coating Liquid for Emitter Layer Formation>

| Host compound H1 | 9 parts by mass |
|---|---|
| Blue fluorescent compound F-2 | 1 part by mass |
| Isopropyl acetate | 2000 parts by mass |

(Blocking Layer Formation)

Next, a coating liquid used for blocking layer formation and composed of the following composition was used to coat the emitter layer-attached substrate by spin coating; the resulting substrate was dried at 80° C. for 30 min; and a blocking layer at thickness of 10 nm was then formed.

<Coating Liquid for Blocking Layer Formation>

| HS-1 | 2 parts by mass |
|---|---|
| Isopropyl alcohol (IPA) | 1500 parts by mass |
| 1H,1H,5H-Octafluoropentanol (OFAO) | 500 parts by mass |

[Formula 52]

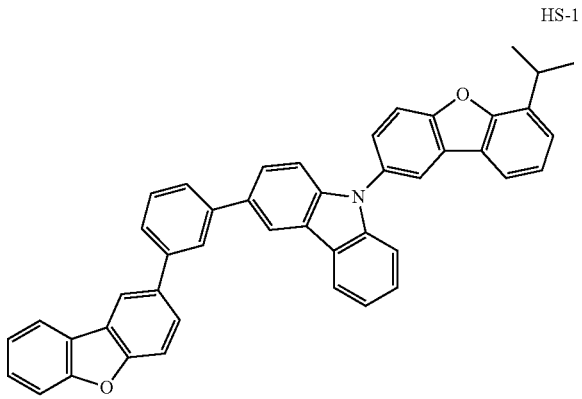

HS-1

(Electron Transport Layer Formation)

Next, a coating liquid used for electron transport layer formation and composed of the following composition was used to coat the blocking layer-attached substrate by spin coating; the resulting substrate was dried at 80° C. for 30 min; and an electron transport layer at thickness of 30 nm was then formed.

<Coating Liquid for Electron Transport Layer Formation>

| ET-1 | 6 parts by mass |
|---|---|
| 2,2,3,3-Tetrafluoro-1-propanol (TFPO) | 2000 parts by mass |

(Electron Injection Layer and Cathode Formation)

Subsequently, the resulting substrate was mounted on a vacuum vapor deposition device without exposing it to the air. In addition, molybdenum-made resistance-heating boats, each containing one of sodium fluoride and potassium fluoride, were mounted on the vacuum vapor deposition device and the pressure of a vacuum tank thereof was reduced to $4 \times 10^{-5}$ Pa. Then, the boats were heated by applying electricity, and sodium fluoride was vapor-deposited at 0.02 nm/sec to form a thin film at a film thickness of 1 nm on the electron transport layer. Likewise, potassium fluoride was vapor-deposited at 0.02 nm/sec to form an electron injection layer at a thickness of 1.5 nm on the sodium fluoride thin film.

Subsequently, aluminum was vapor-deposited to form a cathode at a thickness of 100 nm.

(Sealing)

The resulting laminated body as produced by using the above steps was bonded to a sealing base material by using a commercially available roll laminate machine.

Flexible aluminum foil (manufactured by TOYO ALUMINIUM K. K.) at a thickness of 30 m, as the sealing base material, was provided with an adhesive layer at a thickness of 1.5 nm by using a two-part reaction type urethane-based adhesive for dry lamination; and the substrate laminated with a polyethylene terephthalate (PET) film at a thickness of 12 μm was then prepared.

A thermosetting adhesive, as the adhesive for sealing, was uniformly coated at a thickness of 20 m along the bonding surface (glossy surface) of the aluminum foil on the sealing base material by using a dispenser. This was dried for 12 hours under vacuum at 100 Pa or lower. Further, this sealing base material was transferred to a place under a nitrogen atmosphere having a dew point temperature of −80° C. or lower and an oxygen level of 0.8 ppm and was dried over 12 hours; and the water content of the adhesive for sealing was adjusted to 100 ppm or less.

As the thermosetting adhesive was used an epoxy-based adhesive prepared by mixing the following (A) to (C).

(A) Bisphenol A diglycidyl ether (DGEBA)

(B) Dicyandiamide (DICY)

(C) Epoxy adduct-modified curing accelerator

The above sealing base material was tightly attached and placed onto the above laminated body; and a pressing roll was used to tightly attach and seal the above laminated body under pressing conditions at a pressing roll temperature of 100° C., a pressure of 0.5 MPa, and a machine speed of 0.3 m/min.

The organic EL element 5-1 was produced as described above.

<<To Produce Organic EL Elements 5-2 to 5-5>>

The organic EL elements 5-2 to 5-5 were likewise produced except that during the manufacture of the above organic EL element 5-1, the materials included in the coating liquid for emitter layer formation were changed as described in Table 5. Note that when a plurality of the kinds of solvents were included in the coating liquid for emitter layer formation, the total content was adjusted to 2000 parts by mass. Also note that the amount of each phosphorescent compound included in the coating liquid for emitter layer formation was set to 19 volume %.

<<Evaluation of Organic EL Elements 5-1 to 5-5>>

The luminous efficiency and the element lifetime (half-life) of the organic EL elements 5-1 to 5-5 as so produced were evaluated. Note that the same procedure as of Example 1 was used for evaluation except that the overlap integral value designated in Table 5 was a relative value while the overlap integral value of the apparatus 5-1 was defined as 1.0.

In addition, the same procedure as of Example 2 was used for evaluation except that the luminous efficiency was a relative value while the luminous efficiency of the apparatus 5-1 was defined as 1.0. The half-life was evaluated by the same method as of Example 2.

Table 5 shows the evaluation results.

TABLE 5

| Element No. | Kind of phosphorescent compound | Kind of fluorescent compound | Overlap integral value (Relative value) | Luminous efficiency (Relative value) | Half-life (Relative value) | Remark |
| --- | --- | --- | --- | --- | --- | --- |
| 5-1 | Dp-1 | F-2 | 1.0 | 1.0 | 0.5 | Comparative Example |
| 5-2 | Dp-2 | F-2 | 2.9 | 2.0 | 1.0 | Present Invention |
| 5-3 | Dp-3 | F-2 | 9.5 | 2.2 | 1.4 | Present Invention |
| 5-4 | Dp-4 | F-2 | 13.5 | 2.4 | 1.2 | Present Invention |
| 5-5 | Dp-5 | F-2 | 15.4 | 2.8 | 1.4 | Present Invention |

<<Results of Examination>>

First, like Example 1, the emission spectra and the absorption spectra were measured and the overlap integral value was then calculated; the emission spectrum of the blue phosphorescent compound and the absorption spectrum of the blue fluorescent compound of each of the apparatuses 5-2 to 5-5 had portions overlapping with each other; and the expression (1) was satisfied and light emission derived from the blue fluorescent compound was detected.

Table 5 indicates that the organic EL elements 5-2 to 5-5 according to the present invention are found to have increased luminous efficiency and element lifetime when compared to the organic EL element 5-1 of a Comparative Example. This demonstrates that the element lifetime can be prolonged in such a combination of the phosphorescent compound and the fluorescent compound having a sufficient overlap integral like that of the present invention.

Besides, in the method for producing an organic EL element according to an embodiment of the present invention, the component layer was formed mainly by using a coating process. This is applicable to flexible substrates. Thus, it is possible to produce, at low cost, an organic EL element having high luminous efficiency and long element lifetime.

Example 6

<To Prepare Substrate>

During preparation of the substrate in Example 5, the thickness of the gas barrier layer was suitably adjusted and the water vapor transmittance (WVTR) was set to 0.00001 to 0.8 g/(m$^2$·day) and the oxygen transmittance (OTR) was set to 0.000012 to 1 mL/(m$^2$·day·atm) to prepare the substrate.

<To Produce Organic EL Element>

The same procedure as of Example 5 was repeated to manufacture the lighting apparatuses 5-11 to 15, 5-21 to 25, 5-31 to 35, 5-41 to 45, and 5-51 to 52, except that the electron injection layer of Example 5 was changed to the following one.

(Electron Injection Layer Formation)

The sodium fluoride and potassium fluoride of Example 5 were changed to lithium fluoride to form an electron injection layer at a thickness of 1.0 nm.

<Dark Spot (DS) Evaluation Test>

The respective lighting apparatuses 5-11 to 15, 5-21 to 25, 5-31 to 35, 5-41 to 45, and 5-51 to 55 were kept for 500 hours under an atmosphere at 85° C. and 85% RH. Subsequently, a current of 1 mA/cm$^2$ was applied to each lighting apparatus and light was emitted therefrom. Next, a 100× light microscope (MS-804, lens MP-ZE25-200; manufactured by MORITEX Corporation) was used to magnify and capture an image of a portion of the light-emitting section of each lighting apparatus. Then, the captured image was cut into 2-mm squares and whether or not any dark spot occurred in the image was observed. From the observation results, a ratio of the dark spot occurrence area to the luminescent area was determined and dark spot resistance was evaluated in accordance with the following criteria. Table 6 shows the DS evaluation results.

5: Occurrence of dark spots is unobserved.

4: The dark spot occurrence area is from 0.1% to less than 1.0%.

3: The dark spot occurrence area is from 1.0% to less than 3.0%.

2: The dark spot occurrence area is from 3.0% to less than 6.0%.

1: The dark spot occurrence area is from 6.0% or more.

<Evaluation of Stability (Half-Life) During Continuous Operation>

The luminous efficiency and the half-life of each of the lighting apparatuses 5-11 to 15, 5-21 to 25, 5-31 to 35, 5-41 to 45, and 5-51 to 55 were evaluated, like Examples 5, under an atmosphere at 85° C. and 85% RH.

and the half-life under an atmosphere at 85° C. and 85% RH, the lighting apparatus of the present invention successfully produced good results. Specifically, this has demonstrated that even a barrier substrate, the cost of which is low because the thickness is made thinner, has no problems in practical use.

Example 7

<<To Produce Organic EL Element 6-1>>

As described below, the anode/hole injection layer/hole transport layer/emitter layer/blocking layer/electron transport layer/electron injection layer/cathode were stacked and sealed on a substrate to produce a bottom-emission organic EL element 6-1.

(Substrate Preparation)

First, like Example 5, an anode was formed on a substrate.

Next, the same procedure as of Example 5 was repeated, except that the spin coating was changed to an inkjet technique, to form a hole injection layer.

(Hole Transport Layer Formation)

Next, the hole injection layer-attached substrate was transferred to a place under nitrogen gas (grade G1)-using nitrogen atmosphere; a coating liquid used for hole transport layer formation and composed of the following composition was used to conduct coating by an inkjet technique; the resulting substrate was dried at 150° C. for 30 min; and a hole transport layer at thickness of 30 nm was then formed.

TABLE 6

| Apparatus No. | Thickness of gas barrier layer [nm] | WVTR [g/(m$^2$ · day)] | OTR [mL/(m$^2$ · day · atm)] | Kind of phosphorescent compound | Overlap integral value (Relative value) | DS evaluation | Luminous efficiency (Relative value) | Half-life (Relative value) | Remark |
|---|---|---|---|---|---|---|---|---|---|
| 5-11 | 900 | 1.0 × 10$^{-5}$ | 1.2 × 10$^{-5}$ | Dp-1 | 1.0 | 5 | 1.0 | 0.5 | Comparative Example |
| 5-12 | 900 | 1.0 × 10$^{-5}$ | 1.2 × 10$^{-5}$ | Dp-2 | 2.9 | 5 | 2.0 | 1.0 | Present Invention |
| 5-13 | 900 | 1.0 × 10$^{-5}$ | 1.2 × 10$^{-5}$ | Dp-3 | 9.5 | 5 | 2.2 | 1.4 | Present Invention |
| 5-14 | 900 | 1.0 × 10$^{-5}$ | 1.2 × 10$^{-5}$ | Dp-4 | 13.5 | 5 | 2.4 | 1.2 | Preseat Invention |
| 5-15 | 900 | 1.0 × 10$^{-5}$ | 1.2 × 10$^{-5}$ | Dp-5 | 15.4 | 5 | 2.8 | 1.4 | Present Invention |
| 5-21 | 500 | 1.0 × 10$^{-3}$ | 1.2 × 10$^{-3}$ | Dp-1 | 1.0 | 2 | 1.0 | 0.5 | Comparative Example |
| 5-22 | 500 | 1.0 × 10$^{-3}$ | 1.2 × 10$^{-3}$ | Dp-2 | 2.9 | 5 | 2.0 | 1.0 | Present Invention |
| 5-23 | 500 | 1.0 × 10$^{-3}$ | 1.2 × 10$^{-3}$ | Dp-3 | 9.5 | 5 | 2.2 | 1.4 | Present Invention |
| 5-24 | 500 | 1.0 × 10$^{-3}$ | 1.2 × 10$^{-3}$ | Dp-4 | 13.5 | 5 | 2.4 | 1.2 | Present Invention |
| 5-25 | 500 | 1.0 × 10$^{-3}$ | 1.2 × 10$^{-3}$ | Dp-5 | 15.4 | 5 | 2.8 | 1.4 | Present Invention |
| 5-31 | 200 | 1.0 × 10$^{-1}$ | 1.2 × 10$^{-1}$ | Dp-1 | 1.0 | 1 | 0.5 | 0.2 | Comparative Example |
| 5-32 | 200 | 1.0 × 10$^{-1}$ | 1.2 × 10$^{-1}$ | Dp-2 | 2.9 | 4 | 1.8 | 0.9 | Present Invention |
| 5-33 | 200 | 1.0 × 10$^{-1}$ | 1.2 × 10$^{-1}$ | Dp-3 | 9.5 | 4 | 2.1 | 1.3 | Present Invention |
| 5-34 | 200 | 1.0 × 10$^{-1}$ | 1.2 × 10$^{-1}$ | Dp-4 | 13.5 | 4 | 2.3 | 1.2 | Present Invention |
| 5-35 | 200 | 1.0 × 10$^{-1}$ | 1.2 × 10$^{-1}$ | Dp-5 | 15.4 | 5 | 2.7 | 1.4 | Present Invention |
| 5-41 | 50 | 0.8 × 10$^{-1}$ | 1.0 | Dp-1 | 1.0 | 1 | 0.3 | 0.1 | Comparative Example |
| 5-42 | 50 | 0.8 × 10$^{-1}$ | 1.0 | Dp-2 | 2.9 | 3 | 1.3 | 0.9 | Present Invention |
| 5-43 | 50 | 0.8 × 10$^{-1}$ | 1.0 | Dp-3 | 9.5 | 4 | 1.9 | 1.0 | Present Invention |
| 5-44 | 50 | 0.8 × 10$^{-1}$ | 1.0 | Dp-4 | 13.5 | 4 | 2.0 | 1.5 | Present Invention |
| 5-45 | 50 | 0.8 × 10$^{-1}$ | 1.0 | Dp-5 | 15.4 | 5 | 2.3 | 1.6 | Present Invention |
| 5-51 | 0 | 2.0 × 10 | 2.5 × 10 | Dp-1 | 1.0 | 1 | 0.1 | 0.03 | Comparative Example |
| 5-52 | 0 | 2.0 × 10 | 2.5 × 10 | Dp-5 | 15.4 | 4 | 1.8 | 1.1 | Present Invention |

Advantageous Effects of Invention

As shown in Table 6, the present lighting apparatuses 5-12 to 15, 5-22 to 25, 5-32 to 35, 5-42 to 45, and 5-52 each having a sufficient overlap integral value was found to suppress the occurrence of dark spots while the gas barrier properties of the flexible substrate were not high. In addition, after the above evaluation of the luminous efficiency <Coating Liquid for Hole Transport Layer Formation>

| | |
|---|---|
| Hole transport material (Compound (HT-1)) (weight average molecular weight Mw = 80000) | 10 parts by mass |
| Xylene | 3000 parts by mass |

(Emitter Layer Formation)

Next, a coating liquid used for emitter layer formation and composed of the following composition was used to coat the hole transport layer-attached substrate by an inkjet technique; the resulting substrate was dried at 130° C. for 30 min; and an emitter layer at thickness of 50 nm was then formed.

<Coating Liquid for Emitter Layer Formation>

| Host compound H1 | 9 parts by mass |
| Blue fluorescent compound F-2 | 1 part by mass |
| n-Butyl acetate | 2000 parts by mass |

(Blocking Layer Formation)

Except that the spin coating was replaced by an inkjet technique during the formation of the blocking layer and the formation of the electron transport layer of Example 5, the same procedure as of Example 5 was repeated to form a blocking layer and an electron transport layer on the emitter layer-attached substrate.

Next, the same procedure as of Example 5 was repeated to form an electron injection layer and a cathode and to seal them.

The organic EL element 6-1 was produced as described above.

<<To Produce Organic EL Elements 6-2 to 6-5>>

The organic EL elements 6-2 to 6-5 were likewise produced except that during the manufacture of the above organic EL element 6-1, the materials included in the coating liquid for emitter layer formation were changed as described in Table 7. Note that when a plurality of the kinds of solvents were included in the coating liquid for emitter layer formation, the total content was adjusted to 2000 parts by mass.

<<Evaluation of Organic EL Elements 6-1 to 6-5>>

The organic EL elements 6-1 to 6-5 as so produced were evaluated like Example 5. Table 7 shows the evaluation results.

Note that the overlap integral value designated in Table 7 was a relative value while the overlap integral value of the apparatus 6-1 was defined as 1.0.

In addition, the luminous efficiency was a relative value while the luminous efficiency of the apparatus 6-1 was defined as 1.0.

<<Results of Examination>>

First, like Example 1, the emission spectra and the absorption spectra were measured and the overlap integral value was then calculated; the emission spectrum of the blue phosphorescent compound and the absorption spectrum of the blue fluorescent compound of each of the apparatuses 6-2 to 6-5 had portions overlapping with each other; and the expression (1) was satisfied and light emission derived from the blue fluorescent compound was detected.

Table 7 indicates that the organic EL elements 6-2 to 6-5 according to the present invention are found to have increased element lifetime when compared to the organic EL element 6-1 of a Comparative Example. In addition, the element lifetime was found to increase more than in the case of having the phosphorescent compound alone.

Note that in the method for producing an organic EL element according to Example 5 or 7, a coating process such as spin coating or an inkjet technique, respectively, was used to produce each component layer. This allows for not only application to flexible substrates but also manufacture of arbitrarily shaped light-emitting devices. Thus, the universal use can be extended, and the production cost can be reduced.

Collectively, the method for producing an organic EL element according to the present invention is applicable to flexible substrates and makes it possible to produce, at low cost, an organic EL element with high luminous efficiency and long element lifetime.

Example 8

The same manufacturing procedure as of each lighting apparatus for evaluation in Example 2 was repeated to form the lighting apparatus for evaluation. Note that the kind of the phosphorescent compound and the kind and amount of the fluorescent compound included in the emitter layer were listed in Table 8. Comparative Example 7-1 is a lighting apparatus in which no fluorescent compound was added to the emitter layer.

Note that the additive amount of the phosphorescent compound was 84 volume % and the summed additive amount of the fluorescent compound and the host compound was 16 volume %.

[Evaluation]

An increase in the emission decay time, the acceleration factor, and the roll-off (about $J_0$) was calculated as described above. Note that in evaluation, a relative value was calculated for evaluation while the value of apparatus 7-1 was defined as 1.00.

TABLE 7

| Element No. | Kind of phosphorescent compound | Kind of fluorescent compound | Overlap integral value (Relative value) | Luminous efficiency (Relative value) | Half-life (Relative value) | Remark |
| --- | --- | --- | --- | --- | --- | --- |
| 6-1 | Dp-1 | F-2 | 1.0 | 1.0 | 0.5 | Comparative Example |
| 6-2 | Dp-2 | F-2 | 2.9 | 1.8 | 1.0 | Present Invention |
| 6-3 | Dp-3 | F-2 | 9.5 | 2.2 | 1.2 | Present Invention |
| 6-4 | Dp-4 | F-2 | 13.5 | 2.4 | 1.2 | Present Invention |
| 6-5 | Dp-5 | F-2 | 15.4 | 2.4 | 1.3 | Present Invention |

TABLE 8

| Apparatus No. | Kind of phosphorescent compound | Kind of fluorescent compound | Additive amount [volume %] | Emission decay time $\tau$ (Relative value) | $J_0$ (Relative value) | Acceleration factor (Relative value) | Remark |
|---|---|---|---|---|---|---|---|
| 7-1 | Dp-2 | F-3 | — | 1.00 | 1.00 | 1.00 | Comparative Example |
| 7-2 | Dp-2 | F-3 | 0.5 | 0.65 | 1.12 | 0.94 | Present Invention |
| 7-3 | Dp-2 | F-3 | 1.0 | 0.52 | 1.18 | 0.88 | Present Invention |
| 7-4 | Dp-2 | F-3 | 3.0 | 0.38 | 1.33 | 0.81 | Present Invention |

SUMMARY

It is evident from Table 8 that as the additive amount of the fluorescent compound increases, the emission decay time $\tau$ is shortened and the acceleration factor becomes closer to 1.

This means that the fluorescent compound added causes excitons generated in the emitter layer to be immediately diffusible. That is, this means that even when an organic EL element is operated under high current density, the organic EL element can be operated under conditions mimicking operation under low current density.

Besides, it has been revealed that addition of the fluorescent compound can cause the value about $J_0$, an indicator of roll-off, to increase, thereby suppressing the roll-off.

INDUSTRIAL APPLICABILITY

Luminescent films of the present invention have excellent luminous efficiency, chromaticity, and emission lifetime, are applicable to organic EL elements, and can thus be used for display devices, displays, or various emission light sources.

The above means of the present invention can be used to provide, for example, a luminescent film which has excellent luminous efficiency, chromaticity, and element lifetime.

The mechanism of exerting the effects of the present invention and its mechanism of action have not been identified but may be considered as follows.

<<Mechanism of Prolongation of Element Lifetime with Blue Phosphorescent Compound>>

According to the above Stern-Volmer equation, means for prolongation of element lifetime while the emission intensity decay of the blue phosphorescent compound is suppressed in the luminescent film involves the following three:

(1) the emission decay time $\tau$ of the blue phosphorescent compound should be shortened;

(2) the quencher mass ([Q]) generated during light or electric field operation should be reduced; and (3) the rate ($K_q$) of energy transfer to the generated quencher should be suppressed.

In the above means, the present inventors have paid attention to (1) how the emission decay time $\tau$ of the blue phosphorescent compound is shortened. Then, in the present invention, in order to shorten the $\tau$ and improve the chromaticity, it has been determined to use the blue phosphorescent compound and a blue fluorescent compound that sufficiently allows for Förster energy transfer from the blue phosphorescent compound.

<Advantages and Disadvantages of Fluorescent Compounds>

FIG. 1 relates to the technology disclosed in Patent Literature 1 and is a schematic diagram illustrating how energy is transferred when a fluorescent compound allowing for energy transfer from a phosphorescent compound is added to a luminescent film containing the phosphorescent compound and a host compound, which does not contribute to light emission. In the technology disclosed in Patent Literature 1, Förster energy transfer or Dexter energy transfer from the phosphorescent compound to the fluorescent compound occurs, and, then fluorescent light emission or non-radiative deactivation occurs. That is, use of the phosphorescent compound-derived exciton deactivation pathways is increased. Consequently, in the fluorescent compound-containing luminescent film, the emission decay time $\tau$ of the phosphorescent compound itself is known to be shortened when compared to the fluorescent compound-free luminescent film.

Further, if a fluorescent compound with excellent chromaticity than the phosphorescent compound is used, it is possible to shorten the emission decay time and improve the chromaticity of luminescent color of the luminescent film (see, for example, Patent Literature 2).

However, the present inventors have found the following disadvantages when the emission decay (emission decay time $\tau$) of the phosphorescent compound is shortened by adding the fluorescent compound that emits light of high chromaticity.

FIG. 2 is a schematic diagram illustrating energy transfer in the technology disclosed in Patent Literature 2.

Generally speaking, the triplet excited state of a blue fluorescent compound involves red color to a certain degree and has a low energy level. Thus, the energy level is lower than the energy level of the triplet excited state of the blue phosphorescent compound, so that non-radiative deactivation seems to occur preferentially.

In other words, as shown in FIG. 2, addition of a fluorescent compound to the luminescent film can shorten the emission decay time $\tau$ of the phosphorescent compound. On the other hand, energy transfer (Dexter energy transfer) to $T_1$ of the fluorescent compound, the level of which is lower than $T_1$ of the phosphorescent compound, is increased. This causes a decrease in light emission property that can be sufficiently achieved in the fluorescent compound-free luminescent film, resulting in a reduction in the amount of light emission obtained from the luminescent film. As such, there is the occurrence of exciton deactivation from the $T_1$ level of the phosphorescent compound to the $T_1$ level of the fluorescent compound added. Here, excitons generated are deactivated through the non-radiative deactivation mechanism such as heat deactivation. This causes a decrease in light emission luminance, resulting in shortening of the element lifetime of the element using the luminescent film in terms of the same luminance.

Note that the reason why addition of a known fluorescent compound cannot produce desired element lifetime seems to be based on the above disadvantages caused by addition of such a fluorescent compound.

<Investigation on and Solution to Problems of Disadvantages of Addition of Fluorescent Compound>

Generally speaking, as shown in FIG. 1, when a blue phosphorescent compound and a blue fluorescent compound are used, triplet excitons of the blue phosphorescent compound are subject to Dexter energy transfer to the triplet excited state of the blue fluorescent compound. Thus, the excitons are deactivated through non-radiative deactivation without contributing to light emission.

Then, in order to prolong the element lifetime of the element using the blue fluorescent compound-containing luminescent film, the present inventors have first paid attention to how to increase Förster energy transfer from the triplet excited state of the blue phosphorescent compound to the singlet excited state of the blue fluorescent compound. As a result, it has been found that by increasing portions (overlap integral value) overlapping between the emission spectrum of the blue phosphorescent compound and the absorption spectrum of the blue fluorescent compound, Förster energy transfer from $T_1$ of the blue phosphorescent compound to $S_1$ of the fluorescent compound can be enhanced sufficiently. In addition, when the above expression (1) is satisfied, the overlap integral value can be increased sufficiently. As a result, excitons can be effectively used for light emission and the element lifetime can also be prolonged. In this way, the present invention has been completed.

Note that Examples will describe, in detail, the specific examinations and results about how the emission spectrum of the blue phosphorescent compound and the absorption spectrum of the blue fluorescent compound overlap and about the relationship between the expression (1) and the effects exerted by the invention of the present application.

Note that when Forster energy transfer, which uses the excitons to effectively emit light, is enhanced, it is possible to suppress deactivation (Kq in the expression (A)) mediated by Dexter transfer to a quencher. This makes it possible to obtain an organic EL element less likely to cause heat deactivation even if the quencher is generated during operation.

In addition, ultra-fast exciton dispersion, which cannot be achieved by the blue phosphorescent compound alone, is unlikely to cause a roll-off even in the case of operation under high current density. As a result, it is possible to provide an element in which an increase in the acceleration factor is suppressed (i.e., the acceleration factor n is close to 1), that is, in which the operation condition under low current density is mimicked.

The suppression of the deactivation by the quencher may increase resistance to the quencher such as water or oxygen. As a result, it is unnecessary to impart conventionally used high gas barrier properties (e.g., a water vapor transmittance, an oxygen transmittance) to a gas barrier layer according to the invention of the present application. Conventionally, to ensure reliability of a flexible organic EL element, for instance, a flexible substrate needs a gas barrier layer with high gas barrier properties. This is a factor for increased cost. Because a luminescent material according to the present invention is resistant to water or oxygen, a gas barrier layer with high gas barrier properties is unnecessary. As a result, even if a gas barrier layer with low gas barrier properties is employed, it can be put into practical use. Also, the cost can be saved.

Regarding performance of a gas barrier layer according to the present invention, it is preferable to have gas barrier properties such as a water vapor transmittance (WVTR) of 0.001 to 1 g/(m²·day), as measured by the protocol according to JIS K 7129-1992, and an oxygen transmittance (OTR) of 0.001 to 1 mL/(m²·day·atm), as measured by the protocol according to JIS K 7126-1987. A gas barrier layer without conventional high gas barrier properties, for instance, gas barrier properties such as a WVTR of $1.0 \times 10^{-5}$ g/(m²·day) or less can be put into practical use. Regarding performance of a gas barrier layer according to the present invention, the WVTR ranges more preferably from 0.01 to 1 g/(m²·day) and the OTR ranges more preferably from 0.01 to 1 mL/(m²·day·atm). The gas barrier layer of the present invention may be formed on a substrate of an organic EL element or may be used as a sealing member or may be provided in the both forms. Depending on the form of the organic EL element, given forms can be provided.

Figure 3B:
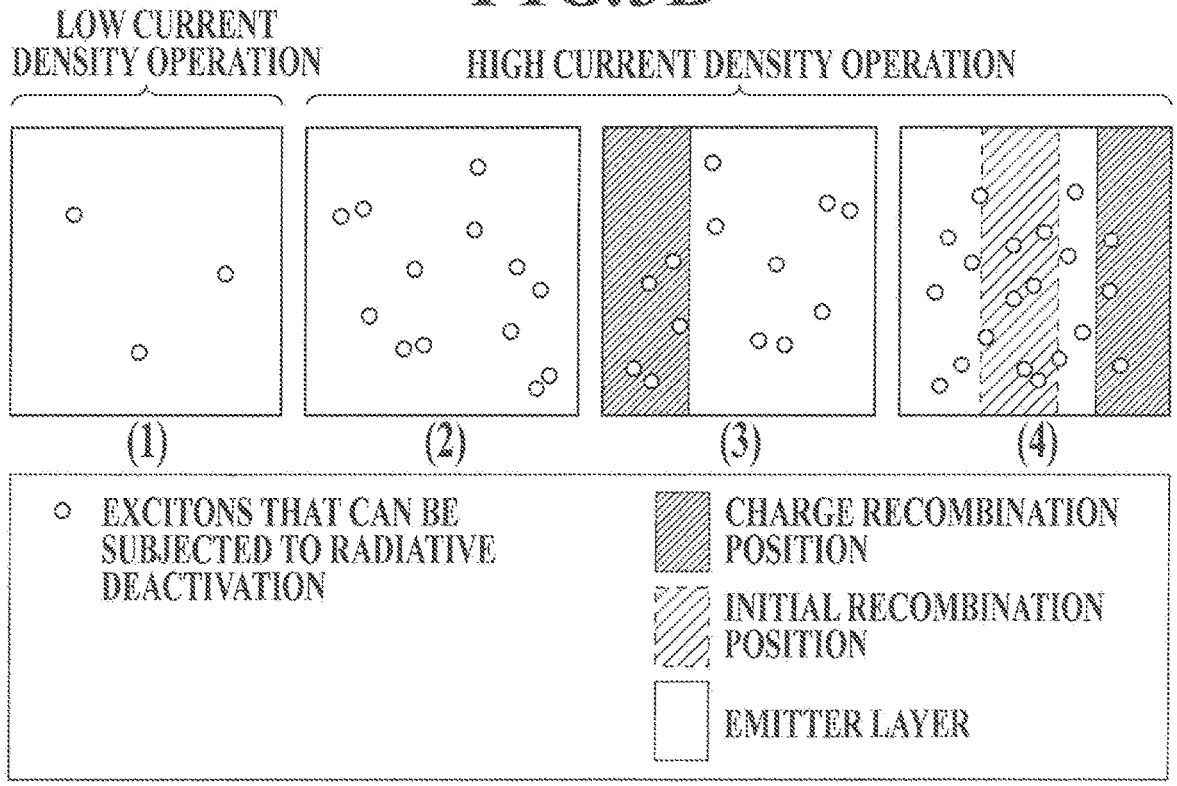
FIG. 3B is a schematic diagram illustrating how light is emitted in an emitter layer of an organic EL element according to the present invention.

Hereinbelow, FIG. 3A and FIG. 3B are used to further describe differences between the organic EL elements of the present invention and conventional organic EL elements.

(1) When Operated Under Low Current Density

The number of excitons generated in an emitter layer is small.

Because of this, even if a conventional technology using a phosphorescent compound and a host compound is utilized, the excitons generated hardly interact like TTA with one another and are less subject to non-radiative deactivation.

(2) Suppression of Luminosity Decrease Caused by TTA

The number of excitons generated in the emitter layer is large.

Because the exciton dispersion capacity in the conventional technology is in the order of μ sec and is low, non-radiative deactivation due to the interaction like TTA appears (see FIG. 3A).

By contrast, in the present invention, the excitons generated can be rapidly subject to radiative deactivation to a ground state, so that TTA is unlikely to occur and the luminosity can thus be kept (see FIG. 3B). Consequently, light emission under conditions mimicking operation under low current density is possible and the acceleration factor is close to 1.

(3) Suppression of Luminosity Decrease Caused by Recombination Position

When operated under high current density, light emission may occur near the interface of either HTL or ETL because of carrier imbalance. In this case, in the conventional technology, the interaction such as TTA like (2) causes a non-radiative deactivation process (see FIG. 3A). By contrast, in the present invention, even if the recombination position comes close to the interface like the conventional technology, energy can be transferred to the fluorescent compound by Forster energy transfer. This makes it possible to use a wider light emission area than the conventional technology, thereby capable of decreasing the exciton density (see FIG. 3B). In addition, energy transfer to the fluorescent compound enables the exciton retention time to be shortened markedly. So, the non-radiative deactivation is further unlikely to occur.

(4) Suppression of Luminosity Decrease Caused by Light Emission Position Change During Element Operation Even if the recombination at an ideal light emission position occurs in the initial state, film characteristics may change due to electricity application and/or operation heat during the element operation, which causes a change in the carrier balance. This change may cause a decrease in the luminosity as described in the above (3) (see FIG. 3A). In the present invention, as described in the above (3), not only the wider light emission area can be used but also the excitons can be rapidly dispersed even when the recombination position is changed during the operation. This elicits large effects on suppression of the luminosity decrease caused by the recombination position change during operation (see FIG. 3B).

Although embodiments of the present invention have been described and illustrated in detail, the disclosed embodiments are made for purposes of illustration and example only and not limitation. The scope of the present invention should be interpreted by terms of the appended claims.

REFERENCE SIGNS LIST

1 Display
3 Pixel
5 Scanning line
6 Data line
101 Organic EL element
102 Glass cover
105 Cathode
106 Organic EL layer (Light-emitting unit)
107 Transparent electrode-attached glass substrate
108 Nitrogen gas
109 Water scavenger
A Display part
B Controlling part

The invention claimed is:

1. A luminescent film comprising a host compound, a blue phosphorescent compound, and a blue fluorescent compound, wherein
the blue fluorescent compound comprises bulky substituents covering a π-plane of the blue fluorescent compound;
an emission spectrum of the blue phosphorescent compound and an absorption spectrum of the blue fluorescent compound have portions overlapping with each other;
shortest wavelength-side maximum emission wavelengths of the blue phosphorescent compound (abbreviated as "BPM" in the expression) and the blue fluorescent compound (abbreviated as "BFM" in the expression) satisfy the following expression (1):

$$\lambda_{BFM} \geq \lambda_{BPM} \qquad \text{expression (1):}$$

wherein $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound; and
light emission derived from the blue fluorescent compound is detected.

2. The luminescent film according to claim 1, wherein CIE chromaticity coordinate y values of luminescent colors of the blue phosphorescent compound and the blue fluorescent compound satisfy the following expression (2):

$$y_{BPM} \geq y_{BFM} \qquad \text{expression (2):}$$

wherein $y_{BPM}$ represents the CIE chromaticity coordinate y value of the luminescent color of the blue phosphorescent compound; and $y_{BFM}$ represents the CIE chromaticity coordinate y value of the luminescent color of the blue fluorescent compound.

3. The luminescent film according to claim 1, wherein a ratio of energy transfer from the blue phosphorescent compound to the blue fluorescent compound satisfies the following expression (3):

$$P_F/P_D \geq 0.34 \qquad \text{expression (3):}$$

wherein $P_F$ represents a probability of Förster energy transfer from a triplet excited state of the blue phosphorescent compound to a singlet excited state of the blue fluorescent compound; and $P_D$ represents a probability of Dexter energy transfer from a triplet excited state of the blue phosphorescent compound to a triplet excited state of the blue fluorescent compound.

4. The luminescent film according to claim 1, wherein the blue phosphorescent compound is represented by the following general formula (1):

General formula (1)

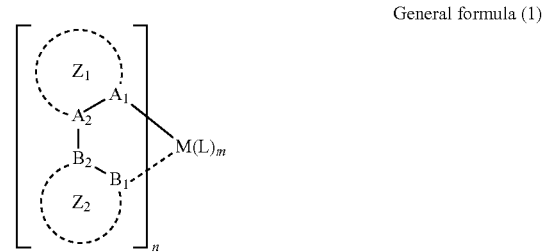

wherein M represents Ir or Pt; $A_1$, $A_2$, $B_1$, and $B_2$ each independently represent a carbon atom or a nitrogen atom; ring $Z_1$ represents a 6-membered aromatic hydrocarbon ring, a 5-membered or 6-membered aromatic heterocyclic ring, or an aromatic condensed ring containing at least one of the rings, formed together with $A_1$ and $A_2$; ring $Z_2$ represents a 5-membered or 6-membered aromatic heterocyclic ring or an aromatic condensed ring containing at least one of the rings, formed together with $B_1$ and $B_2$; a carbon atom included in the ring $Z_1$ or the ring $Z_2$ is optionally a carbene carbon atom; one of a bond between $A_1$ and M and a bond between $B_1$ and M is a coordinate bond and the other is a covalent bond; the ring $Z_1$ and the ring $Z_2$, each independently, optionally have a substituent; the substituents of the ring $Z_1$ and the ring $Z_2$ are optionally bonded to form a condensed ring structure or a ligand represented by the ring $Z_1$ and a ligand represented by the ring $Z_2$ are optionally linked; L represents a monoanionic bidentate ligand coordinated to M and optionally has a substituent; m represents an integer of 0 to 2; n represents an integer of 1 to 3; if M is Ir, m+n is 3 and if M is Pt, m+n is 2; and if m or n is 2 or more, ligands represented by each ring $Z_1$ and each ring $Z_2$ or each L is the same or different and the ligands represented by each ring $Z_1$ and each ring $Z_2$ are optionally linked to each L.

5. An organic electroluminescent element comprising an emitter layer between an anode and a cathode, wherein, the emitter layer has the luminescent film according to claim 1.

6. An organic electroluminescent element, wherein the luminescent film according to claim 1 comprises a material of a layer adjacent to the luminescent film.

7. The organic electroluminescent element according to claim 5, further comprising a gas barrier layer having a water vapor transmittance, as measured by a protocol according to JIS K 7129-1992, in a range from 0.001 to 1 g/(m²·day) and an oxygen transmittance, as measured by a protocol according to JIS K 7126-1987, in a range from 0.001 to 1 mL/(m²·day·atm).

8. An organic electroluminescent element comprising an emitter layer and a layer adjacent to the emitter layer between an anode, a cathode, and, wherein the emitter layer comprises a host compound and a blue phosphorescent compound;

the layer adjacent to the emitter layer comprises a blue fluorescent compound;

an emission spectrum of the blue phosphorescent compound and an absorption spectrum of the blue fluorescent compound have portions overlapping with each other;

shortest wavelength-side maximum emission wavelengths of the blue phosphorescent compound (abbreviated as "BPM" in the expression) and the blue fluorescent compound (abbreviated as "BFM" in the expression) satisfy the following expression (1):

$$\lambda_{BFM} \geq \lambda_{BPM} \qquad \text{expression (1):}$$

wherein $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound; and light emission derived from the blue fluorescent compound is detected.

9. The organic electroluminescent element according to claim 5, wherein the phosphorescent compound and the blue fluorescent compound satisfy at least one of the following expression (5) or expression (6):

$$HOMO_{BPM} > HOMO_{BFM}; \text{ and} \qquad \text{expression (5):}$$

$$LUMO_{BPM} < LUMO_{BFM}, \qquad \text{expression (6):}$$

wherein $HOMO_{BPM}$ represents an energy level of highest occupied molecular orbital (HOMO) of the blue phosphorescent compound; $HOMO_{BFM}$ represents a HOMO energy level of the blue fluorescent compound;

$LUMO_{BPM}$ represents an energy level of lowest unoccupied molecular orbital (LUMO) of the blue phosphorescent compound; and $LUMO_{BFM}$ represents a LUMO energy level of the blue fluorescent compound.

10. The organic electroluminescent element according to claim 8, further comprising a gas barrier layer having a water vapor transmittance, as measured by a protocol according to JIS K 7129-1992, in a range from 0.001 to 1 g/(m²·day) and an oxygen transmittance, as measured by a protocol according to JIS K 7126-1987, in a range from 0.001 to 1 mL/(m²·day·atm).

11. An organic material composition comprising a host compound, a blue phosphorescent compound, and a blue fluorescent compound, wherein the blue fluorescent compound comprises bulky substituents covering a π-plane of the blue fluorescent compound;

an emission spectrum of the blue phosphorescent compound and an absorption spectrum of the blue fluorescent compound have portions overlapping with each other;

shortest wavelength-side maximum emission wavelengths of the blue phosphorescent compound (abbreviated as "BPM" in the expression) and the blue fluorescent compound (abbreviated as "BPM" in the expression) satisfy the following expression (1):

$$\lambda_{BFM} \geq \lambda_{BPM} \qquad \text{expression (1):}$$

wherein $\lambda_{BFM}$ represents the shortest wavelength-side maximum emission wavelength of the blue fluorescent compound and $\lambda_{BPM}$ represents the shortest wavelength-side maximum emission wavelength of the blue phosphorescent compound; and light emission derived from the blue fluorescent compound is detected.

12. A method for producing an organic electroluminescent element having the luminescent film according to claim 1.

13. The method for producing an organic electroluminescent element according to claim 12, wherein the luminescent film is produced by a dry process.

14. The method for producing an organic electroluminescent element according to claim 12, wherein the luminescent film is produced by a wet process.

15. The method for producing an organic electroluminescent element according to claim 12, wherein the organic electroluminescent element comprises a gas barrier layer having a water vapor transmittance, as measured by a protocol according to JIS K 7129-1992, in a range from 0.001 to 1 g/(m²·day) and an oxygen transmittance, as measured by a protocol according to JIS K 7126-1987, in a range from 0.001 to 1 mL/(m²·day·atm).

\* \* \* \* \*